US012646695B2

(12) United States Patent
Peter et al.

(10) Patent No.: US 12,646,695 B2
(45) Date of Patent: Jun. 2, 2026

(54) DRY CHAMBER CLEAN OF PHOTORESIST FILMS

(71) Applicant: Lam Research Corporation, Fremont, CA (US)

(72) Inventors: Daniel Peter, Sunnyvale, CA (US); Da Li, Newark, CA (US); Timothy William Weidman, Sunnyvale, CA (US); Boris Volosskiy, San Jose, CA (US); Chenghao Wu, Berkeley, CA (US); Katie Lynn Nardi, San Jose, CA (US); Kevin Li Gu, Mountain View, CA (US); Leon Taleh, San Jose, CA (US); Samantha Siamhwa Tan, Newark, CA (US); Jengyi Yu, San Ramon, CA (US); Meng Xue, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/596,651

(22) PCT Filed: Jun. 25, 2020

(86) PCT No.: PCT/US2020/070187
§ 371 (c)(1),
(2) Date: Dec. 15, 2021

(87) PCT Pub. No.: WO2020/264571
PCT Pub. Date: Dec. 30, 2020

(65) Prior Publication Data
US 2022/0344136 A1 Oct. 27, 2022

Related U.S. Application Data

(60) Provisional application No. 62/868,705, filed on Jun. 28, 2019.

(51) Int. Cl.
| | |
|---|---|
| *H01J 37/32* | (2006.01) |
| *G03F 7/00* | (2006.01) |
| *G03F 7/004* | (2006.01) |
| *G03F 7/16* | (2006.01) |

(52) U.S. Cl.
CPC ........ H01J 37/32862 (2013.01); G03F 7/167 (2013.01); G03F 7/70925 (2013.01); G03F 7/70933 (2013.01); H01J 37/32357 (2013.01); H01J 37/32449 (2013.01); H01J 37/32522 (2013.01); G03F 7/0042 (2013.01); H01J 37/32816 (2013.01); H01J 2237/3321 (2013.01); H01J 2237/334 (2013.01)

(58) Field of Classification Search
CPC ........... H01J 37/32862; H01J 37/32357; H01J 37/32449; H01J 37/32522; H01J 37/32816; H01J 2237/3321; H01J 2237/334; H01J 37/32853; G03F 7/167; G03F 7/70925; G03F 7/70933; G03F 7/0042; G03F 7/0043; G03F 7/16; G03F 7/168; G03F 7/36
See application file for complete search history.

(56) References Cited

U.S. PATENT DOCUMENTS

| | | | |
|---|---|---|---|
| 3,442,648 A | 5/1969 | Smith et al. |
| 3,513,010 A | 5/1970 | Notley et al. |
| 3,529,963 A | 9/1970 | Marchese et al. |
| 3,576,755 A | 4/1971 | Patella et al. |
| 3,720,515 A | 3/1973 | Stanley |
| 4,061,829 A | 12/1977 | Taylor |
| 4,241,165 A | 12/1980 | Hughes et al. |
| 4,292,384 A | 9/1981 | Straughan et al. |
| 4,328,298 A | 5/1982 | Nester |
| 4,341,592 A | 7/1982 | Shortes et al. |
| 4,396,704 A | 8/1983 | Taylor |
| 4,590,149 A | 5/1986 | Nakane et al. |
| 4,738,748 A | 4/1988 | Kisa |
| 4,806,456 A | 2/1989 | Katoh |
| 4,814,243 A | 3/1989 | Ziger |
| 4,834,834 A | 5/1989 | Ehrlich et al. |
| 4,842,989 A | 6/1989 | Taniguchi et al. |
| 4,845,053 A | 7/1989 | Zajac |

(Continued)

FOREIGN PATENT DOCUMENTS

| | | |
|---|---|---|
| CN | 101098575 A | 1/2008 |
| CN | 102027577 A | 4/2011 |

(Continued)

OTHER PUBLICATIONS

WO-2018180663-A1 Translation (Year: 2018).*
KR 20100015073 A Written Description (Year: 2015).*
Chinese First Office Action dated May 24, 2017 issued in Application No. CN 201510053668.7.
Chinese Second Office Action dated Feb. 28, 2018 issued in Application No. CN 201510053668.7.
Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.
Gerritsen et al., (Apr. 1, 1986) "Laser-generated plasma as soft x-ray source," J. Appl. Phys., 59(7):2337-2344.

(Continued)

*Primary Examiner* — Natasha N Campbell
(74) *Attorney, Agent, or Firm* — Weaver Austin Villeneuve & Sampson LLP

(57) ABSTRACT

A metal-containing photoresist film may be deposited on a semiconductor substrate using a dry deposition technique. Unintended metal-containing photoresist material may form on internal surfaces of a process chamber during deposition, bevel and backside cleaning, baking, development, or etch operations. An in situ dry chamber clean may be performed to remove the unintended metal-containing photoresist material by exposure to an etch gas. The dry chamber clean may be performed at elevated temperatures without striking a plasma. In some embodiments, the dry chamber clean may include pumping/purging and conditioning operations.

13 Claims, 17 Drawing Sheets

(56)                References Cited

U.S. PATENT DOCUMENTS

| | | | |
|---|---|---|---|
| 4,940,854 A | 7/1990 | Debe | |
| 4,956,204 A | 9/1990 | Amazawa et al. | |
| 5,077,085 A | 12/1991 | Schnur et al. | |
| 5,079,600 A | 1/1992 | Schnur et al. | |
| 5,094,936 A | 3/1992 | Misium et al. | |
| 5,322,765 A | 6/1994 | Clecak et al. | |
| 5,399,464 A | 3/1995 | Lee | |
| 5,445,988 A | 8/1995 | Schwalke | |
| 5,468,686 A | 11/1995 | Kawamoto | |
| 5,534,312 A | 7/1996 | Hill et al. | |
| 5,761,023 A | 6/1998 | Lue et al. | |
| 5,914,278 A | 6/1999 | Boitnott et al. | |
| 5,925,494 A | 7/1999 | Horn | |
| 5,963,315 A * | 10/1999 | Hiatt ................. H01L 21/67745 | |
| | | | 356/237.3 |
| 6,013,418 A | 1/2000 | Ma et al. | |
| 6,017,553 A | 1/2000 | Burrell et al. | |
| 6,045,877 A | 4/2000 | Gleason et al. | |
| 6,162,577 A | 12/2000 | Felter et al. | |
| 6,179,922 B1 | 1/2001 | Ishikawa et al. | |
| 6,261,938 B1 | 7/2001 | Beauvais et al. | |
| 6,290,779 B1 * | 9/2001 | Saleh .................. C23C 16/4405 | |
| | | | 134/1.1 |
| 6,313,035 B1 * | 11/2001 | Sandhu ............... H01L 21/0217 | |
| | | | 438/653 |
| 6,319,654 B1 | 11/2001 | Kim et al. | |
| 6,348,239 B1 | 2/2002 | Hill et al. | |
| 6,410,421 B1 | 6/2002 | Ghandehari et al. | |
| 6,448,097 B1 | 9/2002 | Singh et al. | |
| 6,573,030 B1 | 6/2003 | Fairbairn et al. | |
| 6,607,867 B1 | 8/2003 | Kim et al. | |
| 6,666,986 B1 | 12/2003 | Vaartstra | |
| 6,797,439 B1 | 9/2004 | Alpay | |
| 6,833,306 B2 | 12/2004 | Lyding et al. | |
| 6,841,341 B2 | 1/2005 | Fairbairn et al. | |
| 6,841,943 B2 | 1/2005 | Vahedi et al. | |
| 7,169,440 B2 | 1/2007 | Balasubramaniam et al. | |
| 7,223,526 B2 | 5/2007 | Fairbairn et al. | |
| 7,307,695 B2 | 12/2007 | Hazenberg et al. | |
| 7,335,462 B2 | 2/2008 | Fairbairn et al. | |
| 7,608,367 B1 | 10/2009 | Aigeldinger et al. | |
| 8,383,316 B2 | 2/2013 | Cooper et al. | |
| 8,465,903 B2 | 6/2013 | Weidman et al. | |
| 8,536,068 B2 | 9/2013 | Weidman et al. | |
| 8,552,334 B2 | 10/2013 | Tappan et al. | |
| 8,664,124 B2 | 3/2014 | Graff | |
| 8,664,513 B2 | 3/2014 | Pfenninger et al. | |
| 8,703,386 B2 | 4/2014 | Bass et al. | |
| 8,808,561 B2 | 8/2014 | Kanarik | |
| 8,883,028 B2 | 11/2014 | Kanarik | |
| 8,883,405 B2 | 11/2014 | Shiobara | |
| 9,023,731 B2 | 5/2015 | Ji et al. | |
| 9,261,784 B2 | 2/2016 | Wuister et al. | |
| 9,281,207 B2 | 3/2016 | Stowers et al. | |
| 9,310,684 B2 | 4/2016 | Meyers et al. | |
| 9,428,833 B1 | 8/2016 | Duvall et al. | |
| 9,551,924 B2 | 1/2017 | Burkhardt et al. | |
| 9,576,811 B2 | 2/2017 | Kanarik et al. | |
| 9,632,411 B2 | 4/2017 | Michaelson et al. | |
| 9,719,169 B2 | 8/2017 | Mohn et al. | |
| 9,778,561 B2 | 10/2017 | Marks et al. | |
| 9,823,564 B2 | 11/2017 | Stowers et al. | |
| 9,829,805 B2 | 11/2017 | Michaelson et al. | |
| 9,996,004 B2 | 6/2018 | Smith et al. | |
| 10,025,179 B2 | 7/2018 | Meyers et al. | |
| 10,074,543 B2 | 9/2018 | Mahorowala et al. | |
| 10,228,618 B2 | 3/2019 | Meyers et al. | |
| 10,416,554 B2 | 9/2019 | Meyers et al. | |
| 10,514,598 B2 | 12/2019 | Marks et al. | |
| 10,566,212 B2 | 2/2020 | Kanarik | |
| 10,580,585 B2 | 3/2020 | Snaith et al. | |
| 10,627,719 B2 | 4/2020 | Waller et al. | |
| 10,642,153 B2 | 5/2020 | Meyers et al. | |
| 10,649,328 B2 | 5/2020 | Stowers et al. | |
| 10,732,505 B1 | 8/2020 | Meyers et al. | |
| 10,763,083 B2 | 9/2020 | Yang et al. | |
| 10,775,696 B2 | 9/2020 | Meyers et al. | |
| 10,782,610 B2 | 9/2020 | Stowers et al. | |
| 10,787,466 B2 | 9/2020 | Edson et al. | |
| 10,796,912 B2 | 10/2020 | Shamma et al. | |
| 10,831,096 B2 | 11/2020 | Marks et al. | |
| 11,209,729 B2 | 12/2021 | Marks et al. | |
| 11,257,674 B2 | 2/2022 | Shamma et al. | |
| 11,314,168 B2 | 4/2022 | Tan et al. | |
| 2001/0024769 A1 | 9/2001 | Donoghue et al. | |
| 2001/0027030 A1 * | 10/2001 | Vasudev .......... H01L 21/67028 | |
| | | | 438/784 |
| 2001/0055731 A1 | 12/2001 | Irie | |
| 2002/0015855 A1 | 2/2002 | Sajoto et al. | |
| 2002/0017243 A1 | 2/2002 | Pyo | |
| 2002/0123221 A1 | 9/2002 | Jost et al. | |
| 2002/0180372 A1 | 12/2002 | Yamazaki | |
| 2002/0185067 A1 * | 12/2002 | Upham ................. B08B 7/0035 | |
| | | | 134/1.1 |
| 2003/0008246 A1 | 1/2003 | Cheng et al. | |
| 2003/0027060 A1 | 2/2003 | Lederer | |
| 2003/0049571 A1 | 3/2003 | Hallock et al. | |
| 2003/0183244 A1 * | 10/2003 | Rossman .............. B08B 7/0035 | |
| | | | 134/1.1 |
| 2004/0067444 A1 | 4/2004 | Wakabayashi et al. | |
| 2004/0097388 A1 | 5/2004 | Brask et al. | |
| 2004/0103914 A1 * | 6/2004 | Cheng .............. H01J 37/32862 | |
| | | | 134/1.1 |
| 2004/0113087 A1 | 6/2004 | Ikeda et al. | |
| 2004/0115956 A1 | 6/2004 | Ishida | |
| 2004/0175631 A1 | 9/2004 | Crocker et al. | |
| 2004/0191423 A1 | 9/2004 | Ruan et al. | |
| 2004/0203256 A1 | 10/2004 | Yang et al. | |
| 2004/0209201 A1 | 10/2004 | Nakano et al. | |
| 2004/0213563 A1 | 10/2004 | Irie | |
| 2004/0229169 A1 | 11/2004 | Sandstrom | |
| 2004/0233401 A1 | 11/2004 | Irie | |
| 2005/0120955 A1 | 6/2005 | Yamasaki et al. | |
| 2005/0142885 A1 | 6/2005 | Shinriki | |
| 2005/0167617 A1 | 8/2005 | Derra et al. | |
| 2005/0208389 A1 | 9/2005 | Ishibashi et al. | |
| 2005/0221020 A1 * | 10/2005 | Fukiage ............ H01J 37/32862 | |
| | | | 257/E21.261 |
| 2005/0253077 A1 | 11/2005 | Ikeda et al. | |
| 2005/0257747 A1 | 11/2005 | Wakabayashi et al. | |
| 2006/0001064 A1 | 1/2006 | Hill et al. | |
| 2006/0046470 A1 | 3/2006 | Becknell et al. | |
| 2006/0068173 A1 | 3/2006 | Kajiyama et al. | |
| 2006/0128127 A1 | 6/2006 | Seo et al. | |
| 2006/0147818 A1 | 7/2006 | Lee | |
| 2006/0151462 A1 | 7/2006 | Lee et al. | |
| 2006/0166537 A1 | 7/2006 | Thompson et al. | |
| 2006/0172530 A1 | 8/2006 | Cheng et al. | |
| 2006/0175558 A1 | 8/2006 | Bakker et al. | |
| 2006/0246713 A1 | 11/2006 | Tsai et al. | |
| 2006/0287207 A1 | 12/2006 | Park et al. | |
| 2007/0017386 A1 | 1/2007 | Kamei | |
| 2007/0037410 A1 | 2/2007 | Chang et al. | |
| 2007/0074541 A1 | 4/2007 | Badding et al. | |
| 2007/0117040 A1 | 5/2007 | Brock et al. | |
| 2007/0181816 A1 | 8/2007 | Ikeda et al. | |
| 2007/0212889 A1 | 9/2007 | Abatchev et al. | |
| 2007/0259492 A1 | 11/2007 | Roh et al. | |
| 2007/0287073 A1 | 12/2007 | Goodwin | |
| 2008/0069951 A1 | 3/2008 | Chacin et al. | |
| 2008/0070128 A1 | 3/2008 | Wu et al. | |
| 2008/0131616 A1 | 6/2008 | Besson et al. | |
| 2008/0157011 A1 | 7/2008 | Nagai et al. | |
| 2009/0130859 A1 | 5/2009 | Itatani et al. | |
| 2009/0134119 A1 | 5/2009 | Matsumaru et al. | |
| 2009/0153826 A1 | 6/2009 | Sewell et al. | |
| 2009/0197086 A1 | 8/2009 | Rathi et al. | |
| 2009/0208880 A1 | 8/2009 | Nemani et al. | |
| 2009/0239155 A1 | 9/2009 | Levinson et al. | |
| 2009/0286402 A1 | 11/2009 | Xia et al. | |
| 2009/0305174 A1 | 12/2009 | Shiobara et al. | |
| 2009/0317742 A1 | 12/2009 | Toriumi et al. | |
| 2009/0321707 A1 | 12/2009 | Metz et al. | |

(56)        References Cited

U.S. PATENT DOCUMENTS

| | | | |
|---|---|---|---|
| 2009/0325387 A1* | 12/2009 | Chen | H01J 37/32862 |
| | | | 216/60 |
| 2010/0009274 A1 | 1/2010 | Yamamoto | |
| 2010/0022078 A1 | 1/2010 | Rockenberger et al. | |
| 2010/0051446 A1 | 3/2010 | Wang et al. | |
| 2010/0068660 A1 | 3/2010 | Shibazaki et al. | |
| 2010/0086880 A1 | 4/2010 | Saito et al. | |
| 2010/0131093 A1 | 5/2010 | Yokoyama et al. | |
| 2010/0197135 A1 | 8/2010 | Ishizaka | |
| 2010/0260994 A1 | 10/2010 | Groenen et al. | |
| 2010/0266969 A1 | 10/2010 | Shiraishi et al. | |
| 2010/0288728 A1 | 11/2010 | Han et al. | |
| 2010/0297847 A1 | 11/2010 | Cheng et al. | |
| 2010/0304027 A1 | 12/2010 | Lee et al. | |
| 2010/0310790 A1 | 12/2010 | Chang et al. | |
| 2011/0049100 A1 | 3/2011 | Han et al. | |
| 2011/0104595 A1 | 5/2011 | Hayashi et al. | |
| 2011/0117702 A1 | 5/2011 | Rietzler et al. | |
| 2011/0195142 A1 | 8/2011 | Mitamura et al. | |
| 2011/0198756 A1 | 8/2011 | Thenappan et al. | |
| 2011/0200953 A1 | 8/2011 | Arima et al. | |
| 2011/0209725 A1 | 9/2011 | Kim et al. | |
| 2011/0242508 A1 | 10/2011 | Kobayashi | |
| 2011/0244680 A1 | 10/2011 | Tohnoe et al. | |
| 2011/0292356 A1 | 12/2011 | Tsukinoki et al. | |
| 2012/0024388 A1 | 2/2012 | Burrows et al. | |
| 2012/0068347 A1 | 3/2012 | Isobayashi et al. | |
| 2012/0088193 A1 | 4/2012 | Weidman et al. | |
| 2012/0088369 A1 | 4/2012 | Weidman et al. | |
| 2012/0090547 A1 | 4/2012 | Wang et al. | |
| 2012/0126358 A1 | 5/2012 | Arnold et al. | |
| 2012/0161405 A1 | 6/2012 | Mohn et al. | |
| 2012/0183689 A1 | 7/2012 | Suzuki et al. | |
| 2012/0193762 A1 | 8/2012 | Lin et al. | |
| 2012/0202357 A1 | 8/2012 | Sato et al. | |
| 2012/0208125 A1 | 8/2012 | Hatakeyama | |
| 2012/0223418 A1 | 9/2012 | Stowers et al. | |
| 2012/0322011 A1 | 12/2012 | Wu et al. | |
| 2013/0023124 A1 | 1/2013 | Nemani et al. | |
| 2013/0129995 A1 | 5/2013 | Ouattara et al. | |
| 2013/0157177 A1 | 6/2013 | Yu et al. | |
| 2013/0164691 A1 | 6/2013 | Shiobara | |
| 2013/0177847 A1 | 7/2013 | Chatterjee et al. | |
| 2013/0183609 A1 | 7/2013 | Seon et al. | |
| 2013/0224652 A1 | 8/2013 | Bass et al. | |
| 2013/0273733 A1 | 10/2013 | Tang et al. | |
| 2013/0299089 A1 | 11/2013 | Kim et al. | |
| 2013/0319466 A1 | 12/2013 | Mizoguchi et al. | |
| 2013/0330928 A1 | 12/2013 | Ishikawa et al. | |
| 2013/0330932 A1 | 12/2013 | Rangarajan et al. | |
| 2014/0014745 A1 | 1/2014 | Burrows et al. | |
| 2014/0060574 A1* | 3/2014 | Wyse | B08B 7/00 |
| | | | 134/2 |
| 2014/0120688 A1 | 5/2014 | Booth, Jr. et al. | |
| 2014/0134827 A1 | 5/2014 | Swaminathan et al. | |
| 2014/0170563 A1 | 6/2014 | Hatakeyama | |
| 2014/0170853 A1 | 6/2014 | Shamma et al. | |
| 2014/0175617 A1 | 6/2014 | Antonelli et al. | |
| 2014/0193580 A1 | 7/2014 | Tiron et al. | |
| 2014/0209015 A1 | 7/2014 | Yamada et al. | |
| 2014/0220489 A1 | 8/2014 | Kozuma et al. | |
| 2014/0239462 A1 | 8/2014 | Shamma et al. | |
| 2014/0255844 A1 | 9/2014 | Iwao et al. | |
| 2014/0261568 A1 | 9/2014 | Delgado et al. | |
| 2014/0263172 A1 | 9/2014 | Xie et al. | |
| 2014/0268082 A1 | 9/2014 | Michaelson et al. | |
| 2014/0272726 A1 | 9/2014 | Chang | |
| 2015/0000695 A1 | 1/2015 | Noda et al. | |
| 2015/0020848 A1 | 1/2015 | Kim et al. | |
| 2015/0041809 A1 | 2/2015 | Arnold et al. | |
| 2015/0056542 A1 | 2/2015 | Meyers et al. | |
| 2015/0077733 A1 | 3/2015 | Huang et al. | |
| 2015/0079393 A1 | 3/2015 | Freedman et al. | |
| 2015/0096494 A1 | 4/2015 | Nishiura et al. | |
| 2015/0125679 A1 | 5/2015 | Ishikawa | |
| 2015/0132965 A1 | 5/2015 | Devilliers et al. | |
| 2015/0152551 A1 | 6/2015 | Yamaguchi et al. | |
| 2015/0170957 A1 | 6/2015 | Tsao | |
| 2015/0194343 A1 | 7/2015 | Chi et al. | |
| 2015/0217330 A1 | 8/2015 | Haukka et al. | |
| 2015/0218695 A1 | 8/2015 | Odedra | |
| 2015/0221519 A1 | 8/2015 | Marks et al. | |
| 2015/0243520 A1 | 8/2015 | Park et al. | |
| 2015/0252473 A1 | 9/2015 | Dickinson | |
| 2015/0275359 A1 | 10/2015 | Fukushima et al. | |
| 2015/0303064 A1 | 10/2015 | Singer et al. | |
| 2015/0332922 A1 | 11/2015 | Chien et al. | |
| 2015/0355549 A1 | 12/2015 | Xie et al. | |
| 2016/0011505 A1 | 1/2016 | Stowers et al. | |
| 2016/0011516 A1 | 1/2016 | Devilliers | |
| 2016/0035631 A1 | 2/2016 | Lee et al. | |
| 2016/0041471 A1 | 2/2016 | Briend et al. | |
| 2016/0086864 A1 | 3/2016 | Fischer et al. | |
| 2016/0116839 A1* | 4/2016 | Meyers | G03F 7/0042 |
| | | | 430/326 |
| 2016/0118246 A1 | 4/2016 | Kang et al. | |
| 2016/0126106 A1 | 5/2016 | Shimizu et al. | |
| 2016/0135274 A1 | 5/2016 | Fischer et al. | |
| 2016/0179005 A1 | 6/2016 | Shamma et al. | |
| 2016/0216606 A1 | 7/2016 | Meyers et al. | |
| 2016/0284559 A1 | 9/2016 | Kikuchi et al. | |
| 2016/0293405 A1 | 10/2016 | Matsumoto et al. | |
| 2016/0314964 A1 | 10/2016 | Tang et al. | |
| 2016/0343544 A1 | 11/2016 | Watanabe et al. | |
| 2016/0357103 A1 | 12/2016 | Nagahara et al. | |
| 2016/0357107 A1 | 12/2016 | Buchberger, Jr. et al. | |
| 2016/0365248 A1 | 12/2016 | Mebarki et al. | |
| 2016/0379824 A1 | 12/2016 | Wise et al. | |
| 2017/0004974 A1 | 1/2017 | Manna et al. | |
| 2017/0010535 A1 | 1/2017 | Fujitani et al. | |
| 2017/0069462 A1 | 3/2017 | Kanarik et al. | |
| 2017/0102612 A1 | 4/2017 | Meyers et al. | |
| 2017/0146909 A1 | 5/2017 | Smith et al. | |
| 2017/0154766 A1 | 6/2017 | Ogihara et al. | |
| 2017/0168398 A1 | 6/2017 | Zi et al. | |
| 2017/0176858 A1 | 6/2017 | Hirano | |
| 2017/0184961 A1 | 6/2017 | Nakagawa et al. | |
| 2017/0192357 A1 | 7/2017 | Carcasi et al. | |
| 2017/0261850 A1 | 9/2017 | Stowers et al. | |
| 2017/0301518 A1 | 10/2017 | Hosaka et al. | |
| 2017/0330787 A1 | 11/2017 | Mitsunaga et al. | |
| 2017/0342553 A1 | 11/2017 | Yu et al. | |
| 2018/0004083 A1 | 1/2018 | Marks et al. | |
| 2018/0012759 A1 | 1/2018 | Smith et al. | |
| 2018/0039172 A1 | 2/2018 | Stowers et al. | |
| 2018/0039182 A1 | 2/2018 | Zi et al. | |
| 2018/0046086 A1 | 2/2018 | Waller et al. | |
| 2018/0061663 A1 | 3/2018 | Chandrashekar et al. | |
| 2018/0093306 A1 | 4/2018 | Kang et al. | |
| 2018/0096840 A1 | 4/2018 | Jeong et al. | |
| 2018/0122648 A1 | 5/2018 | Kim et al. | |
| 2018/0149976 A1 | 5/2018 | Liu et al. | |
| 2018/0151350 A1 | 5/2018 | Li | |
| 2018/0164689 A1 | 6/2018 | Sano et al. | |
| 2018/0166278 A1 | 6/2018 | Belyansky et al. | |
| 2018/0173096 A1 | 6/2018 | Zi et al. | |
| 2018/0224744 A1 | 8/2018 | Bae et al. | |
| 2018/0233362 A1 | 8/2018 | Glodde et al. | |
| 2018/0233398 A1 | 8/2018 | Van Cleemput et al. | |
| 2018/0247832 A1 | 8/2018 | Fischer et al. | |
| 2018/0294155 A1 | 10/2018 | Soppera et al. | |
| 2018/0307137 A1 | 10/2018 | Meyers et al. | |
| 2018/0308687 A1 | 10/2018 | Smith et al. | |
| 2018/0314167 A1 | 11/2018 | Chang et al. | |
| 2018/0323064 A1 | 11/2018 | Jung et al. | |
| 2018/0330930 A1 | 11/2018 | Murakami et al. | |
| 2018/0337046 A1 | 11/2018 | Shamma et al. | |
| 2018/0337243 A1 | 11/2018 | Li et al. | |
| 2018/0354804 A1 | 12/2018 | Venkatasubramanian et al. | |
| 2018/0356731 A1 | 12/2018 | Tagawa | |
| 2019/0027357 A1 | 1/2019 | Girard et al. | |
| 2019/0041755 A1 | 2/2019 | Tanaka et al. | |
| 2019/0043731 A1 | 2/2019 | Bristol et al. | |
| 2019/0074171 A1 | 3/2019 | Harada et al. | |

(56) References Cited

U.S. PATENT DOCUMENTS

| | | |
|---|---|---|
| 2019/0088521 A1 | 3/2019 | Chua et al. |
| 2019/0094685 A1 | 3/2019 | Marks et al. |
| 2019/0129307 A1 | 5/2019 | Kwon et al. |
| 2019/0131130 A1 | 5/2019 | Smith et al. |
| 2019/0137870 A1 | 5/2019 | Meyers et al. |
| 2019/0153001 A1 | 5/2019 | Cardineau et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0382890 A1 | 12/2019 | Lerner et al. |
| 2019/0391486 A1 | 12/2019 | Jiang et al. |
| 2020/0041897 A1 | 2/2020 | Moon et al. |
| 2020/0050109 A1 | 2/2020 | Ho et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0133131 A1 | 4/2020 | Ouyang |
| 2020/0157683 A1 | 5/2020 | Kato et al. |
| 2020/0166845 A1 | 5/2020 | Berendsen et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0005425 A1 | 1/2021 | Yang et al. |
| 2021/0013034 A1 | 1/2021 | Wu et al. |
| 2021/0013037 A1 | 1/2021 | Sun et al. |
| 2021/0041784 A1 | 2/2021 | Chen et al. |
| 2021/0271170 A1 | 9/2021 | Telecky et al. |
| 2021/0302833 A1 | 9/2021 | Weng et al. |
| 2021/0305040 A1 | 9/2021 | Kuo et al. |
| 2021/0348271 A1 | 11/2021 | Mishra et al. |
| 2021/0397085 A1 | 12/2021 | Weidman et al. |
| 2022/0002882 A1 | 1/2022 | Kalutarage et al. |
| 2022/0020584 A1 | 1/2022 | Volosskiy et al. |
| 2022/0035247 A1 | 2/2022 | Tan et al. |
| 2022/0037163 A1 | 2/2022 | Yang et al. |
| 2022/0043334 A1 | 2/2022 | Tan et al. |
| 2022/0075260 A1 | 3/2022 | Marks et al. |
| 2022/0122846 A1 | 4/2022 | Shamma et al. |
| 2022/0157617 A1 | 5/2022 | Zhou et al. |
| 2022/0179328 A1 | 6/2022 | Xia et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0365434 A1 | 11/2022 | Nardi et al. |
| 2023/0031955 A1 | 2/2023 | Yu et al. |
| 2023/0045336 A1 | 2/2023 | Yu et al. |
| 2023/0107357 A1 | 4/2023 | Dictus et al. |
| 2023/0152701 A1 | 5/2023 | Kanakasabapathy |
| 2023/0230811 A1 | 7/2023 | Yu et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0290657 A1 | 9/2023 | Yu et al. |
| 2023/0314946 A1 | 10/2023 | Hansen et al. |
| 2023/0314954 A1 | 10/2023 | Peter et al. |
| 2023/0416606 A1 | 12/2023 | Dictus et al. |
| 2024/0036483 A1 | 2/2024 | Dictus et al. |
| 2024/0134274 A1 | 4/2024 | Weidman et al. |
| 2024/0145272 A1 | 5/2024 | Yu et al. |
| 2025/0226227 A1 | 7/2025 | Austin et al. |

FOREIGN PATENT DOCUMENTS

| | | |
|---|---|---|
| CN | 102610516 A | 7/2012 |
| CN | 102621817 A | 8/2012 |
| CN | 103119695 A | 5/2013 |
| CN | 103243310 A | 8/2013 |
| CN | 104853855 A | 8/2015 |
| CN | 105047541 A | 11/2015 |
| CN | 105579906 A | 5/2016 |
| CN | 106558477 A | 4/2017 |
| CN | 106876251 A | 6/2017 |
| CN | 107153326 A | 9/2017 |
| CN | 108351594 A | 7/2018 |
| CN | 108388079 A | 8/2018 |
| CN | 108780739 A | 11/2018 |
| CN | 109521657 A | 3/2019 |
| CN | 109976097 A | 7/2019 |
| CN | 111258190 A | 6/2020 |
| EP | 0197286 A2 | 10/1986 |
| EP | 0197286 B1 | 9/1991 |
| EP | 0465064 A2 | 1/1992 |
| EP | 1123423 B1 | 8/2007 |
| EP | 2608247 A1 | 6/2013 |
| EP | 3230294 A1 | 10/2017 |
| EP | 3258317 A1 | 12/2017 |
| EP | 3451059 A1 | 3/2019 |
| JP | S5119974 A | 2/1976 |
| JP | S57205736 A | 12/1982 |
| JP | S58108744 A | 6/1983 |
| JP | S6112653 U | 1/1986 |
| JP | S61234035 A | 10/1986 |
| JP | S6347364 A | 2/1988 |
| JP | H04226462 A | 8/1992 |
| JP | H0637050 A | 2/1994 |
| JP | H06169021 A | 6/1994 |
| JP | H06232041 A | 8/1994 |
| JP | H07106224 A | 4/1995 |
| JP | H0869959 A | 3/1996 |
| JP | H08316237 A | 11/1996 |
| JP | H08339950 A | 12/1996 |
| JP | H1041206 A | 2/1998 |
| JP | H10189515 A | 7/1998 |
| JP | H10209133 A | 8/1998 |
| JP | 2000305273 A | 11/2000 |
| JP | 2000347413 A | 12/2000 |
| JP | 2000347421 A | 12/2000 |
| JP | 2000356857 A | 12/2000 |
| JP | 2001089860 A | 4/2001 |
| JP | 2001308019 A | 11/2001 |
| JP | 2002030445 A | 1/2002 |
| JP | 2002100558 A | 4/2002 |
| JP | 2002118096 A | 4/2002 |
| JP | 2003131364 A | 5/2003 |
| JP | 2003213001 A | 7/2003 |
| JP | 2003264168 A | 9/2003 |
| JP | 2003280155 A | 10/2003 |
| JP | 2003532303 A | 10/2003 |
| JP | 2004006798 A | 1/2004 |
| JP | 2004513515 A | 4/2004 |
| JP | 2004247678 A | 9/2004 |
| JP | 2004259786 A | 9/2004 |
| JP | 2005504146 A | 2/2005 |
| JP | 2005123651 A | 5/2005 |
| JP | 2005260015 A | 9/2005 |
| JP | 2006253282 A | 9/2006 |
| JP | 2006310681 A | 11/2006 |
| JP | 2007027617 A | 2/2007 |
| JP | 2007114255 A | 5/2007 |
| JP | 2008091215 A | 4/2008 |

(56) References Cited

FOREIGN PATENT DOCUMENTS

| | | | |
|---|---|---|---|
| JP | 2008251743 A | 10/2008 |
| JP | 2009192350 A | 8/2009 |
| JP | 2009212404 A | 9/2009 |
| JP | 2010016083 A | 1/2010 |
| JP | 2010016314 A | 1/2010 |
| JP | 2010500762 A | 1/2010 |
| JP | 2010067979 A | 3/2010 |
| JP | 2010123732 A | 6/2010 |
| JP | 2010531931 A | 9/2010 |
| JP | 2010239087 A | 10/2010 |
| JP | 2011520242 A | 7/2011 |
| JP | 2011526082 A | 9/2011 |
| JP | 2011529126 A | 12/2011 |
| JP | 2012074738 A | 4/2012 |
| JP | 2012142481 A | 7/2012 |
| JP | 2012173315 A | 9/2012 |
| JP | 2012185485 A | 9/2012 |
| JP | 5055743 B2 | 10/2012 |
| JP | 2012191242 A | 10/2012 |
| JP | 2013033291 A | 2/2013 |
| JP | 2013047848 A | 3/2013 |
| JP | 2013096011 A | 5/2013 |
| JP | 2013526061 A | 6/2013 |
| JP | 2013145874 A | 7/2013 |
| JP | 2013151627 A | 8/2013 |
| JP | 2014504004 A | 2/2014 |
| JP | 2014512458 A | 5/2014 |
| JP | 5544914 B2 | 7/2014 |
| JP | 2014146767 A | 8/2014 |
| JP | 2014521111 A | 8/2014 |
| JP | 2014159625 A | 9/2014 |
| JP | 2015012198 A | 1/2015 |
| JP | 2015504604 A | 2/2015 |
| JP | 5705103 B2 | 4/2015 |
| JP | 2015513540 A | 5/2015 |
| JP | 2015105405 A | 6/2015 |
| JP | 2015201622 A | 11/2015 |
| JP | 2016037656 A | 3/2016 |
| JP | 2016072557 A | 5/2016 |
| JP | 2016517633 A | 6/2016 |
| JP | 2016131238 A | 7/2016 |
| JP | 2016208027 A | 12/2016 |
| JP | 2017014602 A | 1/2017 |
| JP | 2017500448 A | 1/2017 |
| JP | 2017045869 A | 3/2017 |
| JP | 2017108053 A | 6/2017 |
| JP | 2017116923 A | 6/2017 |
| JP | 2017208374 A | 11/2017 |
| JP | 2017228596 A | 12/2017 |
| JP | 2018006742 A | 1/2018 |
| JP | 2018502173 A | 1/2018 |
| JP | 2018017780 A | 2/2018 |
| JP | 2018025686 A | 2/2018 |
| JP | 2018098229 A | 6/2018 |
| JP | 2018518688 A | 7/2018 |
| JP | 2018164076 A | 10/2018 |
| JP | 2018195817 A | 12/2018 |
| JP | 2018200930 A | 12/2018 |
| JP | 2019500490 A | 1/2019 |
| JP | 2019024129 A | 2/2019 |
| JP | 2019506730 A | 3/2019 |
| JP | 2019053305 A | 4/2019 |
| JP | 2019056730 A | 4/2019 |
| JP | 2019095794 A | 6/2019 |
| JP | 2019135755 A | 8/2019 |
| JP | 2019192814 A | 10/2019 |
| JP | 2021523403 A | 9/2021 |
| KR | 890015374 A | 10/1989 |
| KR | 900001238 B1 | 3/1990 |
| KR | 950001406 A | 1/1995 |
| KR | 960000375 B1 | 1/1996 |
| KR | 19990029141 A | 4/1999 |
| KR | 20000073111 A | 12/2000 |
| KR | 20010007317 A | 1/2001 |
| KR | 20020000292 A | 1/2002 |
| KR | 20050112115 A | 11/2005 |
| KR | 20070003657 A | 1/2007 |
| KR | 100800865 B1 | 2/2008 |
| KR | 20080046577 A | 5/2008 |
| KR | 100841495 B1 | 6/2008 |
| KR | 20090042059 A | 4/2009 |
| KR | 20090073425 A | 7/2009 |
| KR | 20100090643 A | 8/2010 |
| KR | 20100138923 A | 12/2010 |
| KR | 20110007192 A | 1/2011 |
| KR | 20110050438 A | 5/2011 |
| KR | 20120090996 A | 8/2012 |
| KR | 20130007389 A | 1/2013 |
| KR | 20130093038 A | 8/2013 |
| KR | 101426105 B1 | 8/2014 |
| KR | 20140106442 A | 9/2014 |
| KR | 20140109816 A | 9/2014 |
| KR | 20100015073 A * | 1/2015 |
| KR | 20150091260 A | 8/2015 |
| KR | 20150095611 A | 8/2015 |
| KR | 20150127145 A | 11/2015 |
| KR | 20160035995 A | 4/2016 |
| KR | 20170066218 A | 6/2017 |
| KR | 20170066225 A | 6/2017 |
| KR | 20170074953 A | 6/2017 |
| KR | 20180036263 A | 4/2018 |
| KR | 20180054917 A | 5/2018 |
| KR | 20180116438 A | 10/2018 |
| KR | 20180122600 A | 11/2018 |
| KR | 20190085654 A | 7/2019 |
| KR | 20190139594 A | 12/2019 |
| KR | 20190142242 A | 12/2019 |
| KR | 20210142118 A | 11/2021 |
| TW | 200504864 A | 2/2005 |
| TW | 200903686 A | 1/2009 |
| TW | 201005568 A | 2/2010 |
| TW | 201145383 A | 12/2011 |
| TW | 201224190 A | 6/2012 |
| TW | I365354 B | 6/2012 |
| TW | 201241555 A | 10/2012 |
| TW | 201245918 A | 11/2012 |
| TW | 201246273 A | 11/2012 |
| TW | 201330093 A | 7/2013 |
| TW | 201430164 A | 8/2014 |
| TW | 201501179 A | 1/2015 |
| TW | I494689 B | 8/2015 |
| TW | 201631377 A | 9/2016 |
| TW | 201729006 A | 8/2017 |
| TW | 201734025 A | 10/2017 |
| TW | 201734667 A | 10/2017 |
| TW | 201811876 A | 4/2018 |
| TW | 201830472 A | 8/2018 |
| TW | 201837066 A | 10/2018 |
| TW | 201930323 A | 8/2019 |
| WO | WO-03029015 A2 | 4/2003 |
| WO | WO-2004007797 A1 | 1/2004 |
| WO | WO-2004095551 A1 | 11/2004 |
| WO | WO-2007058120 A1 | 5/2007 |
| WO | WO-2007123539 A1 | 11/2007 |
| WO | WO-2008019362 A2 | 2/2008 |
| WO | WO-2008088076 A1 | 7/2008 |
| WO | WO-2011081151 A1 | 7/2011 |
| WO | WO-2011137059 A2 | 11/2011 |
| WO | WO-2012075249 A1 | 6/2012 |
| WO | WO-2012048094 A3 | 7/2012 |
| WO | WO-2013007442 A1 | 1/2013 |
| WO | WO-2013078211 A1 | 5/2013 |
| WO | WO-2013128313 A1 | 9/2013 |
| WO | WO-2013146595 A1 | 10/2013 |
| WO | WO-2014152023 A1 | 9/2014 |
| WO | WO-2014157321 A1 | 10/2014 |
| WO | WO-2015088611 A1 | 6/2015 |
| WO | WO-2016065120 A1 | 4/2016 |
| WO | WO-2016144960 A1 | 9/2016 |
| WO | WO-2017066319 A2 | 4/2017 |
| WO | WO-2017109040 A1 | 6/2017 |
| WO | WO-2017153725 A1 | 9/2017 |
| WO | WO-2017198418 A1 | 11/2017 |
| WO | WO-2018004551 A1 | 1/2018 |

(56) References Cited

FOREIGN PATENT DOCUMENTS

| | | | |
|---|---|---|---|
| WO | WO-2018004646 A1 | 1/2018 | |
| WO | WO-2018061670 A1 | 4/2018 | |
| WO | WO-2018173446 A1 | 9/2018 | |
| WO | WO-2018180663 A1 * | 10/2018 | ......... C23C 16/4405 |
| WO | WO-2019023797 A1 | 2/2019 | |
| WO | WO-2019163455 A1 | 8/2019 | |
| WO | WO-2019217749 A1 | 11/2019 | |
| WO | WO-2019222320 A1 | 11/2019 | |
| WO | WO-2019230462 A1 | 12/2019 | |
| WO | WO-2019241402 A1 | 12/2019 | |
| WO | WO-2020014179 A1 | 1/2020 | |
| WO | WO-2020030855 A2 | 2/2020 | |
| WO | WO-2020033602 A1 | 2/2020 | |
| WO | WO-2020050035 A1 | 3/2020 | |
| WO | WO-2020102085 A1 | 5/2020 | |
| WO | WO-2020132281 A1 | 6/2020 | |
| WO | WO-2020185618 A1 | 9/2020 | |
| WO | WO-2020190941 A1 | 9/2020 | |
| WO | WO-2020223011 A1 | 11/2020 | |
| WO | WO-2020223152 A1 | 11/2020 | |
| WO | WO-2020263750 A1 | 12/2020 | |
| WO | WO-2020264158 A1 | 12/2020 | |
| WO | WO-2020264557 A1 | 12/2020 | |
| WO | WO-2020264571 A1 | 12/2020 | |
| WO | WO-2021067632 A2 | 4/2021 | |
| WO | WO-2021072042 A1 | 4/2021 | |
| WO | WO-2021146138 A1 | 7/2021 | |
| WO | WO-2021178399 A1 | 9/2021 | |
| WO | WO-2021202681 A1 | 10/2021 | |
| WO | WO-2021262371 A1 | 12/2021 | |
| WO | WO-2021262529 A1 | 12/2021 | |

OTHER PUBLICATIONS

Hamley, I.W., "Nanostructure fabrication using block copolymers", Nanotechnology. Sep. 2003. 17;14(10):R39-R54.

Hench, L.L. and West, J.K., "The sol-gel process," Chemical reviews, Jan. 1, 1990; 90(1) pp. 33-72.

International Preliminary Report on Patentability dated Jul. 1, 2021 issued in Application No. PCT/US2019/067540.

International Preliminary Report on Patentability dated May 27, 2021 issued in Application No. PCT/US2019/060742.

International Search Report and Written Opinion dated May 17, 2021 issued in Application No. PCT/US2021/015656.

International Search Report and Written Opinion dated May 12, 2021 issued in Application No. PCT/US2021/012953.

International Search Report and Written Opinion dated Apr. 10, 2020 issued in Application No. PCT/US2019/060742.

International Search Report and Written Opinion dated Apr. 24, 2020 issued in Application No. PCT/US2019/067540.

International Search Report and Written Opinion dated Aug. 22, 2019 issued in Application No. PCT/US2019/031618.

International Search Report and Written Opinion dated Jan. 27, 2021 issued in Application No. PCT/US2020/054730.

International Search Report and Written Opinion dated Mar. 23, 2021 issued in Application No. PCT/US2020/053856.

International Search Report and Written Opinion dated Oct. 16, 2020 issued in Application No. PCT/US2020/039615.

International Search Report and Written Opinion dated Oct. 16, 2020 issued in Application No. PCT/US2020/070171.

International Search Report and Written Opinion dated Oct. 16, 2020 issued in Application No. PCT/US2020/070172.

International Search Report and Written Opinion dated Oct. 16, 2020 issued in Application No. PCT/US2020/070187.

International Search Report and Written Opinion dated Oct. 8, 2020 issued in Application No. PCT/US2020/038968.

Japanese Decision to Grant dated Feb. 12, 2019 issued in Application No. JP 2015-016254.

Japanese Decision to Grant dated May 3, 2021 issued in Application No. JP 2016-220096.

Japanese First Office Action dated Oct. 30, 2018 issued in Application No. JP 2015-016254.

Japanese First Office Action dated Sep. 15, 2020 issued in Application No. JP 2016-220096.

Korean Decision for Grant dated Sep. 2, 2021 issued in Application No. KR 10-2015-0015184.

Korean First Office Action dated Dec. 22, 2020 issued in Application No. KR 10-2015-00151843.

Korean Second Office Action dated Jul. 27, 2021 issued in Application No. KR 10-2015-0015184.

Kwon, J., et al., "Substrate Selectivity of (tBu-Allyl)Co(CO)3 during Thermal Atomic Layer Deposition of Cobalt" Chemistry of Materials, Mar. 27, 2012; 24(6): pp. 1025-1030.

Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.

Lu, Y., et al., "Continuous formation of supported cubic and hexagonal mesoporous films by sol-gel dip-coating" Nature, Sep. 1997, 389(6649), pp. 364-368.

Mackus, A.J., et al. "The use of atomic layer deposition in advanced nanopatterning", Nanoscale. Jul. 25, 2014; 6(19):10941-60.

McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.

Nazarov, D.V., et al., "Atomic layer deposition of tin dioxide nanofilms: A review", Rev. Adv. Mater. Sci. Jun. 1, 2015; 40(3):262-75.

Notice of Allowance dated Dec. 9, 2021 in U.S. Appl. No. 17/310,635.

Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).

Spitzer et al., (Mar. 1, 1986) "Conversion efficiencies from laser-produced plasmas in the extreme ultraviolet regime," J. Appl. Phys., 79(5):2251-2258.

Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.

Taiwanese First Office Action dated Aug. 10, 2020 issued in Application No. TW 105137362.

Taiwanese First Office Action dated May 31, 2018 issued in Application No. TW 104103153.

Taiwanese Second Office Action dated Nov. 18, 2020 issued in Application No. TW 105137362.

US Final Office Action, dated May 11, 2017, issued in U.S. Appl. No. 14/610,038.

US Final Office Action, dated Sep. 10, 2018, issued in U.S. Appl. No. 15/691,659.

US Notice of Allowance, dated Apr. 25, 2018 issued in U.S. Appl. No. 14/948,109.

US Notice of Allowance, dated Aug. 22, 2017, issued in U.S. Appl. No. 14/610,038.

US Notice of Allowance, dated Jul. 28, 2020, issued in U.S. Appl. No. 16/206,959.

US Notice of Allowance dated Sep. 15, 2021, issued in U.S. Appl. No. 16/691,508.

US Notice of Allowance, dated Sep. 19, 2019, issued in U.S. Appl. No. 15/691,659.

US Notice of Allowance dated Sep. 9, 2021, issued in U.S. Appl. No. 16/691,508.

US Office Action, dated Apr. 9, 2019, issued in U.S. Appl. No. 15/691,659.

US Office Action, dated Jan. 23, 2017, issued in U.S. Appl. No. 14/610,038.

US Office Action, dated Mar. 5, 2020, issued in U.S. Appl. No. 16/206,959.

US Office Action dated May 14, 2021, issued in U.S. Appl. No. 16/691,508.

US Office Action, dated May 21, 2018, issued in U.S. Appl. No. 15/691,659.

(56)　　　　　References Cited

OTHER PUBLICATIONS

US Office Action, dated Nov. 2, 2017, issued in U.S. Appl. No. 14/948,109.
U.S. Appl. No. 17/309,247, Weidman et al., filed May 11, 2021.
U.S. Appl. No. 17/309,587, Volosskiy et al., filed Jun. 8, 2021.
U.S. Appl. No. 17/310,635, Tan et al., filed Aug. 13, 2021.
U.S. Appl. No. 17/452,365, Tan et al., filed Oct. 26, 2021.
Xu, et al., "Underlayer designs to enhance the performance of EUV resists," Proceedings of SPIE, vol. 7273, 2009, pp. 727311-1-727311-11.
Banerjee, D. et al., "Potential of Metal-Organic Frameworks for Separation of Xenon and Krypton", Accounts of Chemical Research, 2015, vol. 48, No. 2, pp. 211-219.
Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
Chiang C L., et al., "Secondary Electron Emission Characteristics of Oxide Electrodes In Flat Electron Emission Lamp," AIP Advances, 2016, vol. 6, 015317, 9 Pages.
CN Office Action dated Jun. 1, 2023, in application No. CN201810783756 with English translation.
CN Office Action dated Jun. 8, 2022 in Application No. CN202180002531.2 With English Translation.
CN Office Action dated Nov. 16, 2022, in Application No. CN202180002531.2 with English translation.
CN Office Action dated Nov. 18, 2022, in Application No. CN201810783756.6 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Danilo D.E., et al., "Metal Containing Resist Readiness for HVM EUV Lithography", Journal of Photopolymer Science and Technology, 2016, vol. 29(3), pp. 501-507.
EP Extended European Search Report dated Jul. 13, 2023, in Application No. EP20831843.6.
EP Extended European Search report dated Jun. 23, 2023, in Application No. EP20831420.3.
EP Extended European Search report dated Jun. 26, 2023, in Application No. 20831242.1.
EP Extended European Search Report dated Jun. 26, 2023, in Application No. 20831343.7.
EP Extended European Search report dated Jun. 28, 2023, in Application No. EP 20832501.9.
EP Extended European Search report dated Oct. 25, 2023, in Application No. EP21837274.6.
EP Extended European Search report dated Sep. 25, 2023, in Application No. EP20870849.5.
EP Partial European Search Report dated Aug. 29, 2023, in Application No. 23173688.5.
European Search Report dated Feb. 15, 2022, in Application No. EP21741104.
European Office Action dated Feb. 25, 2022 in U.S. Appl. No. 21/741,104.
Extended European Search Report dated Dec. 23, 2021, in Application No. EP19800353.5.
Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].
Fitzgerald C B., et al., "Magnetism in Dilute Magnetic Oxide Thin Films Based on SnO2," The American Physical Society, 2006, vol. 74, 115307, 10 Pages.
Fujifilm Corp., (Presentation) "Negative tone development process for double patterning," 5th International Symposium on Immersion Lithography, Sep. 2008, Presentation Slides No. P-1-P-27.

Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.
Gangnaik, A.S. et al., (Jan. 12, 2017) "New Generation Electron Beam Resists: A Review," Chem. Mater., 29:1898-1917.
Gross, R.A. et al., "Biodegradable Polymers for the Environment", Science, Aug. 2, 2002, vol. 297, No. 5582, pp. 803-807.
Harrisson, S. et al., "RAFT Polymerization of Vinyl Esters: Synthesis and Applications", Polymers, 2014, vol. 6, No. 5, pp. 1437-1488.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 13, 2021, in PCT Application No. PCT/US2021/023901.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated May 18, 2022, in International Application No. PCT/US2022/014984.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Aug. 24, 2023, in PCT Application No. PCT/US2022/014984.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.

(56) References Cited

OTHER PUBLICATIONS

International Preliminary Report on Patentability dated Nov. 7, 2019 issued in Application No. PCT/US2018/028192.

International Preliminary Report on Patentability dated Oct. 13, 2022, in PCT Application No. PCT/US2021/023901.

International Preliminary Report on Patentability dated Sep. 7, 2023, in PCT Application No. PCT/US2022/014281.

International Preliminary Report on Patentability dated Sep. 9, 2022, in PCT Application No. PCT/US2021/019245.

International Preliminary Report on Patentability dated Sep. 30, 2021 issued in Application No. PCT/US2020/023146.

International Search Report and Written Opinion dated Apr. 17, 2023, in Application No. PCT/US2022/081390.

International Search Report and Written Opinion dated Apr. 17, 2023 in PCT Application No. PCT/US2022/081376.

International Search Report and Written Opinion dated Apr. 19, 2023, in Application No. PCT/US2022/081845.

International Search Report and Written Opinion dated Aug. 17, 2023, in Application No. PCT/US2023/019871.

International Search Report and Written Opinion dated Aug. 8, 2018 issued in Application No. PCT/US2018/028192.

International Search Report and Written Opinion dated Jul. 17, 2020 issued in Application No. PCT/US2020/023146.

International Search Report and Written Opinion dated Jul. 31, 2020, in PCT Application No. PCT/US2020/028151.

International Search Report and Written Opinion dated Mar. 24, 2022, for International Application No. PCT/US2021/061751.

International Search Report and Written Opinion dated May 3, 2023, in Application No. PCT/US2023/060306.

International Search Report and Written Opinion dated May 16, 2022, In International Application No. PCT/US2022/014281.

International Search Report and Written Opinion dated Nov. 3, 2021, in PCT Application No. PCT/US2021/042108.

International Search Report and Written Opinion dated Nov. 4, 2021 in PCT Application No. PCT/US2021/042103.

International Search Report and Written Opinion dated Nov. 4, 2021 in PCT Application No. PCT/US2021/042106.

International Search Report and Written Opinion dated Nov. 4, 2021 in PCT Application No. PCT/US2021/042107.

International Search Report and Written Opinion dated Nov. 10, 2021, in PCT Application No. PCT/US2021/042104.

International Search Report and Written Opinion dated Oct. 13, 2021, in application No. PCT/US2021/037924.

International Search Report and Written Opinion dated Oct. 13, 2023 in PCT Application No. PCT/US2023/069419.

International Search Report and Written Opinion dated Oct. 16, 2018 issued in Application No. PCT/US2018/032783.

International Search Report and Written Opinion dated Oct. 28, 2021 in PCT Application No. PCT/US2021/040381.

International Search Report and Written Opinion dated Sep. 15, 2021, in PCT Application No. PCT/US2021/034019.

Jalife S., et al., "Noble Gas Endohedral Fullerenes," Chemical Science, 2020, vol. 11, pp. 6642-6652.

Joo, W. et al., "Synthesis of Unzipping Polyester and a Study of its Photochemistry", Journal of the American Chemical Society, 2019, vol. 141, No. 37, pp. 14736-14741.

JP Office Action dated Jul. 26, 2022 in Application No. JP2021102822 With English translation.

JP Office Action dated Nov. 15, 2022, in Application No. JP2021-176082 with English translation.

JP Office Action dated Apr. 11, 2023 in Application No. JP2021-176082 with English translation.

JP Office Action dated Apr. 27, 2023 in Application No. JP2021-575910 with English translation.

JP Office Action dated Feb. 28, 2023 in Application No. JP2020-562160 with English translation.

JP Office Action dated Jan. 17, 2023, in Application No. JP2022-552422 with English translation.

JP Office Action dated Jun. 14, 2022, in Application No. JP20190563508 with English translation.

JP Office Action dated Jun. 27, 2023, in Application No. JP2022-552422 with English translation.

JP Office Action dated Jun. 27, 2023, in application No. JP2023-63868 with English translation.

JP Office Action dated Jun. 28, 2022 in Application No. JP2021560945 with English translation.

JP Office Action dated Nov. 14, 2023, in JP Application No. 2021-0575910 with English Translation.

JP Office Action dated Nov. 14, 2023 in JP Application No. 2022-559416, with English Translation.

JP Office Action dated Oct. 3, 2023 in Application No. JP2021-176082 with English Translation.

JP Office Action dated Oct. 10, 2023 in Application No. JP2022-552422 with English Translation.

JP Office Action dated Sep. 19, 2023 in Application No. JP2020-562160 with English translation.

Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.

Komen C V., et al., "Structure-Magnetic Property Relationship Intransition Metal (M = V,Cr, Mn, Fe, Co, Ni) Doped Sno2 Nanoparticles," Journal of Applied Physics, 2008, vol. 103, 5 Pages.

KR Office Action dated Feb. 8, 2022, in Application No. KR10-2021-7030794 with English Translation.

KR Office Action dated Aug. 11, 2023, in Application No. KR10-2023-7011840 with English translation.

KR Office Action dated Jan. 2, 2023 in Application No. KR10-2022-7027233 with English translation.

KR Office Action dated May 9, 2022, in Application No. KR1020217030794 with English translation.

KR Office Action dated Nov. 21, 2023 in KR Application No. 10-2022-7002869 with English Translation.

KR Office Action dated Nov. 21, 2023 in KR Application No. 10-2022-7029421 with English Translation.

KR Office Action dated Sep. 28, 2022, in Application No. KR10-2022-7027233 with English translation.

KR Prior Art Search Report dated Apr. 3, 2023, in application No. KR 10-2022-7029421.

KR Prior Art Search Report dated Aug. 25, 2023, in Application No. KR10-2021-7022858 (No Translation).

KR Prior Art Search Report dated Nov. 14, 2023, in Application No. KR10-2023-7038357.

KR Search Report dated Oct. 30, 2023 in KR Application No. 10-2023-7036296.

Kvon V., et al., "Secondary Electron Emission Of Tin And Tin-Lithium Under Low Energy Helium Plasma Exposure," Nuclear Materials and Energy, 2017, vol. 13, pp. 21-27.

Lin Y., et al., "A New Examination Of Secondary Electron Yield Data," Surface And Interface Analysis, 2005, vol. 37, pp. 895-900.

Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.

Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.

Molloy, K. C., "Precursors for the Formation of Tin (IV) Oxide and Related Materials", Journal of Chemical Research, 2008, vol. 2008, No. 10, pp. 549-554.

Ogale S B., et al., "High Temperature Ferromagnetism with Giant Magnetic Moment in Transparent Co-doped SnO2-δ," Physical Review Letters, 2003, 17 Pages.

Pedersen A., et al., "Lithiation of Tin Oxide: A Computational Study," Integrated Systems Laboratory, 2014, 20 Pages.

Rothschild, et al., "Liquid immersion lithography: Why, how, and when?" Journal Vacuum Science Technology, Nov./Dec. 2004, pp. 2877-2881.

Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.

(56)     References Cited

OTHER PUBLICATIONS

Saunders M., et al., "Noble Gas Atoms Inside Fullerenes," Science, 1996, vol. 271, pp. 1693-1697.

Singh R ., "Unexpected Magnetism In Nanomaterials," Journal of Magnetism and Magnetic Materials, 2013, vol. 346, pp. 58-73.

Stulen, et al., "Extreme Ultraviolet Lithography" IEEE Journal of Quantum Electronics, vol. 35, No. 5, May 1999, pp. 694-699.

Sundberg, P. et al., "Organic and Inorganic-organic Thin Film Structures by Molecular Layer Deposition: A Review", Beilstein Journal of Nanotechnology, 2014, vol. 5, pp. 1104-1136.

Taiwanese Office Action dated Apr. 10, 2023 in TW Application No. TW108140940 with English translation.

Tian Y F., et al., "Oxide Magnetic Semiconductors: Materials, Properties, And Devices," Magnetism, Magnetic Materials, And Interdisciplinary Research, 2013, vol. 22(8), 2 Pages.

TW Office Action dated Jan. 9, 2023 In Application No. TW20190116155 with English translation.

TW Office Action dated Sep. 5, 2022, in Application No. TW110101388 with English translation.

TW Office Action dated Sep. 8, 2022 in Application No. TW111123386 with English translation.

TW First Office Action dated Oct. 6, 2021, in application No. TW20180116415 with English translation.

TW Office Action dated Apr. 29, 2022 in Application No. TW110118172 with English translation.

TW Office Action dated Aug. 17, 2023, in application No. TW110124741 with Translation.

TW Office Action dated Jan. 13, 2023, in Application No. TW110124741 with English translation.

TW Office Action dated Jan. 19, 2023 in Application No. TW110141961 with English translation.

TW Office Action dated Jun. 3, 2022, in Application No. TW110143913 with English translation.

TW Office Action dated Mar. 7, 2022, in Application No. TW110101388 with English translation.

TW Office Action dated May 16, 2023, in Application No. TW20190146890 with English translation.

TW Office Action dated Oct. 13, 2023, in application No. TW109121680 with English Translation.

TW Office Action dated Oct. 30, 2023, in application No. TW108116155 with English Translation.

US Final Office Action, dated Feb. 5, 2019 issued in U.S. Appl. No. 15/495,701.

U.S. Final Office Action dated May 12, 2023 in U.S. Appl. No. 17/455,185.

U.S. Final Office Action dated Nov. 9, 2023 in U.S. Appl. No. 17/455,185.

U.S. Non-Final office Action dated Feb. 7, 2023 in U.S. Appl. No. 17/455,185.

U.S. Non-Final Office Action dated May 11, 2023, in U.S. Appl. No. 17/452,365.

U.S. Non-Final Office Action dated Nov. 6, 2023, in U.S. Appl. No. 17/309,587.

U.S. Non-Final Office Action dated Nov. 20, 2023 in U.S. Appl. No. 18/377,245.

U.S. Non-Final Office Action dated Oct. 13, 2023, in U.S. Appl. No. 18/184,545.

U.S. Non-Final Office Action dated Oct. 20, 2023, in U.S. Appl. No. 18/297,989.

U.S. Non-Final Office Action dated Oct. 20, 2023, in U.S. Appl. No. 18/298,003.

U.S. Non-Final Office Action dated Oct. 26, 2023, in U.S. Appl. No. 17/596,648.

U.S. Non-Final Office Action dated Oct. 26, 2023, in U.S. Appl. No. 17/596,928.

U.S. Non-Final Office Action dated Sep. 28, 2023, in U.S. Appl. No. 15/733,598.

U.S. Notice of Allowance dated Aug. 21, 2023 in U.S. Appl. No. 17/452,365.

U.S. Notice of Allowance dated Dec. 4, 2023 in U.S. Appl. No. 17/452,365.

U.S. Notice of Allowance dated Feb. 22, 2022 in U.S. Appl. No. 17/310,635.

US Notice of Allowance, dated Jun. 10, 2020 issued in U.S. Appl. No. 15/979,340.

U.S. Notice of Allowance dated Oct. 18, 2023 in U.S. Appl. No. 17/309,247.

US Notice of Allowance, dated Sep. 30, 2021 issued in U.S. Appl. No. 17/008,095.

US Office Action, dated Aug. 9, 2018 issued in U.S. Appl. No. 15/495,701.

US Office Action, dated Mar. 18, 2021 issued in U.S. Appl. No. 17/008,095.

US Office Action, dated Nov. 6, 2019 issued in U.S. Appl. No. 15/979,340.

U.S. Appl. No. 17/905,754, inventors Kanakasabapathy et al., filed Sep. 6, 2022.

U.S. Appl. No. 18/005,571 inventors Hansen et al., filed Jan. 13, 2023.

U.S. Appl. No. 18/005,594, inventors Hansen et al., filed Jan. 13, 2023.

U.S. Appl. No. 18/254,787, inventors Dictus D, et al., filed May 26, 2023.

U.S. Appl. No. 18/264,391, inventors Kanakasabapathy S K, et al., filed Aug. 4, 2023.

U.S. Appl. No. 18/298,003, inventors Marks et al., filed Apr. 10, 2023.

U.S. Appl. No. 18/377,245, inventors Dictus D, et al., filed Oct. 5, 2023.

U.S. Appl. No. 18/377,267, inventors Yu J, et al., filed Oct. 5, 2023.

U.S. Appl. No. 18/546,879, inventors Weidman T W, et al., filed Aug. 17, 2023.

U.S. Restriction Requirement dated Nov. 14, 2022 in U.S. Appl. No. 17/455,185.

U.S. Restriction requirement dated Aug. 4, 2023, in U.S. Appl. No. 18/297,989.

U.S Restriction requirement dated Aug. 18, 2023 in U.S. Appl. No. 18/298,003.

U.S. Restriction Requirement dated Nov. 20, 2023 in U.S. Appl. No. 17/759,281.

U.S. Restriction requirement dated Sep. 7, 2023 in U.S. Appl. No. 17/309,587.

U.S. Supplemental Notice of Allowability dated Jan. 26, 2022, in U.S. Appl. No. 17/008,095.

Wang, et al., "Lithography Simulation for the Fabrication of Silicon Photonic Devices with Deep-Ultraviolet Lithography" IEEE, (2012) pp. 288-290.

Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.

Zhou, H. et al., "Molecular Layer Deposition of Functional Thin Films for Advanced Lithographic Patterning", ACS Applied Materials & Interfaces, 2011, vol. 3, No. 2, pp. 505-511.

JP Office Action dated Mar. 26, 2024 in JP Application No. 2021-576240, with English Translation.

CN Office Action dated Apr. 22, 2024 in CN Application No. 201980085227.1, with English translation.

CN Office Action dated Apr. 24, 2024 in CN Application No. 201980075389.7, with English translation.

CN Office Action dated Mar. 14, 2024 in CN Application No. 201810783756.6, with English Translation.

JP Office Action dated Apr. 2, 2024 in JP Application No. 2022-559416, with English Translation.

JP Office Action dated Apr. 30, 2024 in JP Application No. 2021-577241, with English translation.

JP Office Action dated Mar. 22, 2024 in JP Application No. 2020-562160, with English Translation.

KR Office Action dated Apr. 5, 2024 in KR Application No. 10-2021-7036139, with English Translation.

KR Office Action dated Apr. 9, 2024 in KR Application No. 10-2023-7038357, with English Translation.

(56) References Cited

OTHER PUBLICATIONS

KR Office Action dated Apr. 23, 2024 in KR Application No. 10-2016-0152489, with English translation.
KR Office Action dated Mar. 14, 2024 in KR Application No. 10-2021-7022858, with English Translation.
SG Written Opinion dated Apr. 16, 2024 in SG Application No. 11202114197Y.
Singapore Search Report and Written Opinion dated Mar. 17, 2023 issued in Application No. SG11202114197Y.
TW Office Action dated Apr. 19, 2024 in TW Application No. 112146727, with English translation.
TW Office Action dated Apr. 22, 2024 in TW Application No. 112126160, with English translation.
TW Office Action dated Mar. 11, 2024 in TW Application No. 109121649, with English Translation.
TW Office Action dated Mar. 21, 2024 in TW Application No. 108146890, with English Translation.
U.S. Advisory Action dated Apr. 16, 2024 in U.S. Appl. No. 17/596,648.
U.S. Final Office Action dated Apr. 10, 2024 in U.S. Appl. No. 15/733,598.
U.S. Final Office Action dated Apr. 23, 2024 in U.S. Appl. No. 17/596,928.
U.S. Final Office Action dated Mar. 12, 2024 in U.S. Appl. No. 18/377,245.
U.S. Final Office Action dated May 3, 2024 in U.S. Appl. No. 18/297,989.
U.S. Final Office Action dated May 9, 2024 in U.S. Appl. No. 17/309,587.
U.S. Notice of Allowance dated Mar. 13, 2024 in U.S. Appl. No. 18/184,545.
U.S. Notice of Allowance dated Mar. 15, 2024 in U.S. Appl. No. 17/452,365.
U.S. Appl. No. 18/628,111, inventors Tan S.S, et al., filed Apr. 5, 2024.
U.S. Restriction Requirement dated Apr. 8, 2024 in U.S. Appl. No. 17/754,019.
Alf, M.E., et al., "Chemical Vapor Deposition of Conformal, Functional, and Responsive Polymer Films," Advanced Materials, 2010, vol. 22(18), pp. 1993-2027.
JP Office Action dated May 14, 2024 in JP Application No. 2021-576241 with English translation.
JP Office Action dated May 14, 2024 in JP Application No. 2021-576792 with English translation.
KR Office Action dated May 24, 2024 in KR Application No. 10-2020-7035732 with English translation.
SG Search Report and Written Opinion dated May 14, 2024 in SG Application No. 11202251864Y.
U.S. Advisory Action dated May 7, 2024 in U.S. Appl. No. 18/298,003.
U.S. Non-Final Office Action dated May 29, 2024 in U.S. Appl. No. 18/298,003.
CN Office Action dated Dec. 13, 2023 in CN Application No. 201810783756.6 with English translation.
CN Office Action dated Dec. 26, 2023 in CN Application No. 201980028279.5, with English Translation.
CN Office Action dated Jan. 3, 2024 in CN Application No. 202310318757.4 with English Translation.
CN Office Action dated Jan. 22, 2024 in CN Application No. 202080047683.X, with English Translation.
CN Office Action dated Jan. 23, 2024 in CN Application No. 202080046943.1 with English Translation.
Dahuang, D., et al., Functional Thin Films and Their Deposition Preparation Techniques, Metallurgy Industrial Press, Jan. 31, 2013, pp. 450-454. [with English Translation].
EP Extended European Search report dated Nov. 29, 2023 in EP Application No. 23173688.5.
International Preliminary Report on Patentability and Written Opinion dated Feb. 8, 2024 in PCT Application No. PCT/US2022/037393.

International Preliminary Report on Patentability and Written Opinion dated Feb. 8, 2024 in PCT Application No. PCT/US2022/037733.
International Search Report and Written Opinion dated Feb. 1, 2024 in PCT Application No. PCT/US2023/034545.
International Search Report and Written Opinion dated Jan. 10, 2024 in PCT Application No. PCT/US2023/033020.
International Search Report and Written Opinion dated Nov. 7, 2022 in PCT Application No. PCT/US2022/037393.
JP Office Action dated Dec. 26, 2023 in JP Application No. 20210576241, with English Translation.
JP Office Action dated Dec. 26, 2023 in JP Application No. 2021-526240, with English Translation.
JP Office Action dated Feb. 13, 2024 in JP Application No. 2023-63868, with English Translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Mar. 5, 2024 in JP Application No. 2021-575910, with English Translation.
KR Office Action dated Feb. 29, 2024 in KR Application No. 10-2022-7026649, with English Translation.
KR Prior Art Search Report dated Apr. 3, 2023, in application No. KR 10-2022-7029421 with English translation.
KR Prior Art Search Report dated Aug. 25, 2023, in Application No. KR10-2021-7022858 with English translation.
KR Prior Art Search Report dated Nov. 14, 2023, in Application No. KR10-2023-7038357 with English translation.
KR Prior Art Search Report dated Oct. 30, 2023 in KR Application No. 10-2023-7036296 with English translation.
TW Office Action dated Dec. 20, 2023, in TW Application No. 109121579 with English Translation.
TW Office Action dated Feb. 21, 2024 in TW Application No. 109121664 with English translation.
TW Office Action dated Feb. 29, 2024 in TW Application No. 109134377, with English Translation.
TW Office Action dated Jan. 2, 2024 in TW Application No. 109121639, with English Translation.
TW Office Action dated Jan. 11, 2024 in TW Application No. 108146890, with English Translation.
U.S. Corrected Notice of Allowance dated Jan. 31, 2024 in U.S. Appl. No. 17/309,247.
U.S. Final Office Action dated Feb. 27, 2024 in U.S. Appl. No. 18/298,003.
U.S. Final Office Action dated Mar. 5, 2024 in U.S. Appl. No. 17/596,648.
U.S. Non-Final Office Action dated Feb. 1, 2024 in U.S. Appl. No. 17/759,281.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Notice of Allowance dated Mar. 6, 2024 in U.S. Appl. No. 18/184,545.
U.S. Appl. No. 18/580,334, inventors Peter D, et al., filed Jan. 18, 2024.
International Search Report and Written Opinion dated Jul. 1, 2024 in PCT Application No. PCT/US2024/020105.
JP Notice of Allowances dated Aug. 27, 2024 in JP Application No. 2021-576240 with English translation.
International Preliminary Report on Patentability and Written Opinion dated Oct. 17, 2024 in PCT Application No. PCT/US2023/017635.
International Search Report and Written Opinion dated Aug. 16, 2023, in Application No. PCT/US2023/017635.
KR Notice of Allowance dated Oct. 29, 2024 in KR Application No. 10-2022-7003329, with English Translation.
U.S. Appl. No. 18/852,644, inventors Austin D.Z et al., filed Sep. 30, 2024.
CN Office Action dated Mar. 8, 2025 in CN Application No. 202080058274.X, with English Translation.

(56)          References Cited

OTHER PUBLICATIONS

KR Office Action dated Mar. 7, 2025 in KR Application No. 20237002143, with English Translation.

TW Office Action and Search Report dated Feb. 13, 2025 in TW Application No. 110122515, with English Translation.

U.S. Restriction Requirement dated Jan. 30, 2025 in U.S. Appl. No. 18/011,707.

International Preliminary Report on Patentability and Written Opinion dated Apr. 17, 2025 in PCT Application No. PCT/US2023/034545.

JP Office Action dated Mar. 25, 2025 in JP Application No. 20230522940, with English Translation.

U.S. Non-Final Office Action dated May 8, 2025 in U.S. Appl. No. 18/011,707.

U.S. Appl. No. 19/116,865, inventors Volosskiy B et al., filed Mar. 28, 2025.

U.S. Non-Final Office Action dated Dec. 23, 2025 in U.S. Appl. No. 18/011,707.

International Preliminary Report on Patentability and Written Opinion dated Oct. 2, 2025 in PCT Application No. PCT/US2024/020105.

KR Office Action dated Oct. 17, 2025 in KR Application No. 10-2025-7001515, with English Translation.

U.S. Final Office Action dated Aug. 20, 2025 in U.S. Appl. No. 18/011,707.

U.S. Appl. No. 19/156,615, inventors Volosskiy B et al., filed Aug. 14, 2025.

* cited by examiner

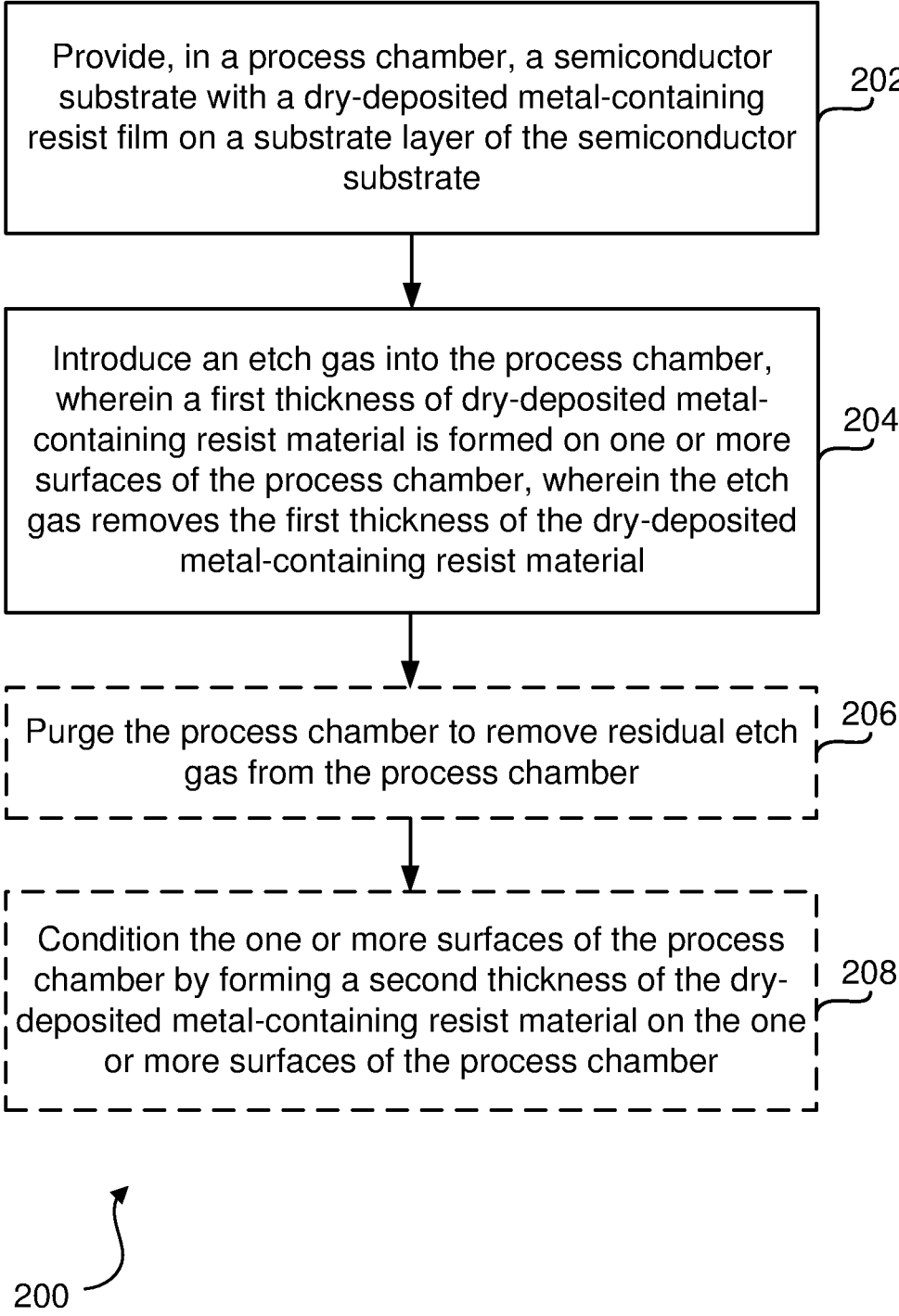

Provide, in a process chamber, a semiconductor substrate with a dry-deposited metal-containing resist film on a substrate layer of the semiconductor substrate — 202

Introduce an etch gas into the process chamber, wherein a first thickness of dry-deposited metal-containing resist material is formed on one or more surfaces of the process chamber, wherein the etch gas removes the first thickness of the dry-deposited metal-containing resist material — 204

Purge the process chamber to remove residual etch gas from the process chamber — 206

Condition the one or more surfaces of the process chamber by forming a second thickness of the dry-deposited metal-containing resist material on the one or more surfaces of the process chamber — 208

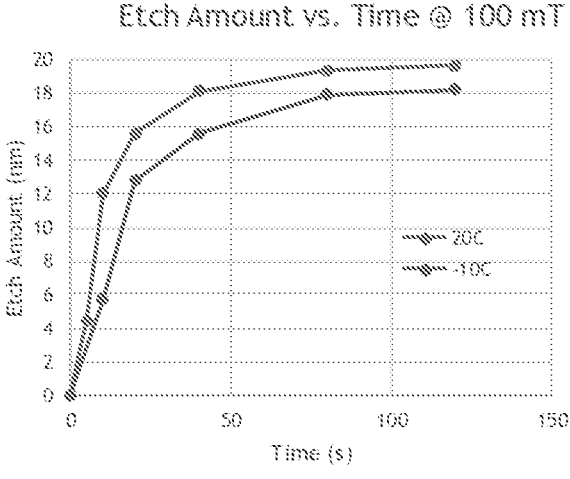
FIG. 11A
FIG. 11B
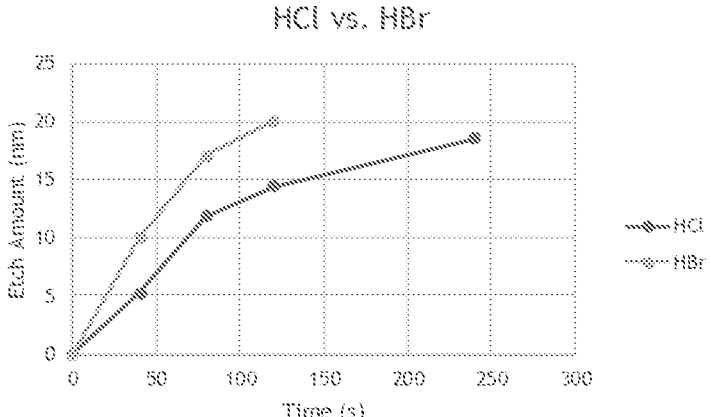
FIG. 11C

DRY CHAMBER CLEAN OF PHOTORESIST FILMS

INCORPORATION BY REFERENCE

A PCT Request Form is filed concurrently with this specification as part of the present application. Each application that the present application claims benefit of priority of or priority to as identified in the concurrently filed PCT Request Form is incorporated by reference herein in its entirety and for all purposes.

BACKGROUND

The fabrication of semiconductor devices, such as integrated circuits, is a multi-step process involving photolithography. In general, the process includes the deposition of material on a wafer, and patterning the material through lithographic techniques to form structural features (e.g., transistors and circuitry) of the semiconductor device. The steps of a typical photolithography process known in the art include: preparing the substrate; applying a photoresist, such as by spin coating; exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and loss of light during patterning. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

SUMMARY

Dry chamber clean can happen in the context of photoresist patterning. After photoresist material is dry-deposited in a process chamber, unwanted photoresist material may accumulate on internal surfaces of the process chamber. The photoresist material may be, for example, a metal-containing EUV resist material. A dry chamber clean may be performed to remove the unwanted photoresist material by exposure to an etch gas. In some embodiments, the etch gas may be a hydrogen halide, a hydrogen gas and halogen gas, boron trichloride, or combinations thereof. Purging may follow to remove residual etch gas from the process chamber. In some embodiments, conditioning or seasoning of the process chamber may follow to recover the internal surfaces by depositing a coating of film (e.g., photoresist material) on the internal surfaces.

Disclosed herein are methods and systems of cleaning a process chamber. The method includes providing, in a process chamber, a semiconductor substrate with a dry-deposited metal-containing resist film on a substrate layer of the semiconductor substrate, and introducing an etch gas into the process chamber, where a first thickness of dry-deposited metal-containing resist material is formed on one or more surfaces of the process chamber, where the etch gas removes the first thickness of the dry-deposited metal-containing resist material.

In some implementations, the method further includes conditioning the one or more surfaces of the process chamber by forming a second thickness of the dry-deposited metal-containing resist material on the one or more surfaces of the process chamber. In some implementations, the method further includes purging the process chamber after introducing the etch gas to remove residual etch gas from the process chamber. In some embodiments, purging the process chamber comprises flowing an inert gas and/or reactive gas into the process chamber, where the process chamber is heated to an elevated temperature between about 20° C. and about 140° C., where the process chamber is pumped to a chamber pressure between about 0.1 Torr and about 6 Torr. In some implementations, purging the process chamber comprises exposing the one or more surfaces of the process chamber to a remote plasma-based treatment to remove the residual etch gas, where the remote plasma-based treatment includes fluorine-based chemistry. In some implementations, purging the process chamber comprises exposing the one or more surfaces of the process chamber to ozone and/or oxygen gas to remove the residual etch gas. In some implementations, the method further includes heating the one or more surfaces of the process chamber to an elevated temperature prior to introducing the etch gas, where the elevated temperature is between about 20° C. and about 140° C. In some implementations, the etch gas includes a hydrogen halide, hydrogen gas and halogen gas, boron trichloride, or combinations thereof. In some implementations, removal of the first thickness of the dry-deposited metal-containing resist material occurs without exposure to plasma. In some implementations, the method further includes the pumping the process chamber to a chamber pressure between about 0.1 Torr and 6 Torr, heating the one or more surfaces of the process chamber to an elevated temperature between about 20° C. and about 140° C., and introducing a dummy wafer into the process chamber before introducing the etch gas. In some implementations, the dry-deposited metal-containing resist material is an organo-metal oxide or organo-metal-containing thin film.

Disclosed herein is an apparatus for depositing resist. The apparatus includes a process chamber with a substrate support, a vacuum line coupled to the process chamber, and an etch gas line coupled to the process chamber. The apparatus further includes a controller configured with instructions for cleaning the process chamber, the instructions comprising code for: vapor depositing a metal-containing resist film on a substrate layer of a semiconductor substrate in the process chamber, and cleaning the process chamber by flowing an etch gas into the process chamber, where the etch gas removes a first thickness of dry-deposited metal-containing resist material formed on one or more surfaces of the process chamber.

In some implementations, the apparatus further includes one or more heaters coupled to the one or more surfaces of the process chamber, where the controller is further configured with instructions comprising code for: heating the one or more surfaces of the process chamber to an elevated temperature, where the elevated temperature is between about 20° C. and about 140° C. In some implementations, the controller is configured with instructions comprising code for: conditioning the one or more surfaces of the process chamber by forming a second thickness of the dry-deposited metal-containing resist material on the one or more surfaces of the process chamber. In some implementations, the controller is configured with instructions comprising code for: purging the process chamber after introducing the etch gas to remove residual etch gas from the process chamber.

These and other features of the disclosed embodiments will be described in detail below with reference to the associated drawings.

BRIEF DESCRIPTION OF DRAWINGS

FIG. 2 presents a flow diagram of an example method of performing a dry chamber clean according to some embodiments.

FIGS. 11A-11E show graphs illustrating the performance of HCl as an etch gas for different pressures and temperatures.

DETAILED DESCRIPTION

Figure 1:
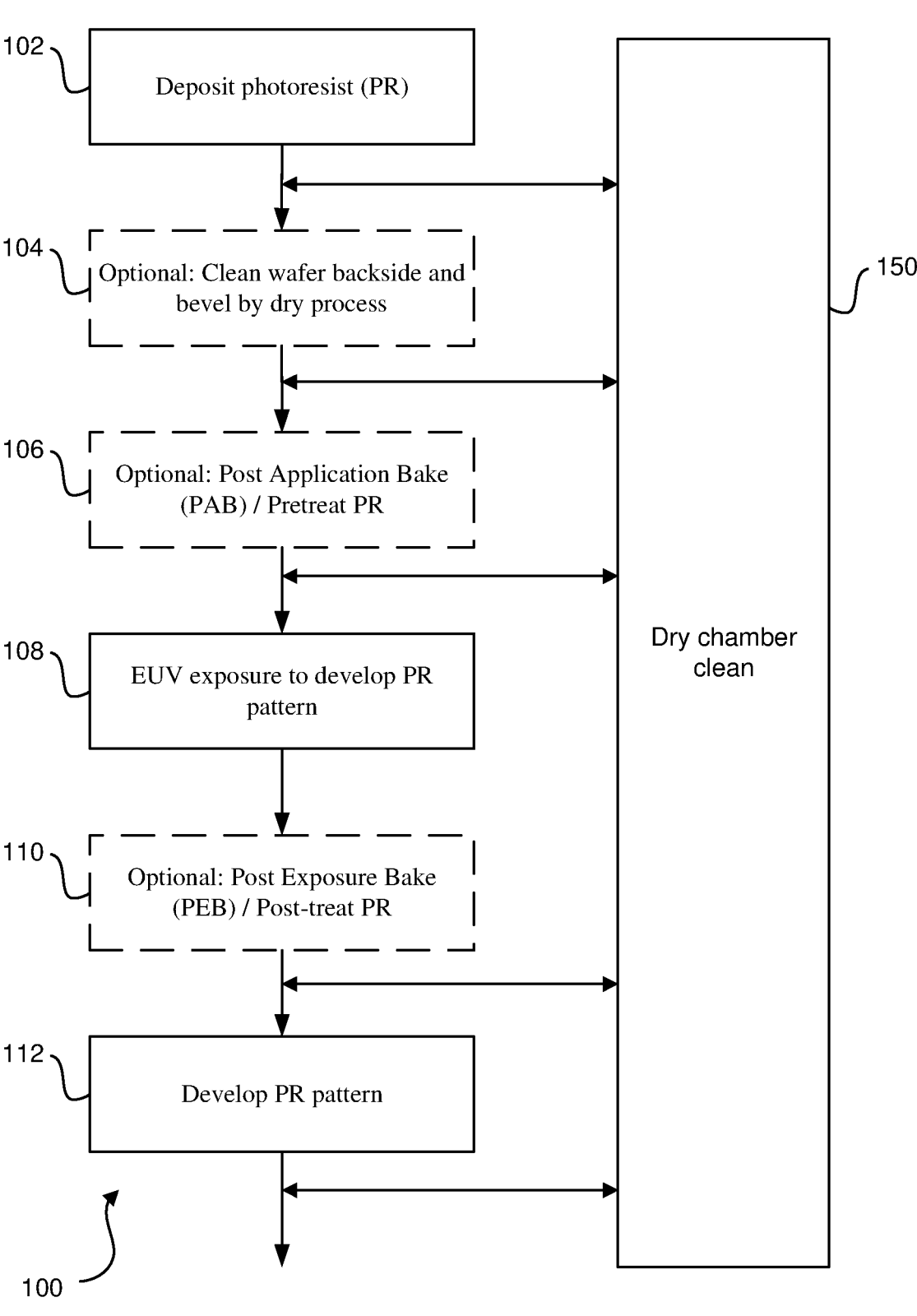
FIG. 1 presents a flow diagram of an example method for performing a dry chamber clean when depositing and developing a photoresist according to some embodiments.

This disclosure relates generally to the field of semiconductor processing. In particular aspects, the disclosure is directed to process and apparatus for processing of EUV photoresists (e.g., EUV-sensitive metal and/or metal oxide-containing photoresist films) in the context of EUV patterning and EUV patterned film development to form a patterning mask.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Introduction

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photo-resist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum.

EUV lithography makes use of EUV resists that are patterned to form masks for use in etching underlying layers. EUV resists may be polymer-based chemically amplified resists (CARs) produced by liquid-based spin-on techniques. An alternative to CARs is directly photopatternable metal oxide-containing films, such as those available from Inpria, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photo-resist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in Application PCT/US19/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers.

When fabricating semiconductor devices, it is important for the fabrication process to be precise and repeatable. Unfortunately, as a semiconductor fabrication reaction chamber processes multiple substrates over time, the processing conditions and chemistries within the reaction chamber change. During deposition and application of a metal-containing EUV resist film on a semiconductor substrate, e.g., dry deposition as described herein, there may be some unintended deposition of metal-containing EUV resist material on chamber surfaces. After performing several processing operations in a process chamber, the unintended formation of metal-containing EUV resist material on chamber surfaces may reach a level that makes the EUV resist material more prone to flaking and peeling. In some instances, particles and film impurities originating from the EUV resist material on internal surfaces of the process chamber may fall onto a substrate surface during processing. For example, particles and film impurities may originate from internal chamber walls, ceiling, showerhead, substrate support, lift pins, gas lines, nozzles, etc. Such particles and film impurities that flake or peel from internal surfaces of the process chamber may result in contamination and defect issues in semiconductor substrates. This contamination not only causes contamination in a semiconductor substrate itself, but potentially causes contamination in downstream processing tools such as patterning (scanner) and development tools.

Conventionally, removal of unintended deposits on internal surfaces of a process chamber can be performed by manually opening up the process chamber and mechanically scrubbing/wiping the internal surfaces using one or more cleaning agents. In some instances, these methods may involve replacement of parts and can take more than a day to perform chamber maintenance. Such methods may be time-consuming, costly, and ineffective.

Dry Clean of EUV Resist in Process Chamber

The present disclosure provides for a dry clean of EUV resist material from internal surfaces of a process chamber. The dry clean can be performed using halide-containing chemistries. In some embodiments, the halide-containing chemistry may include a hydrogen halide such as HCl, HBr, or HI. For example, the hydrogen halide can be HCl. In some embodiments, the halide-containing chemistry may include a hydrogen gas and halogen gas. The dry clean may be a non-plasma thermal-based cleaning operation. For instance, a chamber wall temperature may be between about 20° C. and about 140° C. The dry clean may be followed by a dehalogenation step to remove excess halides from the process chamber and/or a conditioning step to protect the internal surfaces of the process chamber. Though the dry clean is particularly useful in a process chamber used for EUV dry deposition, the dry clean may be performed in any process chamber used in bevel edge and/or backside clean, bake, development, or etch operation. The present in situ dry clean decreases the frequency between cleaning operations, improves particle performance, and enables higher tool availability.

FIG. 1 presents a flow diagram of an example method for performing a dry chamber clean when depositing and developing a photoresist according to some embodiments. The operations of a process 100 may be performed in different orders and/or with different, fewer, or additional operations. Aspects of the process 100 may be described with reference to FIGS. 2 and 3A-3D. One or more operations of the process 100 may be performed using an apparatus described in any one of FIGS. 13-16. In some embodiments, the operations of the process 100 may be implemented, at least in part, according to software stored in one or more non-transitory computer readable media.

At block 102 of the process 100, a layer of photoresist is deposited. This may be either a dry deposition process such as a vapor deposition process or a wet process such as a spin-on deposition process.

The photoresist may be a metal-containing EUV resist. An EUV-sensitive metal or metal oxide-containing film may be deposited on a semiconductor substrate by any suitable technique, including wet (e.g., spin-on) or dry (e.g., CVD) deposition techniques. For example, described processes have been demonstrated for EUV photoresist compositions based on organotin oxides, being applicable to both commercially spin-coatable formulations (e.g., such as are available from Inpria Corp, Corvallis, OR) and formulations applied using dry vacuum deposition techniques, further described below.

Semiconductor substrates may include any material construct suitable for photolithographic processing, particularly for the production of integrated circuits and other semiconducting devices. In some embodiments, semiconductor substrates are silicon wafers.

Semiconductor substrates may be silicon wafers upon which features have been created ("underlying features"), having an irregular surface topography. As referred to herein, the "surface" is a surface onto which a film of the present disclosure is to be deposited or that is to be exposed to EUV during processing. Underlying features may include regions in which material has been removed (e.g., by etching) or regions in which materials have been added (e.g., by deposition) during processing prior to conducting a method of this disclosure. Such prior processing may include methods of this disclosure or other processing methods in an iterative process by which two or more layers of features are formed on the substrate.

EUV-sensitive thin films may be deposited on the semiconductor substrate, such films being operable as resists for subsequent EUV lithography and processing. Such EUV-sensitive thin films comprise materials which, upon exposure to EUV, undergo changes, such as the loss of bulky pendant substituents bonded to metal atoms in low density M-OH rich materials, allowing their crosslinking to denser M-O-M bonded metal oxide materials. Through EUV patterning, areas of the film are created that have altered physical or chemical properties relative to unexposed areas. These properties may be exploited in subsequent processing, such as to dissolve either unexposed or exposed areas, or to selectively deposit materials on either the exposed or unexposed areas. In some embodiments, the unexposed film has a more hydrophobic surface than the exposed film under the conditions at which such subsequent processing is performed. For example, the removal of material may be performed by leveraging differences in chemical composition, density and cross-linking of the film. Removal may be by wet processing or dry processing, as further described below.

The thin films are, in various embodiments, organometallic materials, for example organotin materials comprising tin oxide, or other metal oxide materials/moieties. The organometallic compounds may be made in a vapor phase reaction of an organometallic precursor with a counter reactant. In various embodiments, the organometallic compounds are formed through mixing specific combinations of organometallic precursors having bulky alkyl groups or fluoroalkyl with counter-reactants and polymerizing the mixture in the vapor phase to produce a low-density, EUV-sensitive material that deposits onto the semiconductor substrate.

In various embodiments, organometallic precursors comprise at least one alkyl group on each metal atom that can survive the vapor-phase reaction, while other ligands or ions coordinated to the metal atom can be replaced by the counter-reactants. Organometallic precursors include those of the formula:

$$M_a R_b L_c \qquad \text{(Formula 1)}$$

wherein: M is a metal with a high EUV absorption cross-section; R is alkyl, such as $C_n H_{2n+1}$, preferably wherein $n \geq 2$; L is a ligand, ion or other moiety which is reactive with the counter-reactant; $a \geq 1$; $b \geq 1$; and $c \geq 1$.

In various embodiments, M has an atomic absorption cross section equal to or greater than $1 \times 10^7$ cm$^2$/mol. M may be, for example, selected from the group consisting of tin, hafnium, tellurium, bismuth, indium, antimony, germanium, and combinations thereof. In some embodiments, M is tin. R may be fluorinated, e.g., having the formula $C_n F_x H_{(2n+1)}$. In various embodiments, R has at least one beta-hydrogen or beta-fluorine. For example, R may be selected from the group consisting of ethyl, i-propyl, n-propyl, t-butyl, i-butyl, n-butyl, sec-butyl, n-pentyl, i-pentyl, t-pentyl, sec-pentyl, and mixtures thereof. L may be any moiety readily displaced by a counter-reactant to generate an M-OH moiety, such as a moiety selected from the group consisting of amines (such as dialkylamino, monoalkylamino), alkoxy, carboxylates, halogens, and mixtures thereof.

Organometallic precursors may be any of a wide variety of candidate metal-organic precursors. For example, where M is tin, such precursors include t-butyl tris(dimethylamino) tin, i-butyl tris(dimethylamino) tin, n-butyl tris(dimethyl-amino) tin, sec-butyl tris(dimethylamino) tin, i-propyl(tris) dimethylamino tin, n-propyl tris(dimethylamino) tin, ethyl tris(dimethylamino) tin, and analogous alkyl(tris)(t-butoxy) tin compounds such as t-butyl tris(t-butoxy) tin. In some embodiments, the organometallic precursors are partially fluorinated.

Counter-reactants have the ability to replace the reactive moieties, ligands or ions (e.g., L in Formula 1, above) so as to link at least two metal atoms via chemical bonding. Counter-reactants can include water, peroxides (e.g., hydrogen peroxide), di- or polyhydroxy alcohols, fluorinated di- or polyhydroxy alcohols, fluorinated glycols, and other sources of hydroxyl moieties. In various embodiments, a counter-reactant reacts with the organometallic precursor by forming oxygen bridges between neighboring metal atoms.

Other potential counter-reactants include hydrogen sulfide and hydrogen disulfide, which can crosslink metal atoms via sulfur bridges. In other instances, Te-containing precursors may be used counter-reactants with or instead of water to form Te—Sn—Te—Sn cross-links, for example. Suitable tellurium co-reactants for use with Sn(NMe$_2$)x type precursors are RTeH or RTeD (D=deuterium) and R$_2$Te precursors, with R=alkyl groups, particularly t-butyl or isopropyl, such as t-butylTeD. For use with M(OR)x type precursors, Bis(trimethylsilyl)Te may be used, for example.

The thin films may include optional materials in addition to an organometallic precursor and counter-reactants to modify the chemical or physical properties of the film, such as to modify the sensitivity of the film to EUV or enhancing etch resistance. Such optional materials may be introduced, such as by doping during vapor phase formation prior to deposition on the semiconductor substrate, after deposition of the thin film, or both. In some embodiments, a gentle remote $H_2$ plasma may be introduced so as to replace some Sn-L bonds with Sn—H, which can increase reactivity of the resist under EUV.

In various embodiments, the EUV-patternable films are made and deposited on the semiconductor substrate using vapor deposition equipment and processes among those known in the art. In such processes, the polymerized organometallic material is formed in vapor phase or in situ on the surface of the semiconductor substrate. Suitable processes include, for example, chemical vapor deposition (CVD), atomic layer deposition (ALD), and ALD with a CVD component, such as a discontinuous, ALD-like process in which metal precursors and counter-reactants are separated in either time or space.

In general, methods comprise mixing a vapor stream of an organometallic precursor with a vapor stream of a counter-reactant so as to form a polymerized organometallic material, and depositing the organometallic material onto the surface of the semiconductor substrate. In some embodiments, more than one organometallic precursor is included in the vapor stream. In some embodiments, more than one counter-reactant is included in the vapor stream. As will be understood by one of ordinary skill in the art, the mixing and depositing aspects of the process may be concurrent, in a substantially continuous process.

In an example continuous CVD process, two or more gas streams, in separate inlet paths, of organometallic precursor and source of counter-reactant are introduced to the deposition chamber of a CVD apparatus, where they mix and react in the gas phase, to form agglomerated polymeric materials (e.g., via metal-oxygen-metal bond formation). The streams may be introduced, for example, using separate injection inlets or a dual-plenum showerhead. The apparatus is configured so that the streams of organometallic precursor and counter-reactant are mixed in the chamber, allowing the organometallic precursor and counter-reactant to react to form a polymerized organometallic material. Without limiting the mechanism, function, or utility of present technology, it is believed that the product from such vapor-phase reaction becomes heavier in molecular weight as metal atoms are crosslinked by counter-reactants, and is then condensed or otherwise deposited onto the semiconductor substrate. In various embodiments, the steric hindrance of the bulky alkyl groups prevents the formation of densely packed network and produces smooth, amorphous, low-density films.

The CVD process is generally conducted at reduced pressures, such as from 10 milliTorr to 10 Torr. In some embodiments, the process is conducted at from 0.5 to 2 Torr. In some embodiments, the temperature of the semiconductor substrate is at or below the temperature of the reactant streams. For example, the substrate temperature may be from 0° C. to 250° C., or from ambient temperature (e.g., 23° C.) to 150° C. In various processes, deposition of the polymerized organometallic material on the substrate occurs at rates inversely proportional to surface temperature.

The thickness of the EUV-patternable film formed on the surface of the semiconductor substrate may vary according to the surface characteristics, materials used, and processing conditions. In various embodiments, the film thickness may range from 0.5 nm to 100 nm, and may be a sufficient thickness to absorb most of the EUV light under the conditions of EUV patterning. The EUV-patternable film may be able to accommodate absorption equal to or greater than 30%, thereby having significantly fewer EUV photons available towards the bottom of the EUV-patternable film. Higher EUV absorption leads to more cross-linking and densification near the top of an EUV-exposed film compared to the bottom of the EUV-exposed film. Though efficient utilization of EUV photons may occur with EUV-patternable films having higher overall absorption, it will be understood that in some instances, the EUV-patternable film may be less than about 30%. For comparison, the maximum overall absorption of most other resist films are less than 30% (e.g., 10% or less, or 5% or less) so that the resist material at the bottom of the resist film is sufficiently exposed. In some embodiments, the film thickness is from 5 nm to 40 nm or from 10 nm to 20 nm. Without limiting the mechanism, function, or utility of present disclosure, it is believed that, unlike wet, spin-coating processes of the art, the processes of the present disclosure have fewer restrictions on the surface adhesion properties of the substrate, and therefore can be applied to a wide variety of substrates. Moreover, as discussed above, the deposited films may closely conform to surface features, providing advantages in forming masks over substrates, such as substrates having underlying features, without "filling in" or otherwise planarizing such features.

In addition to depositing a metal-containing EUV resist thin film on a semiconductor substrate at block 102 of the process 100, metal-containing EUV resist material may be formed on internal surfaces of the process chamber. The internal surfaces may include chamber walls, floors, and ceilings of the process chamber. Other internal surfaces may include a showerhead, nozzles, and substrate support surfaces. The metal-containing EUV resist material may form as a result of dry deposition processes, such as CVD or ALD processes. A thickness of the metal-containing EUV resist material formed on the internal surfaces may increase over time as a result of additional processing (e.g., deposition) operations being performed in the process chamber. The metal-containing EUV resist material is prone to flake off, shed particles, or peel from the internal surfaces of the process chamber to contaminate subsequent semiconductor substrates during processing.

At block 150 of the process 100, a dry chamber clean operation of the present disclosure may be performed after deposition of the metal-containing EUV resist thin film on the semiconductor substrate at block 102 of the process 100. This allows for deposition and dry cleaning to be performed in the same process chamber. However, it will be understood that the dry chamber clean may be performed in a different process chamber than the deposition operation in embodiments. In fact, the dry chamber clean may be performed subsequent to a bevel and/or backside clean, bake, development, or etch operation.

The dry-deposited EUV photoresist films being removed are generally composed of Sn, O and C, but the same clean approaches can be extended to films of other metal oxide resists and materials. In addition, this approach can also be used for film strip and PR rework.

At block 104 of the process 100, an optional cleaning process is performed to clean a backside and/or bevel edge of the semiconductor substrate. The backside and/or bevel edge clean may non-selectively etch EUV resist film to equally remove film with various levels of oxidation or crosslinking on the substrate backside and bevel edge. During application of the EUV-patternable film, either by wet deposition processing or dry deposition processing, there may be some unintended deposition of resist material on the substrate bevel edge and/or backside. The unintended deposition may lead to undesirable particles later moving to a top surface of the semiconductor substrate and becoming particle defects. Moreover, this bevel edge and backside deposition can cause downstream processing problems, including contamination of the patterning (scanner) and development tools. Conventionally, removal of this bevel edge and backside deposition is done by wet cleaning techniques. For spin-coated photoresist material, this process is called edge bead removal (EBR) and is performed by directing a stream of solvent from above and below the bevel edge while the substrate is spinning. The same process can be applied to soluble organotin oxide-based resists deposited by vapor deposition techniques.

The substrate bevel edge and/or backside clean may also be a dry clean process. In some embodiments, the dry clean process involves a vapor and/or plasma having one or more of the following gases: HBr, HCl, $BCl_3$, $SOCl_2$, $Cl_2$, $BBr_3$, $H_2$, $O_2$, $PCl_3$, $CH_4$, methanol, ammonia, formic acid, $NF_3$, HF. In some embodiments, the dry clean process may use the same chemistries as a dry development process described herein. For example, the bevel edge and backside clean may use hydrogen halide development chemistry. For the backside and bevel edge clean process, the vapor and/or the plasma has to be limited to a specific region of the substrate to ensure that only the backside and the bevel are removed, without any film degradation on a frontside of the substrate.

Process conditions may be optimized for bevel edge and backside clean. In some embodiments, higher temperature, higher pressure, and/or higher reactant flow may lead to increased etch rate. Suitable process conditions for a dry bevel edge and backside clean may be: reactant flow of 100-500 sccm (e.g., 500 sccm HCl, HBr, or $H_2$ and $Cl_2$ or $Br_2$, $BCl_3$ or $H_2$), temperature of ~10 to 120° C. (e.g., 20° C.), pressure of 20-500 mTorr (e.g., 300 mTorr), plasma power of 0 to 500 W at high frequency (e.g., 13.56 MHz), and for a time of about 10 to 20 seconds, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

The dry cleaning operation may alternatively be extended to a full photoresist removal or photoresist "rework" in which an applied EUV photoresist is removed and the semiconductor substrate prepared for photoresist reapplication, such as when the original photoresist is damaged or otherwise defective. Photoresist rework should be accomplished without damaging the underlying semiconductor substrate, so an oxygen-based etch should be avoided. Instead, variants of halide-containing chemistries as described herein may be used. It will be understood that the photoresist rework operation may be applied at any stage during the process 100. Thus, the photoresist rework operation may be applied after photoresist deposition, after bevel edge and backside clean, after PAB treatment, after EUV exposure, after PEB treatment, or after development. In some embodiments, the photoresist rework may be performed for non-selective removal of exposed and unexposed regions of the photoresist but selective to an underlayer.

In some embodiments, the photoresist rework process involves a vapor and/or plasma having one or more of the following gases: HBr, HCl, $BCl_3$, $Cl_2$, $BBr_3$, $H_2$, $PCl_3$, $CH_4$, methanol, ammonia, formic acid, $NF_3$, HF. In some embodiments, the photoresist rework process may use the same chemistries as a dry development process described herein.

For example, the photoresist rework may use hydrogen halide development chemistry.

Process conditions may be optimized for the photoresist rework. In some embodiments, higher temperature, higher pressure, and/or higher reactant flow may lead to increased etch rate. Suitable process conditions for a photoresist rework may be: reactant flow of 100-500 sccm (e.g., 500 sccm HCl, HBr, $BCl_3$ or $H_2$ and $Cl_2$ or $Br_2$), temperature of −10 to 120° C. (e.g., 20° C.), pressure of 20-500 mTorr (e.g., 300 mTorr), plasma power of 300 to 800 W (e.g., 500 W) at high frequency (e.g., 13.56 MHz), wafer bias of 0 to 200 Vb (a higher bias may be used with harder underlying substrate materials) and for a time of about 20 seconds to 3 minutes, sufficient to completely remove the EUV photoresist, dependent on the photoresist film and composition and properties. It should be understood that while these conditions are suitable for some processing reactors, e.g., a Kiyo etch tool available from Lam Research Corporation, Fremont, CA, a wider range of process conditions may be used according to the capabilities of the processing reactor.

At block 150 of the process 100, a dry chamber clean operation of the present disclosure may be performed after a bevel edge and/or backside clean operation. This allows for bevel and/or backside clean and dry chamber clean to be performed in the same process chamber. However, it will be understood that the dry chamber clean may be performed in a different process chamber than the bevel edge and/or backside clean operation in some embodiments.

At block 106 of the process 100, an optional post-application bake (PAB) is performed after deposition of the EUV-patternable film and prior to EUV exposure. The PAB treatment may involve a combination of thermal treatment, chemical exposure, and moisture to increase the EUV sensitivity of the EUV-patternable film, reducing the EUV dose to develop a pattern in the EUV-patternable film. The PAB treatment temperature may be tuned and optimized for increasing the sensitivity of the EUV-patternable film. For example, the treatment temperature may be between about 90° C. and about 250° C. or between about 100° C. and about 200° C. In some embodiments, the PAB treatment may be conducted with a pressure between atmospheric and vacuum, and a treatment duration of about 1 to 15 minutes, for example about 2 minutes. In some embodiments, the PAB treatment is conducted at a temperature between about 100° C. to 200° C. for about 1 minute to 2 minutes.

At block 150 of the process 100, a dry chamber clean operation of the present disclosure may be performed after a PAB treatment. This allows for bake and dry chamber clean to be performed in the same process chamber. However, it will be understood that the dry chamber clean may be performed in a different process chamber than the PAB treatment operation in some embodiments.

At block 108 of the process 100, the metal-containing EUV resist film is exposed to EUV radiation to develop a pattern. Generally speaking, the EUV exposure causes a change in the chemical composition and cross-linking in the metal-containing EUV resist film, creating a contrast in etch selectivity that can be exploited for subsequent development.

The metal-containing EUV resist film may then be patterned by exposing a region of the film to EUV light, typically under relatively high vacuum. EUV devices and imaging methods among those useful herein include methods known in the art. In particular, as discussed above, exposed areas of the film are created through EUV patterning that have altered physical or chemical properties relative to unexposed areas. For example, in exposed areas, metal-carbon bond cleavage may occur, as through a beta-hydride elimination, leaving behind reactive and accessible metal hydride functionality that can be converted to hydroxide and cross-linked metal oxide moieties via metal-oxygen bridges during a subsequent post-exposure bake (PEB) step. This process can be used to create chemical contrast for development as a negative tone resist. In general, a greater number of beta-H in the alkyl group results in a more sensitive film. Following exposure, the metal-containing EUV resist film may be baked, so as to cause additional cross-linking of the metal oxide film. The difference in properties between exposed and unexposed areas may be exploited in subsequent processing, such as to dissolve unexposed areas or to deposit materials on the exposed areas. For example the pattern can be developed using a dry method to form a metal oxide-containing mask.

In particular, in various embodiments, the hydrocarbyl-terminated tin oxide present on the surface is converted to hydrogen-terminated tin oxide in the exposed region(s) of an imaging layer, particularly when the exposure is performed in a vacuum using EUV. However, removing exposed imaging layers from vacuum into air, or the controlled introduction of oxygen, ozone, $H_2O_2$, or water, can result in the oxidation of surface Sn—H into Sn—OH. The difference in properties between exposed and unexposed regions may be exploited in subsequent processing, such as by reacting the irradiated region, the unirradiated region, or both, with one or more reagents to selectively add material to or remove material from the imaging layer.

Without limiting the mechanism, function or utility of present technology, EUV exposure, for example, at doses of from 10 $mJ/cm^2$ to 100 $mJ/cm^2$ results in the cleavage of Sn—C bonds resulting in loss of alkyl substituent, alleviating steric hindrance and allowing the low-density film to collapse. In addition, reactive metal-H bond generated in the beta-hydride elimination reactions can react with neighboring active groups such as hydroxyls in the film, leading to further cross-linking and densification, and creating chemical contrast between exposed and unexposed region(s).

Following exposure of the metal-containing EUV resist film to EUV light, a photopatterned metal-containing EUV resist is provided. The photopatterned metal-containing EUV resist includes EUV-exposed and unexposed regions.

At block 110 of the process 100, an optional post-exposure bake (PEB) is performed to further increase contrast in etch selectivity of the photopatterned metal-containing EUV resist. The photopatterned metal-containing EUV resist can be thermally treated in the presence of various chemical species to facilitate cross-linking of the EUV-exposed regions of the photopatterned metal-containing EUV resist or simply baked on a hot plate in ambient air, for example, between 150° C. and 250° C. for between one and five minutes (e.g., 190° C. for two minutes).

In various embodiments, a bake strategy involves careful control of the bake ambient, introduction of reactive gases, and/or careful control of the ramping rate of the bake temperature. Examples of useful reactive gases include e.g., air, $H_2O$, $H_2O_2$ vapor, $CO_2$, CO, $O_2$, $O_3$, $CH_4$, $CH_3OH$, $N_2$, $H_2$, $NH_3$, $N_2O$, NO, alcohol, acetyl acetone, formic acid, Ar, He, or their mixtures. The PEB treatment is designed to (1) drive complete evaporation of organic fragments that are generated during EUV exposure and (2) oxidize any Sn—H, Sn—Sn, or Sn radical species generated by EUV exposure into metal hydroxide, and (3) facilitate cross-linking between neighboring Sn—OH groups to form a more densely cross-linked $SnO_2$-like network. The bake temperature is carefully selected to achieve optimal EUV lithographic performance. Too low a PEB temperature would lead to insufficient cross-linking, and consequently less chemical contrast for development at a given dose. Too high a PEB temperature would also have detrimental impacts, including severe oxidation and film shrinkage in the unexposed region (the region that is removed by development of the patterned film to form the mask in this example), as well as, undesired interdiffusion at the interface between the photopatterned metal-containing EUV resist and an underlayer, both of which can contribute to loss of chemical contrast and an increase in defect density due to insoluble scum. The PEB treatment temperature may be between about 100° C. and about 300° C., between about 170° C. and about 290° C., or between about 220° C. and about 250° C. In some embodiments, the PEB treatment may be conducted with pressure between atmospheric and vacuum, and a treatment duration of about 1 to 15 minutes, for example about 2 minutes. In some embodiments, PEB thermal treatment may be repeated to further increase etch selectivity.

At block 150 of the process 100, a dry chamber clean operation of the present disclosure may be performed after a PEB treatment. This allows for bake and dry chamber clean to be performed in the same process chamber. However, it will be understood that the dry chamber clean may be performed in a different process chamber than the PEB treatment operation in some embodiments.

At block 112 of the process 100, the photopatterned metal-containing resist is developed to form a resist mask. In various embodiments, the exposed regions are removed (positive tone) or the unexposed regions are removed (negative tone). In some embodiments, development may include selective deposition on either the exposed or unexposed regions of the photopatterned metal-containing resist, followed by an etching operation. In various embodiments, these processes may be dry processes or wet processes. Examples of processes for development involve an organotin oxide-containing EUV-sensitive photoresist thin film (e.g., 10-30 nm thick, such as 20 nm), subjected to a EUV exposure dose and post-exposure bake, and then developed. The photoresist film may be, for example, deposited based on a gas phase reaction of an organotin precursor such as isopropyl(tris)(dimethylamino)tin and water vapor, or may be a spin-on film comprising tin clusters in an organic matrix. The photopatterned metal-containing resist is developed by exposure to a development chemistry. In some embodiments, the development chemistry includes a halide-containing chemistry.

At block 150 of the process 100, a dry chamber clean operation of the present disclosure may be performed after development. This allows for development and dry chamber clean to be performed in the same process chamber. However, it will be understood that the dry chamber clean may be performed in a different process chamber than the development operation in some embodiments. Moreover, it will be understood that the dry chamber clean may be performed in the same or different process chamber than an etch operation in some embodiments. The etch operation may be applied to etch a substrate underlayer of the semiconductor substrate.

FIG. 2 presents a flow diagram of an example method of performing a dry chamber clean according to some embodiments. The dry chamber clean may be performed after deposition, bevel and/or backside clean, bake, development, or etch operation. In some embodiments, the dry chamber clean may be performed after deposition of photoresist material and in the same process chamber as deposition of photoresist material. Aspects of the process 200 may be described with reference to FIGS. 3A-3D. One or more operations of the process 200 may be performed using an apparatus described in any one of FIGS. 13-16. In some embodiments, the operations of the process 200 may be implemented, at least in part, according to software stored in one or more non-transitory computer readable media.

At block 202 of the process 200, a semiconductor substrate with a dry-deposited metal-containing resist film on a substrate layer of the semiconductor substrate is provided in a process chamber. The composition and deposition of such dry-deposited metal-containing resist films may be described, for example, in Application PCT/US19/31618, filed May 9, 2019, incorporated herein by reference for the disclosure of these methods and materials applicable to the present disclosure. Methods include those where polymerized organometallic materials are produced in the vapor phase and deposited on the semiconductor substrate. In particular, methods for making EUV-patternable thin films on a surface of the semiconductor substrate comprise: mixing a vapor stream of an organometallic precursor with a vapor stream of a counter-reactant so as to form a polymerized organometallic material; and depositing the organometallic polymer-like material onto the surface of the semiconductor substrate. In some embodiments, more than one organometallic precursor is included in the vapor stream. In some embodiments, more than one counter-reactant is included in the vapor stream. In some embodiments, the mixing and depositing operations are performed in a continuous CVD process, an ALD process, or ALD with a CVD component, such as a discontinuous, ALD-like process in which metal precursors and counter-reactants are separated in either time or space. In some embodiments, the dry-deposited metal-containing resist film is a metal oxide-containing EUV resist film. For example, an element in the metal-containing resist film is selected from a group consisting of tin, hafnium, tellurium, bismuth, indium, antimony, iodine, germanium, and combinations thereof. In some embodiments, the metal-containing resist film includes organo-metal oxides such as organotin oxides.

In some embodiments, the process chamber in which the semiconductor substrate is provided in may be a dry deposition chamber. In other embodiments, the process chamber in which the semiconductor substrate is provided in may be a bevel edge and/or backside clean chamber, PAB treatment chamber, PEB treatment chamber, development chamber, or etch chamber. Any of the foregoing process chambers may accumulate metal-containing resist material on internal surfaces over time. As more and more semiconductor substrates are processed in a process chamber, unintended metal-containing resist material may grow on the internal surfaces. Periodic cleaning is needed to remove the unintended deposits of metal-containing resist material. The cleaning is performed "in situ," where the dry chamber clean is performed in the same process chamber where unintended metal-containing resist material formed.

Figure 3A:
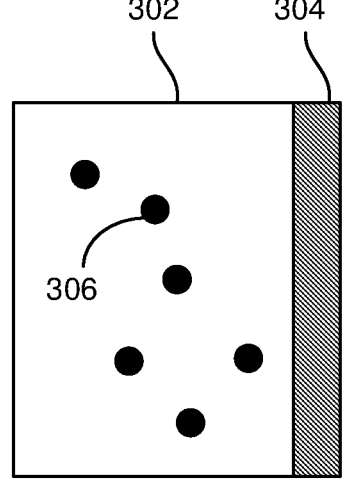
FIGS. 3A-3D show cross-sectional schematic illustrations of various processing stages of dry chamber clean according to some embodiments.

FIG. 3A shows a cross-sectional schematic illustration of a metal-containing EUV resist material 302 formed on chamber walls 304 of a process chamber. The metal-containing EUV resist material 302 may include particles or clusters of metal oxide 306. Particles or clusters of metal oxide 306 are generally difficult to remove. In some embodiments, the metal-containing EUV resist material 302 is formed by a vapor deposition method such as CVD or ALD. Over time, the metal-containing EUV resist material may accumulate in thickness on the chamber walls 304 of the process chamber. The metal-containing EUV resist material 302 may be an organotin oxide. The particles or clusters of metal oxide 306 may include tin oxide.

Returning to FIG. 2, at block 204 of the process 200, an etch gas is introduced into the process chamber, where a first thickness of dry-deposited metal-containing resist material is formed on one or more surfaces of the process chamber, and where the etch gas removes the first thickness of the dry-deposited metal-containing resist material. In some embodiments, the etch gas includes a halide-containing chemistry. In some embodiments, the etch gas includes a hydrogen halide, hydrogen and halogen gas, boron trichloride, or combinations thereof. For example, the etch gas may be HCl. In some embodiments, the etch gas may remove the dry-deposited metal-containing resist material without striking a plasma. In some embodiments, the etch gas may remove the dry-deposited metal-containing resist material by heating the process chamber to an elevated temperature. The first thickness of the dry-deposited metal-containing resist material may be equal to or greater than about 2 nm, equal to or greater than about 3 nm, equal to or greater than about 5 nm, or equal to or greater than about 10 nm. The first thickness may correspond to an average thickness of film material formed on the one or more surfaces of the process chamber.

Prior to introducing the etch gas, the process chamber may be prepared with desired conditions for dry chamber cleaning. Preparation of the process chamber may achieve certain pressure conditions, levels of loose particles or film impurities, moisture levels, temperature conditions, or protection of surfaces or components (e.g., substrate support) in the process chamber from the etch gas.

In some embodiments, preparing the process chamber may include purging and/or pumping the process chamber to remove unwanted particles in the process chamber. A vacuum line or purge line may be coupled to the process chamber. The vacuum line may include a vacuum pump system, which can include a one or two stage mechanical dry pump and/or turbomolecular pump. A purge gas may be flowed into the process chamber to facilitate removal of unwanted particles in the process chamber. Such unwanted particles may include particles or flakes from the metal-containing resist material. A vacuum pump system may reduce a chamber pressure and/or remove unwanted particles from the process chamber. The vacuum pump system may be configured to produce a vacuum pressure that is in the relatively low range (e.g., between about 6 Torr and atmosphere) or in the relatively high range (e.g., between about 1 mTorr and about 6 Torr). In some embodiments, preparing the process chamber may include a combination of pumping and purging operations.

A purge of the metal organic precursor may be useful to avoid undesired byproducts and ensure sufficient removal of the metal organic CVD precursor before dry cleaning. Sufficient pump/purging and/or water dosing may be performed before dry clean to encourage complete reaction. In some embodiments, chamber walls and other components may be heated to release unreacted precursor.

In some embodiments, preparing the process chamber may include increasing a temperature of one or more surfaces in the process chamber. The one or more surfaces in the process chamber may include at least chamber walls in the process chamber. The increased temperature may facilitate removal of moisture in the process chamber. Without being limited by any theory, the presence of water vapor slows down the reaction between the etch gas and the metal-containing resist material for removal of the metal-containing resist material. In addition, the increased temperature in the process chamber promotes a higher etch rate for removal of the metal-containing resist material. One or more heaters may be thermally coupled to the one or more surfaces of the process chamber to heat the one or more surfaces to an elevated temperature. In some embodiments, the elevated temperature may be between about 20° C. and about 140° C., between about 40° C. and about 120° C., or between about 80° C. and about 120° C.

In some embodiments, preparing the process chamber may include providing a dummy substrate on a substrate support in the process chamber. Thus, the semiconductor substrate having the dry-deposited metal-containing resist film may be transferred out of the process chamber prior to dry cleaning. That way, the semiconductor substrate provided earlier in the process chamber is not exposed to the etch gas when removing the first thickness of the dry-deposited metal-containing resist material. The dummy substrate may be provided on the substrate support to protect the substrate support (e.g., electrostatic chuck) from exposure to the etch gas during dry cleaning. Alternatively, protection of the substrate support may occur by providing a protective cover over the substrate support during dry cleaning.

The etch gas may be introduced through a showerhead or separate chamber inlet coupled to the process chamber. The etch gas may flow into the process chamber to react with the dry-deposited metal-containing resist material to form volatile products. Without being limited by any theory, an organo-metal-oxide resist material may have a tetrahedrally coordinated structure, and an etch gas with a halide-based chemistry (e.g., HBr or HCl) may protonate an oxygen lone pair to form a volatile byproduct such as R—Sn—Br. Water is a byproduct as well. The speed of the reaction may be increased by removal of water and increasing a temperature of the process chamber. After volatile products are formed, the process chamber may be pumped and purged to remove the volatile products. Additionally, the process chamber may be pumped and purged to remove residual etch gas. Such residual etch gas may cause undesired etching of subsequent semiconductor substrates.

The dry clean may be optimized for low etch selectivity or high etch rate of resist material deposited in the process chamber. That way, unwanted resist material may be quickly and efficiently removed. Low etch selectivity may be achieved for non-selective removal of photoresist material and metal oxide materials (e.g., tin oxide). Low etch selectivity may be achieved for non-selective removal of exposed EUV resist material and unexposed EUV resist material. In some embodiments, higher temperatures and/or higher pressures may result in lower etch selectivity of the etch gas. During exposure to the etch gas, the metal-containing resist material on the one or more surfaces may be subjected to an elevated temperature. The elevated temperature may be between about 20° C. and about 140° C., between about 40° C. and about 120° C., or between about 80° C. and about 120° C. During exposure to the etch gas, the pressure in the process chamber may be high. In some embodiments, a chamber pressure is between about 0.01 Torr and atmosphere, between about 0.1 Torr and 100 Torr, or between about 0.1 Torr and about 6 Torr. In some embodiments, the chamber pressure is cycled between high and low pressures during exposure to the etch gas. Etch gas flow rate may also be tuned to control etch selectivity. In some embodiments, an etch gas flow rate is between about 50 sccm and about 10000 sccm, between about 100 sccm and about 10000 sccm, or between about 100 sccm and about 2000 sccm.

The etch gas serves to remove resist material from interior chamber surfaces, where the etch rate may be modulated by adjusting a temperature of the one or more surfaces of the process chamber. The resist material can be removed with an etch rate of up to 1 nm/s. Higher temperatures and/or pressures may increase the etch rate. Although the resist material can be removed using vapors at various temperatures (e.g., HCl or HBr at a temperature greater than 10° C., or $BCl_3$ at a temperature greater than 80° C., for example), a plasma can be used to further accelerate or enhance the reactivity. Accordingly, in some embodiments, the etch gas can be activated by heating or by a remote plasma source. This may further accelerate etching or enhance reactivity.

In a non-plasma thermal process for dry clean, the etch gas may be a hydrogen halide, hydrogen gas and halogen gas, boron trichloride, or mixtures thereof. In some embodiments, the hydrogen halide includes HCl, HBr, or HI. For example, the hydrogen halide can be HCl. In some embodiments, the halogen gas is $Cl_2$, $Br_2$, or $I_2$. In some embodiments, the etch gas is flowed with or without inert/carrier gas such as He, Ne, Ar, Xe, or $N_2$. Though the first thickness of the metal-containing resist material is removed by an etch gas without striking a plasma, residual carbon, contaminants, or other remaining materials may be removed by exposure to plasma. In some embodiments, introduction of the etch gas may be followed by exposing the one or more surfaces to an oxidizing gas such as oxygen ($O_2$), ozone ($O_3$), carbon dioxide ($CO_2$), or carbon monoxide (CO). The one or more surfaces may be exposed to an radicals and/or ions of the oxidizing gas in a plasma.

In some embodiments, the dry clean may be a plasma-based dry clean. Thus, the dry clean may occur by a direct in situ plasma or remote plasma. The process chamber may be a plasma-generating chamber or coupled to a plasma-generating chamber remote from the process chamber. The plasma-generating chamber may be an inductively-coupled plasma (ICP) reactor, transformer-coupled plasma (TCP) reactor, or capacitively-coupled plasma (CCP) reactor, employing equipment and techniques among those known in the art. In a plasma-based dry clean, the metal-containing resist material in the process chamber is exposed to radicals of certain gases. The gases may be selected from a group consisting of: HBr, HCl, $BCl_3$, $SOCl_2$, $Cl_2$, $BBr_3$, $H_2$, $PCl_3$, $CH_4$, methanol, ammonia, formic acid, $NF_3$, HF, and HI. Non-halogen chemistries may be used in plasma-based dry cleans. Halogen-based chemistries may be used in non-plasma thermal dry cleans.

Due to the ability to clean the as-deposited films (non-exposed or non-crosslinked) thermally, without the need for use of plasma, the approach described herein can also clean the downstream and upstream components of tool, beyond the process chamber (e.g., the exhaust lines going from the process chamber to the vacuum pump). More generally, this dry clean method can be used to clean other parts and components contaminated having a similar composition of a metal that has volatile products with —Cl, —Br, —F, —H, —CH$_4$, and an oxide and/or R groups.

It is important to note that, in some embodiments, unexposed, non-crosslinked resist film can be cleaned and removed according to the approach described herein, without plasma. The exposed film has a much slower etch rate, and can use either elevated temperatures, pressures, or plasma for removal and cleaning.

In some embodiments, coatings that are compatible with halogen cleaning chemistry may be used on the chamber walls and other components exposed to the clean, such as PTFE, anodized aluminum, yttrium oxide ($Y_2O_3$), or organic polymer coatings. In some embodiments, the process chamber may include chamber parts temperature control coupled to the one or more surfaces (e.g., chamber walls) to control temperature. In some embodiments, the process chamber may include gas inlets other than the showerhead for delivery of the etch gas. The gas inlets may be positioned in regions of the process chamber with a higher concentration of the metal-containing resist material. Or, the gas inlets may be positioned in regions of the process chamber where etch gas is less likely to reach through delivery via a showerhead. In some embodiments, the gas inlets may be positioned below the substrate support, positioned in the walls of the process chamber, and/or positioned close to an exhaust of the process chamber. Multiple gas inlets may be used for delivery of the etch gas into the process chamber. This can ensure the dry clean of the entire process chamber.

For prevention of corrosion of chamber components, the etch gas may be separated from the deposition gases/precursors. In various embodiments, the etch gas is delivered into the process chamber through one or more gas inlets separate from the showerhead, and deposition gases may be delivered into the process chamber through the showerhead. In some embodiments, the showerhead may supply separate gases by keeping the gases largely segregated within the showerhead. The showerhead may include multiple plenum volumes. Multiple exhaust lines may be used to ensure separation of gases downstream from the process chamber. A switch may be operably coupled to the multiple exhaust lines so as to permit separation of etch gas chemistry from deposition gases/precursors. For example, hydrogen halide chemistry may be separated from organotin precursors and water vapor. Halides may be exhausted through a first exhaust line during a pumping/purging operation, and deposition precursors and water vapor may be exhausted through a second exhaust line during a pumping/purging operation.

To protect the showerhead, a pressure differential may be used to prevent the etch gas from entering the showerhead (e.g., backflow). In some embodiments, the etch gas may clean internal surfaces of the showerhead by flowing the etch gas through the showerhead. However, residual halides or moisture may be retained inside channels of the showerhead. In some embodiments, the showerhead may be made out of a transparent material and heated with a suitable light source. For example, an irradiation source tuned to the appropriate wavelength (e.g., IR or blue wavelength) can directly heat the residual halides and/or moisture to remove the residual halides and/or moisture. Alternatively, the residual halides and/or moisture may be removed by gas purging.

In some embodiments, periodic dry cleaning may occur upon detection. A detection source may trigger chamber clean and/or endpoint of clean. The detection source may be a sensor installed in the process chamber, such as a color-based sensor, intensity-based sensor, vision-based camera/sensor, or combination thereof. The sensor may trigger dry chamber clean by monitoring particle count or uniformity, wafer count, or thickness count. Alternatively, the sensor may trigger dry chamber clean by an in situ measurement device for chamber wall deposition. For example, the sensor may detect the presence of photoresist material using infrared (IR) measurements. After a certain amount of photoresist material is formed or a threshold particle, uniformity, wafer, or thickness count is reached, the dry chamber clean may be triggered. In some embodiments, the sensor may be installed downstream in a foreline. Such a sensor may detect what gases/byproducts are being exhausted. When volatile byproducts are no longer detected in the foreline, the dry chamber clean may be terminated.

Figure 3B:
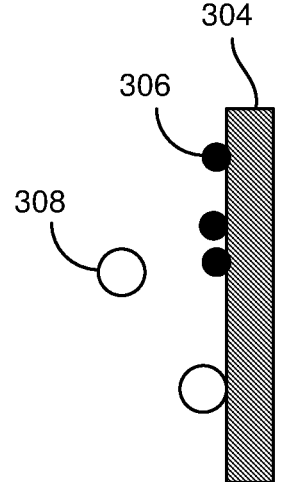

FIG. 3B shows a cross-sectional schematic illustration of the chamber walls 304 after an etch gas removes the metal-containing EUV resist material 302 from the chamber walls 304. The etch gas may be a hydrogen halide, hydrogen gas and halogen gas, or boron trichloride. The chamber walls 304 may be heated to an elevated temperature to promote low etch selectivity. The process chamber may be increased to a high pressure to promote low etch selectivity. Removal of the metal-containing EUV resist material 302 may occur without using plasma. Residual particles or clusters of metal oxide 306 may remain on the chamber walls 304 after exposure to the etch gas. In addition, residual etch gas 308 may remain in the process chamber.

Figure 4:
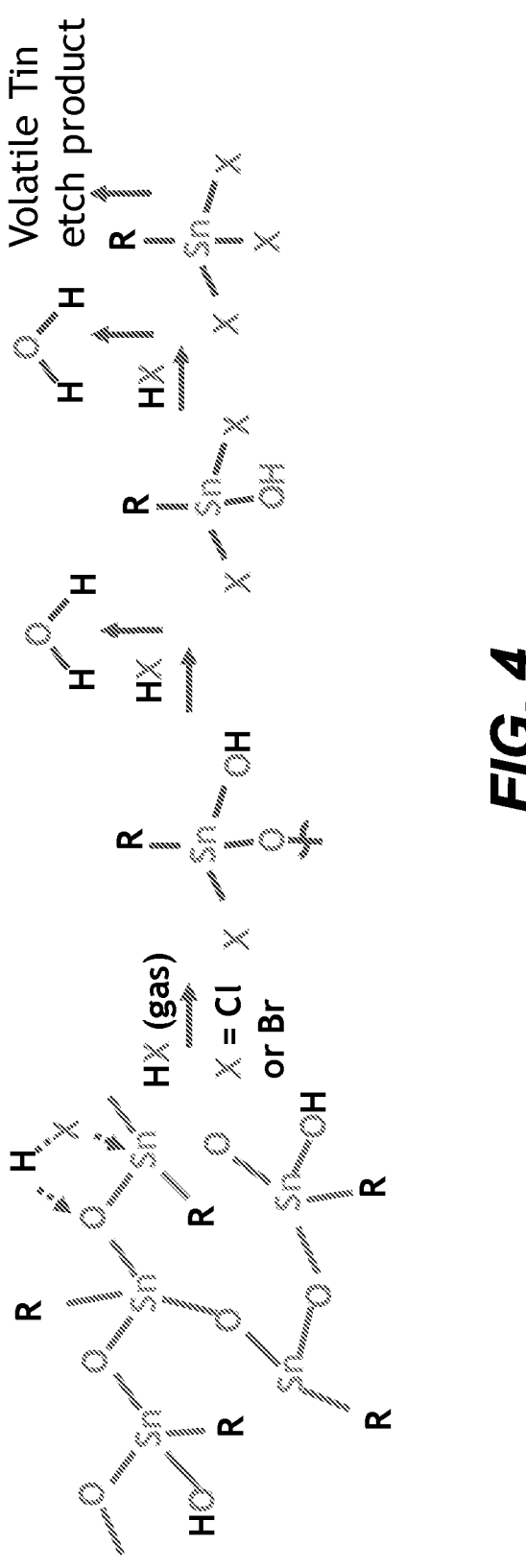
FIG. 4 illustrates an example dry chamber clean mechanism for chemical reactions of hydrogen chloride or hydrogen bromide with organotin oxide/hydroxide resist materials coated on internal surfaces of a process chamber according to some embodiments.

FIG. 4 illustrates an example dry chamber clean mechanism for chemical reactions of hydrogen chloride or hydrogen bromide with organotin oxide/hydroxide resist materials coated on internal surfaces of a process chamber according to some embodiments. Hydrogen halide (HCl or HBr) reacts with an EUV resist such as an organotin oxide/hydroxide resist material coating internal chamber surfaces and downstream components. The hydrogen halide cleaves Sn—OH bonds and Sn—O—Sn bonds to generate $H_2O$ and volatile organotin halide and tin halide products, which can be subsequently pumped away.

Returning to FIG. 2, at block 206 of the process 200, the process chamber is optionally purged to remove residual etch gas from the process chamber. The purge operation may involve flowing a purge gas into the process chamber or a combination of flowing a purge gas and pumping the process chamber to a desired chamber pressure. The purge gas may be an inert gas and/or a reactive gas. The reactive gas may react with residual etch gas to facilitate ease of removal. The reactive gas may be, for example, a tin-based precursor such as an organotin precursor. The inert gas may be Ar, He, Xe, or $N_2$. The chamber pressure may be between about 0.1 Torr and about 6 Torr.

The residual etch gas may be exhausted from the process chamber. In some embodiments, the purge operation may also be referred to as dehalogenation. Halides may readily stick to chamber walls, chamber components, or wafers. If the halides stick to the wafer, there is an increased risk of the halides (e.g., bromine) being released from the wafer during EUV scanning, thereby corroding or damaging the scanner. Furthermore, if halides stick to the chamber walls or chamber components, the halides may readily form organic salts with subsequent precursors during dry deposition operations. Purging the residual etch gas may exhaust through a separate exhaust line than the deposition precursors and counter-reactant (e.g., water vapor).

In some embodiments, the purge operation may proceed at a high temperature. The high temperature may facilitate removal of halides from the process chamber. In one example, one or more heaters coupled to the one or more surfaces of the process chamber may heat the process chamber to the high temperature. In another example, one or more IR sources or LEDs may be installed in the process chamber to heat the process chamber to the high temperature. The high temperature may be between about 20° C. and about 140° C. or between about 80° C. and about 120° C.

A variety of direct or remote plasma-based treatments are useful to accelerate the removal of residual etch gas (e.g., Cl-containing chemistry or Br-containing chemistry), where the residual etch gas may cover internal surfaces of the process chamber following removal of metal-containing resist material. Such treatments may be used individually or in combination to recover the internal surfaces of the process chamber. The internal surfaces of the process chamber may be, for example, aluminum oxide-based ceramics, anodized aluminum, and stainless steel hardware components (generally downstream). Recovery of the internal surfaces may suggest being free or substantially free of residual etch gas (e.g., free of Cl and/or Br). In one approach, a remote plasma-based treatment is a remote $NF_3$ plasma process, since both F radicals and $F_2$ gas are generated and may be effective in converting residual halide-containing chemistries to volatile halogens. The volatile halogens are then pumped away, leaving behind passivated surfaces such as Al—F passivated surfaces. Reactive gases used in the remote plasma process may include but are not limited to $NF_3$, $SF_6$, $CF_4$, or $ClF_3$. In another approach that may be considered less aggressive but also effective is an oxygen-based plasma process. For example, the oxygen-based plasma process may target the oxidation of bromide surface residues to form volatile bromine gas ($Br_2$). Oxygen-based reactants may include but are not limited to $O_2$, $O_3$, a mixture of $H_2$ and $O_2$, and $N_2O$. For example, after a fluorine-based clean, an $H_2/O_2$ plasma at low pressure of $N_2O$ plasma may be utilized for recovery of internal surfaces. In some embodiments, it may be advantageous to cycle between a fluorine-based plasma process and an oxygen-based plasma process or utilize a mixture of a fluorine-based chemistry and oxygen-based chemistry. In some embodiments, it may be advantageous to interrupt a sequence with a hydrogen-containing plasma process (e.g., H plasma), which can target the formation of volatile hydrogen halide (e.g., HBr, HCl) based byproducts. This can also leave behind passivated surfaces. In some embodiments, a plasma-based treatment or a sequence of plasma-based treatments may be terminated with an oxygen-based plasma conditioning step. In an oxygen-based plasma conditioning step, the internal surfaces may be exposed to an oxygen-based plasma to form a metal oxide (e.g., aluminum oxide) passivation layer for recovery. As described below, the recovered internal surfaces may be subsequently covered/seasoned with photoresist film (to avoid undesirable first wafer effects) before re-initiating deposition operations on semiconductor substrates.

In other embodiments, a non-plasma treatment may be useful to accelerate removal of residual etch gas (e.g., Cl-containing chemistry or Br-containing chemistry), where the residual etch gas may cover internal surfaces of the process chamber following removal of metal-containing resist material. Oxidizing gas may be introduced to oxidize residual halides such as Cl or Br on internal chamber surfaces. Thus, the non-plasma treatment may include delivering a flow of ozone gas ($O_3$) and/or oxygen gas ($O_2$). For instance, the non-plasma treatment may include delivering a flow of ozone gas and oxygen gas (e.g., 0.1%-30% ozone in oxygen). The non-plasma treatment can have the additional benefit of oxidizing and removing any remaining organic material such as carbon-containing and hydrogen-containing residues remaining on internal surfaces.

Figure 3C:
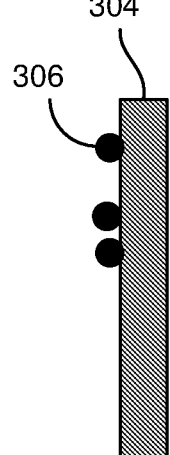

FIG. 3C shows a cross-sectional schematic illustration of the chamber walls 304 after dehalogenation to remove residual etch gas 308 from the process chamber. Pumping/purging operations may be performed to exhaust the residual etch gas 308 from the process chamber. In some embodiments, the chamber walls 304 or other components of the process chamber may be heated to promote release of the residual etch gas 308. In some embodiments, direct or remote plasma-based treatments may be applied to remove the residual etch gas 308, where such plasma-based treatments may include a fluorine-based plasma process, oxygen-based plasma process, or combinations thereof. Particles or clusters of metal oxide 306 may remain on the chamber walls 304.

Returning to FIG. 2, at block 208 of the process 200, the one or more surfaces of the process chamber are optionally conditioned by forming a second thickness of the dry-deposited metal-containing resist material on the one or more surfaces of the process chamber. The second thickness is less than the first thickness of the dry-deposited metal-containing resist material. In some embodiments, the second thickness is equal to or greater than about 1 nm, equal to or greater than about 2 nm, equal to or greater than about 3 nm, or between about 1 nm and about 5 nm. Alternatively, the one or more surfaces of the process chamber are optionally conditioned by forming a protective film different than the dry-deposited metal-containing resist material. Such a protective film may be a variation of $SnO_xC_y$. After exposure to the etch gas, the one or more surfaces are left exposed. Exposed surfaces in the process chamber may be vulnerable to attack especially by halogen-based species. The conditioning operation may provide protection of the one or more surfaces. Additionally, the conditioning operation may cover residual particles or clusters of metal oxide stuck on the one or more surfaces. That way, the particles or clusters of metal oxide are less likely to contaminate wafers during subsequent processing.

Conditioning the one or more surfaces of the process chamber may occur by a vapor-based deposition technique such as a CVD or ALD technique. Organometallic materials are produced in the vapor phase and deposited on the one or more surfaces of the process chamber. The organometallic materials may be, for example, deposited based on a gas phase reaction of an organotin precursor such as isopropyl (tris)(dimethylamino)tin and water vapor. The flow of water vapor may be relatively low. During conditioning, the substrate support may be protected or covered by a dummy wafer or other protective covering. The second thickness of the metal-containing resist material may be formed on chamber walls, floors, and ceilings. In addition, the second thickness of the metal-containing resist material may be formed on chamber components such as gas inlets, showerheads, and exhaust lines. After deposition of the second thickness of the metal-containing resist material, pumping/purging operations may follow to remove excess precursor and/or counter-reactant. Conditioning the one or more surfaces of the process chamber can trap residual particles of metal oxide and limit particle contamination.

Figure 3D:
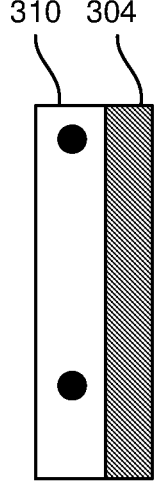

FIG. 3D shows a cross-sectional schematic illustration of a metal-containing resist material 310 formed on the chamber walls 304 of the process chamber. The metal-containing EUV resist material 310 may be re-deposited in a conditioning operation to protect the chamber walls 304 and trap the particles or clusters of metal oxide 306 from contaminating wafers during processing. This may also be referred to as chamber seasoning. The metal-containing EUV resist material 310 is formed by a vapor deposition method such as CVD or ALD. In some embodiments, the metal-containing EUV resist material 310 may be an organotin oxide. By conditioning/seasoning the chamber walls 304 and other internal surfaces of the process chamber, undesirable first wafer effects are mitigated when re-initiating deposition operations on semiconductor substrates.

While this disclosure frequently refers to the cleaning of EUV-sensitive films that have been exposed and/or developed, the cleaning processes described can be extended to EUV films of similar composition (e.g., other $MO_xR_y$-based films), for example, other films containing a metal oxide, in which the metal can form volatile products with —Cl, —Br, —F, —H, —CH₄, etc., as described herein, including unexposed EUV resist films. Additionally, in some embodiments, films other than EUV resists can be cleaned by this method, for example hard masks, UV resists or films of similar composition having other applications; in this respect, the described cleaning process relates to the film's chemical composition, as opposed to its function.

Also, in some embodiments, cleaning in accordance with this disclosure may be conducted by combining a thermal process to remove the majority of the contamination residue, followed by a plasma process to remove any additional residue. This is potentially applicable in all applications, including chamber clean, backside, bevel, strip, and rework. In some embodiments, this approach may be particularly advantageously applied to chamber clean, where the plasma can provide enhanced control of the surface clean for thoroughness. Downstream, where the clean may be mainly for preventing blockage, the clean quality may not be as important, and it may be acceptable if some residue remains following the clean.

Figure 5:
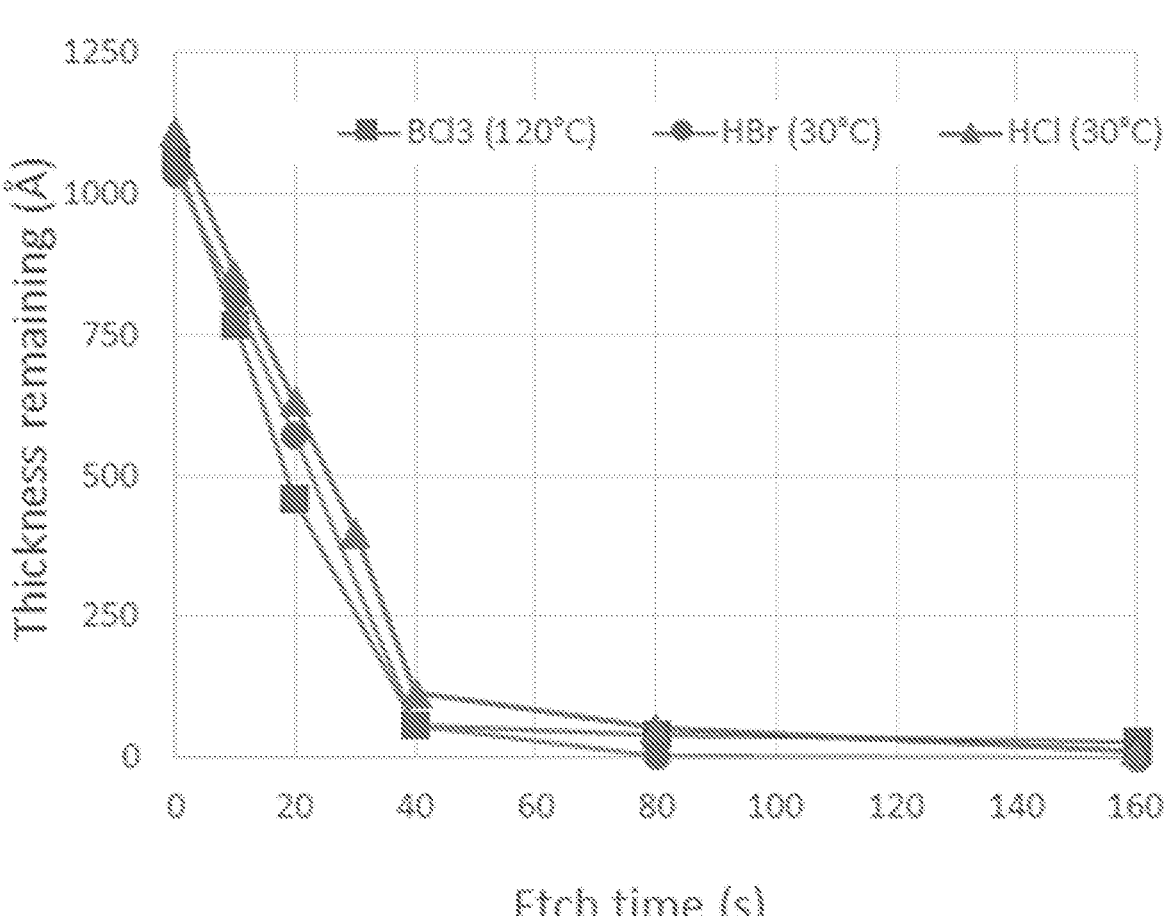
FIG. 5 shows a graph comparing HCl, HBr, and BCl₃ in etching metal-containing EUV resist versus time in a cleaning operation.

FIG. 5 shows a graph comparing HCl, HBr, and BCl₃ in etching metal-containing EUV resist versus time in a cleaning operation. As shown in FIG. 5, the target metal-containing EUV resist material can be thermally removed by each of HCl, HBr, and BCl₃ at elevated temperatures, and the etch rates are fast.

Figure 6:
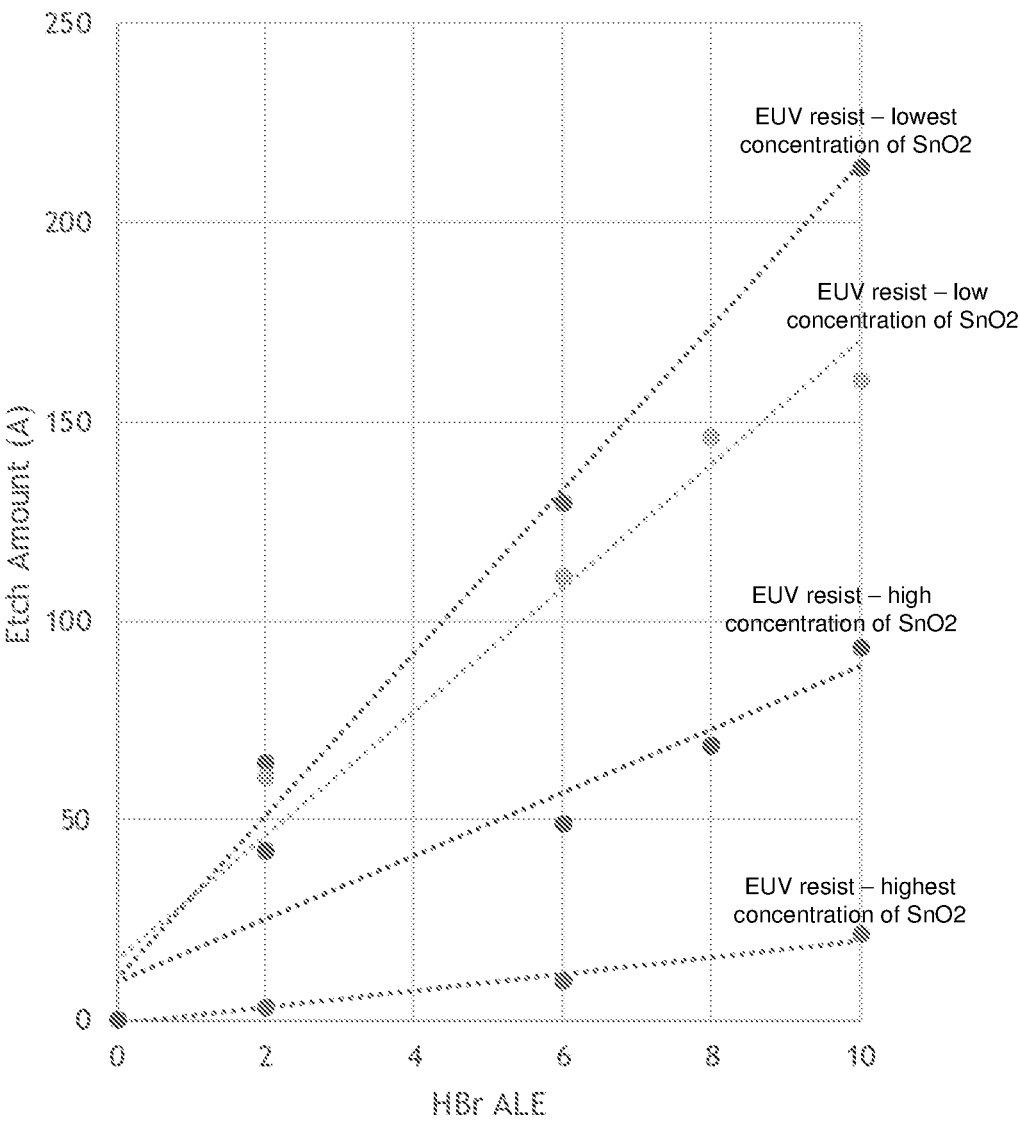
FIG. 6 shows a graph comparing etch rates for different metal-containing EUV resist materials when using HBr as an etch gas.

FIG. 6 shows a graph comparing etch rates for different metal-containing EUV resist materials when using HBr as an etch gas. Each of the lines represent different concentrations of tin oxide in the metal-containing EUV resist. Each of the materials have slightly different etch rates, but each of the materials can be etched quickly using HBr as an etch gas. The higher the concentration of tin oxide, the slower the etch rate.

Figure 7:
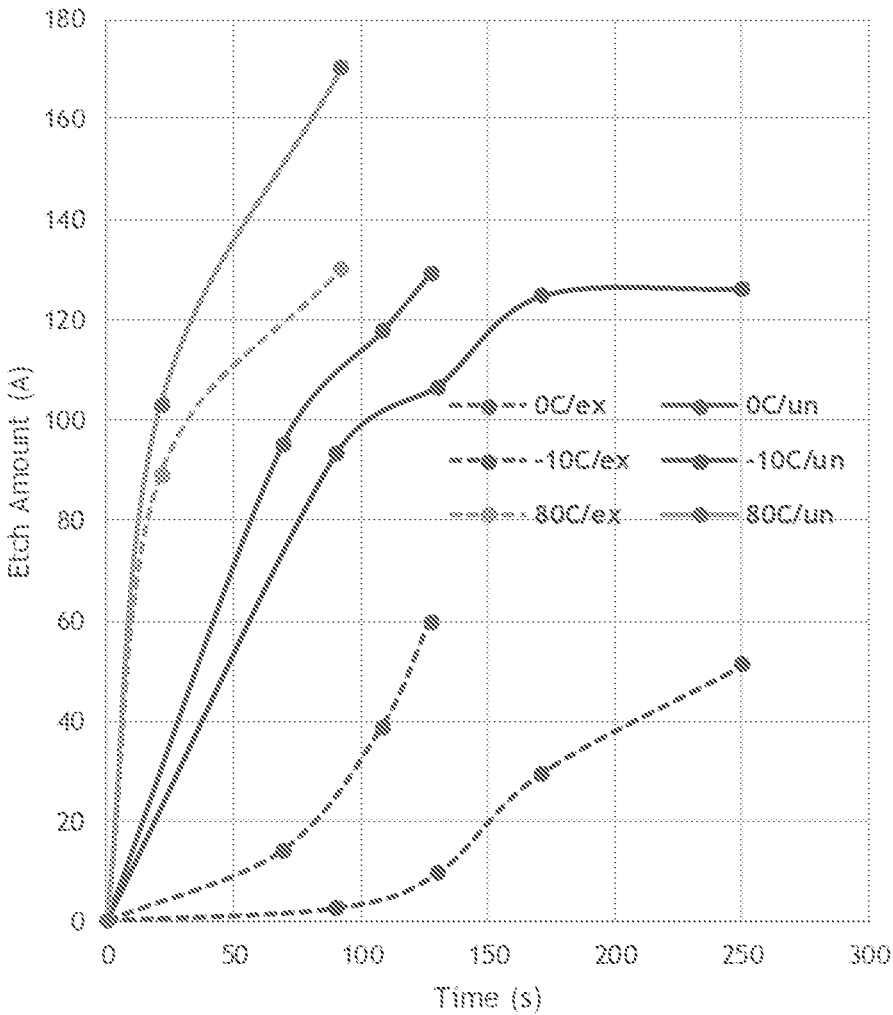
FIG. 7 shows a graph illustrating the effects of temperature on etch selectivity for removal of exposed and unexposed regions of photopatterned metal-containing EUV resist.
Figure 8A:
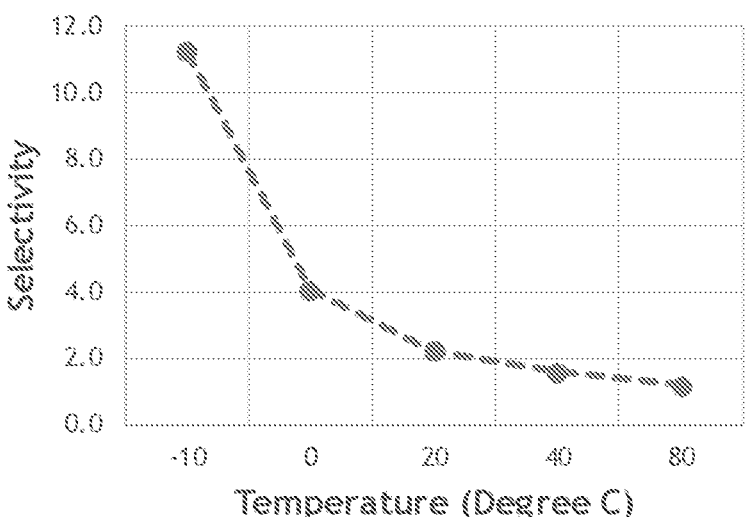
FIG. 8A shows a graph illustrating the effects of temperature on selectivity for removal of EUV resist.
Figure 8B:
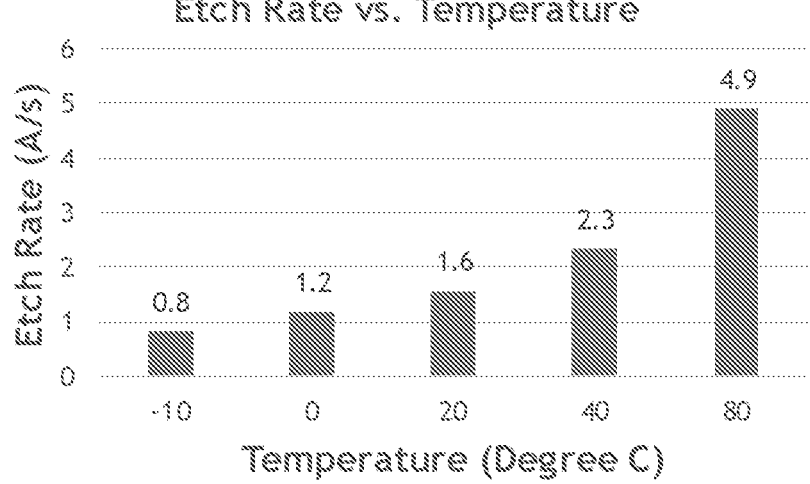
FIG. 8B shows a bar graph illustrating the effects of temperature on etch rate for removal of EUV resist.

FIG. 7 shows a graph illustrating the effects of temperature on etch selectivity for removal of exposed and unexposed regions of photopatterned metal-containing EUV resist. Dashed lines correspond to exposed regions of metal-containing EUV resist, and solid lines correspond to unexposed regions of metal-containing EUV resist. At low temperatures of 0° C. or 10° C., low etch rates were observed for both exposed and unexposed regions of the metal-containing EUV resist. However, at a high temperature of 80° C., high etch rates were observed for both exposed and unexposed regions of the metal-containing EUV resist. Thus, high etch selectivity occurs with lower temperatures, and lower etch selectivity occurs with higher temperatures. FIG. 8A shows a graph illustrating the effects of temperature on selectivity for removal of EUV resist. As shown in FIG. 8A, etch selectivity decreases in a nonlinear manner with increasing temperature. FIG. 8B shows a bar graph illustrating the effects of temperature on etch rate for removal of EUV resist. As shown in FIG. 8B, the etch rate increases with increasing temperature.

Figure 9:
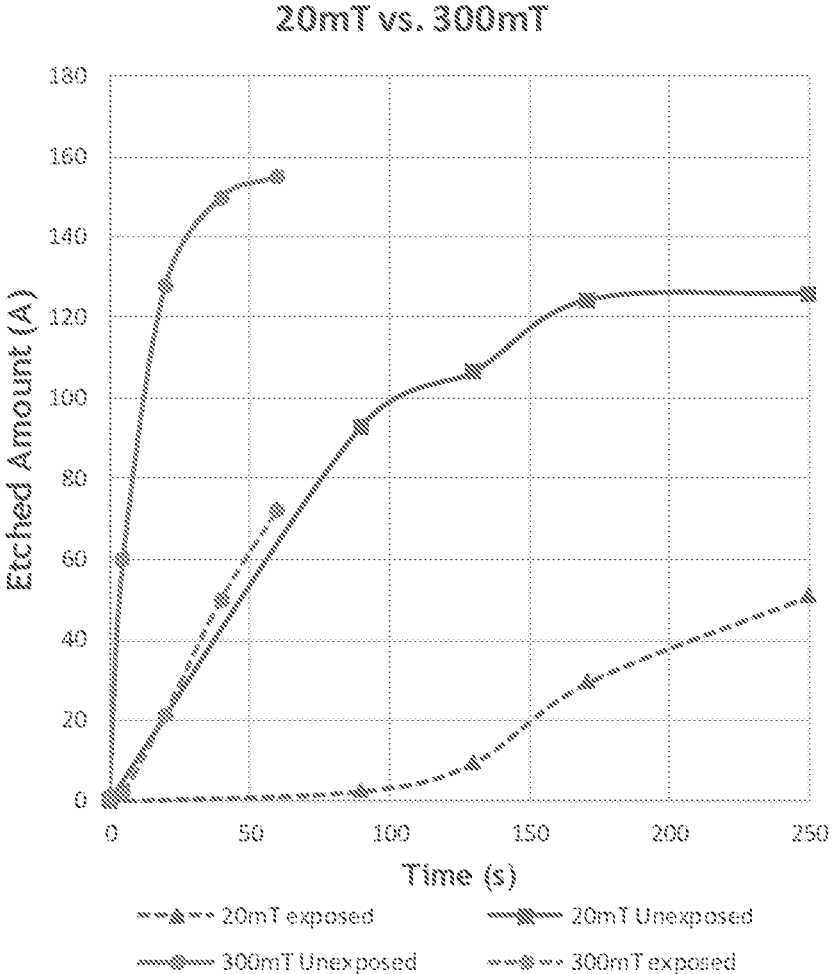
FIG. 9 shows a graph illustrating the effects of pressure on etch selectivity for removal of exposed and unexposed regions of photopatterned metal-containing EUV resist.
Figure 10A:
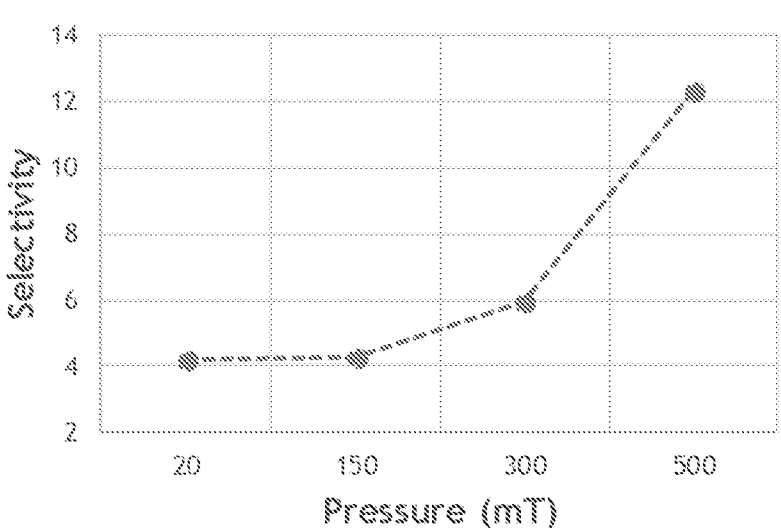
FIG. 10A shows a graph illustrating the effects of pressure on selectivity for removal of EUV resist.
Figure 10B:
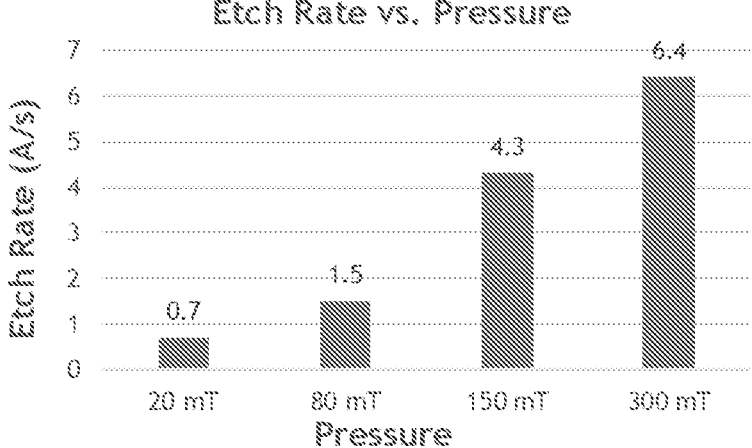
FIG. 10B shows a bar graph illustrating the effects of pressure on etch rate for removal of EUV resist.

FIG. 9 shows a graph illustrating the effects of pressure on etch selectivity for removal of exposed and unexposed regions of photopatterned metal-containing EUV resist. Dashed lines correspond to exposed regions of metal-containing EUV resist, and solid lines correspond to unexposed regions of metal-containing EUV resist. At a low pressure of 20 mTorr, low etch rates were observed for exposed regions of the metal-containing EUV resist while moderately high etch rates were observed for unexposed regions of the metal-containing EUV resist. However, at a higher pressure of 300 mTorr, high etch rates were observed for both exposed and unexposed regions of the metal-containing EUV resist. High etch selectivity is seen with higher pressure, and high etch rates are seen with higher pressure. FIG. 10A shows a graph illustrating the effects of pressure on selectivity for removal of EUV resist. In FIG. 10A, etch selectivity increases with increasing pressure. FIG. 10B shows a bar graph illustrating the effects of pressure on etch rate for removal of EUV resist. In FIG. 10B, the etch rate increases with increasing pressure.

Figure 11D:
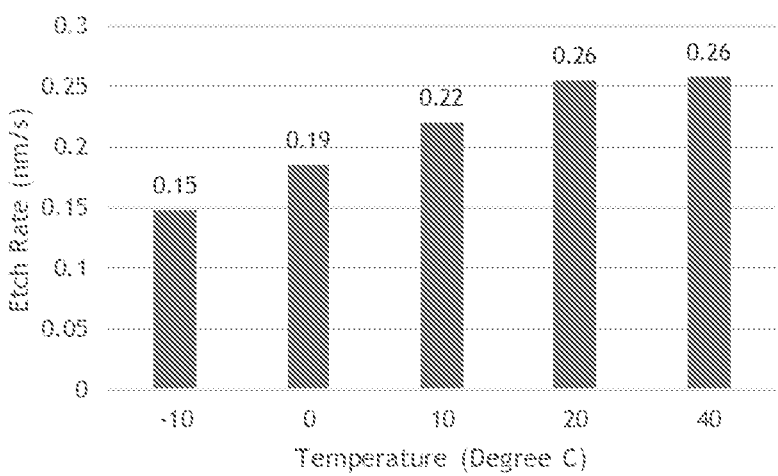
Figure 11E:
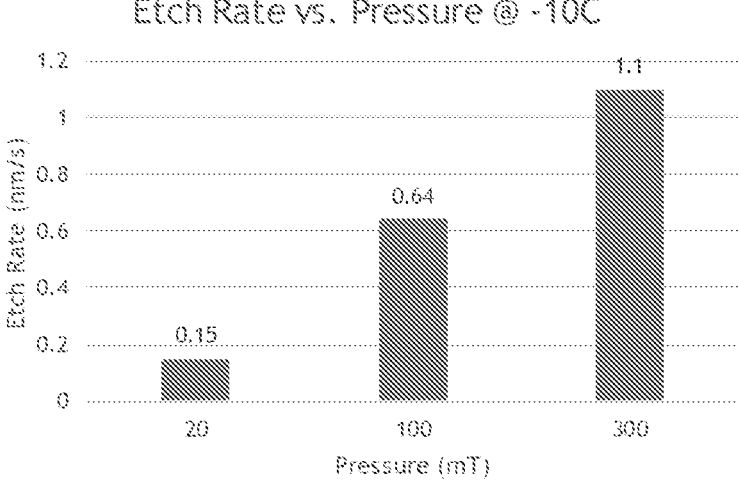

FIGS. 11A-11E show graphs illustrating the performance of HCl as an etch gas for different pressures and temperatures. FIG. 11A shows a graph illustrating etch amount of EUV resist material over time using HCl as an etch gas at various temperatures of −10° C., 20° C., and 40° C. at a fixed pressure of 20 mTorr. FIG. 11B shows a graph illustrating etch amount of EUV resist material over time using HCl as an etch gas at various temperatures of −10° C. and 20° C. at a fixed pressure of 100 mTorr. FIG. 11C shows a graph of etch amount of EUV resist material over time comparing HCl and HBr. FIG. 11D shows a bar graph illustrating etch rates of EUV resist material using HCl as an etch gas at different temperatures. FIG. 11E shows a bar graph illustrating etch rates of EUV resist material using HCl as an etch gas at different pressures.

Figure 12:
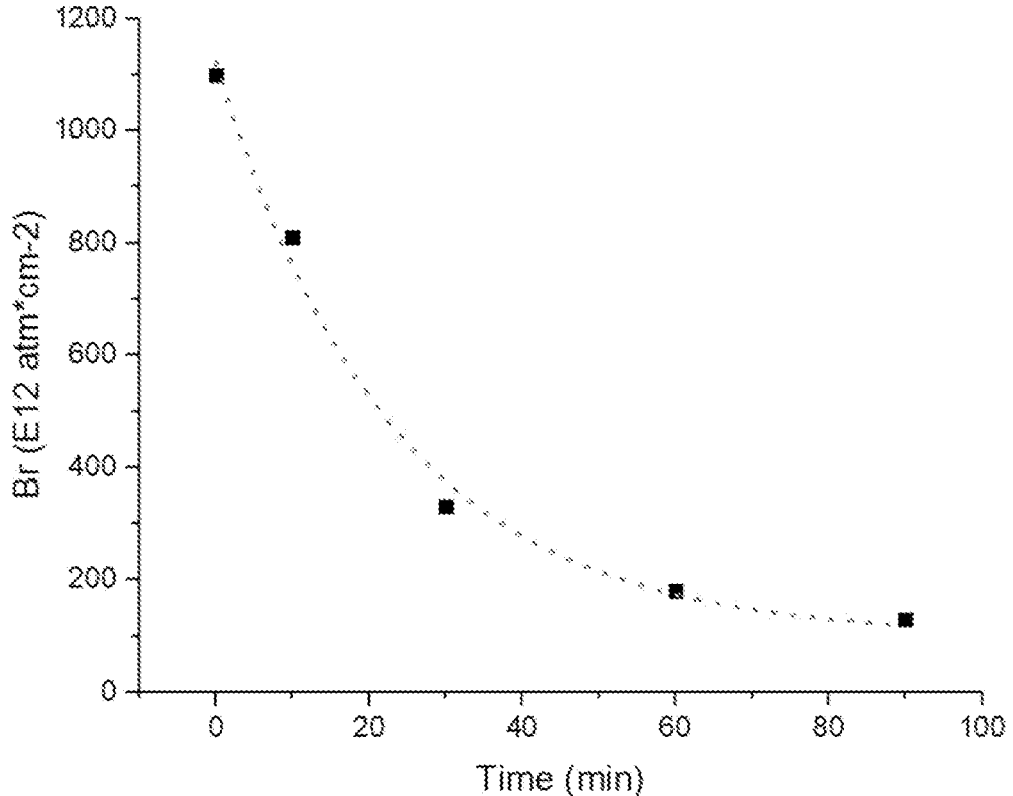
FIG. 12 shows a graph illustrating an amount of bromine over time in a process chamber when purging.

FIG. 12 shows a graph illustrating an amount of bromine over time in a process chamber when purging. As shown in FIG. 12, purging is able to reduce HBr on chamber walls over time. The purge gas is Ar and the chamber wall is heated to 60° C. After 60 minutes, the amount of HBr in the process chamber is less than $200 \times 10^{12}$ atoms/cm².

Apparatus

An apparatus of the present disclosure is configured for performing an in situ dry chamber clean. The apparatus may be configured to perform other processing operations such as deposition, bevel and backside cleaning, post-application baking, post-exposure baking, photoresist reworking, descum, smoothing, curing, etching, and other operations. In some embodiments, the apparatus is configured to perform all dry operations. For instance, the apparatus is configured to perform dry deposition of EUV resist in a process chamber as well as dry clean of EUV resist formed on internal surfaces of the process chamber. This enhances throughput and reduces the likelihood of contamination by exposing a substrate to vacuum breaks between wet and dry operations.

The apparatus configured for dry chamber clean includes a process chamber with a substrate support. The apparatus may include one or more vacuum lines coupled to the process chamber for pressure control and one or more etch gas lines coupled to the process chamber for delivery of etch gas. In some embodiments, there may be multiple vacuum lines for separating etch gas chemistries from deposition precursors and counter-reactants. In some embodiments, there may be multiple gas inlets positioned within the process chamber to flow etch gas near regions where unintended EUV resist material tend to form. In some embodiments, the etch gas includes a halide-containing chemistry such as a hydrogen halide (e.g., HBr or HCl). The apparatus may include one or more heaters for temperature control. Such heaters may be provided in the process chamber and/or in the substrate support. In some embodiments, the one or more heaters may include an IR source. The apparatus may further include one or more sensors for sensing particle count, wafer count, thickness count, or other parameters for triggering the dry chamber clean and/or endpoint of the dry chamber clean.

Figure 13:
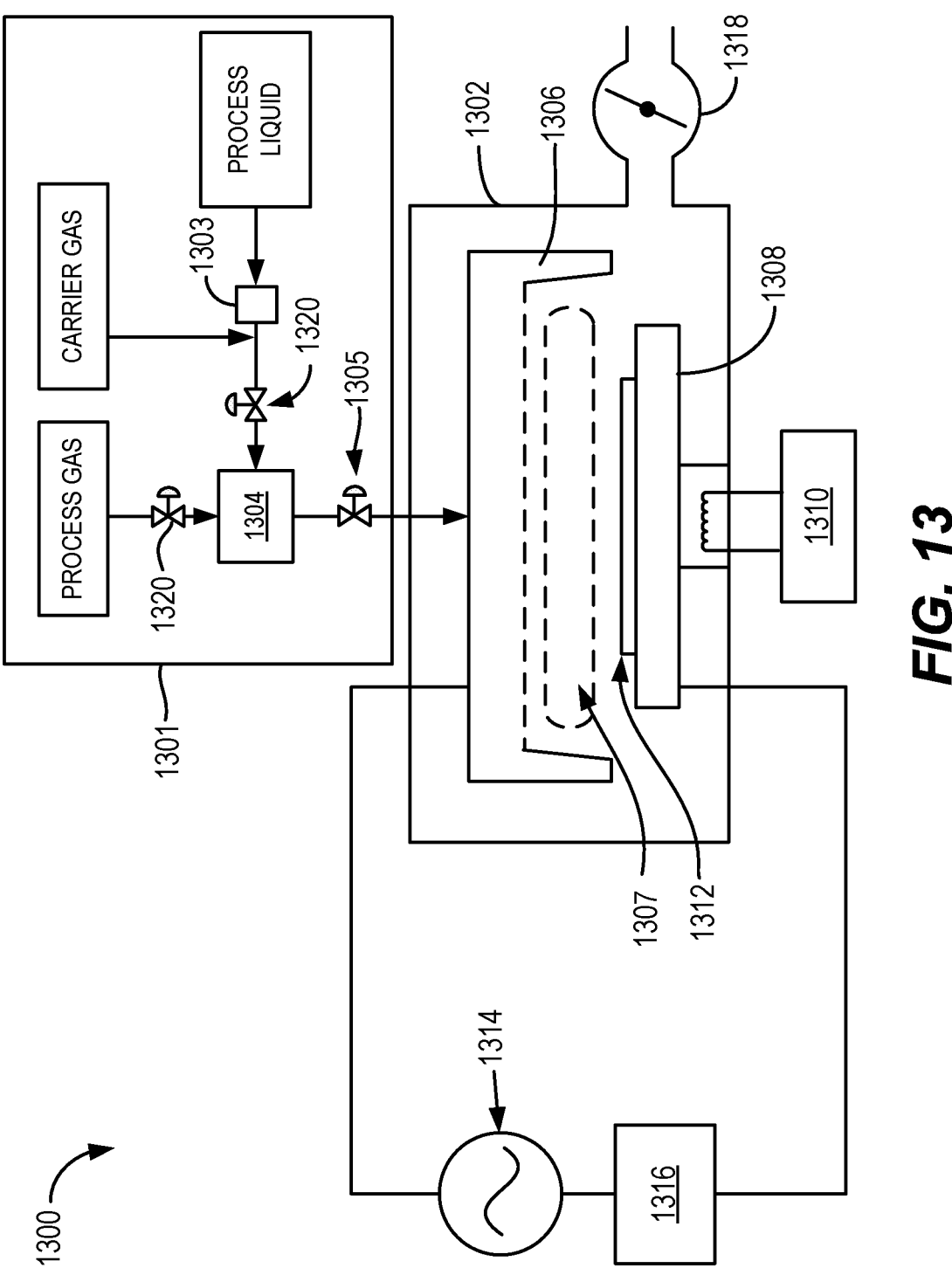
FIG. 13 depicts a schematic illustration of an example process station for maintaining a low-pressure environment that is suitable for performing dry chamber clean according to some embodiments.
Figure 14:
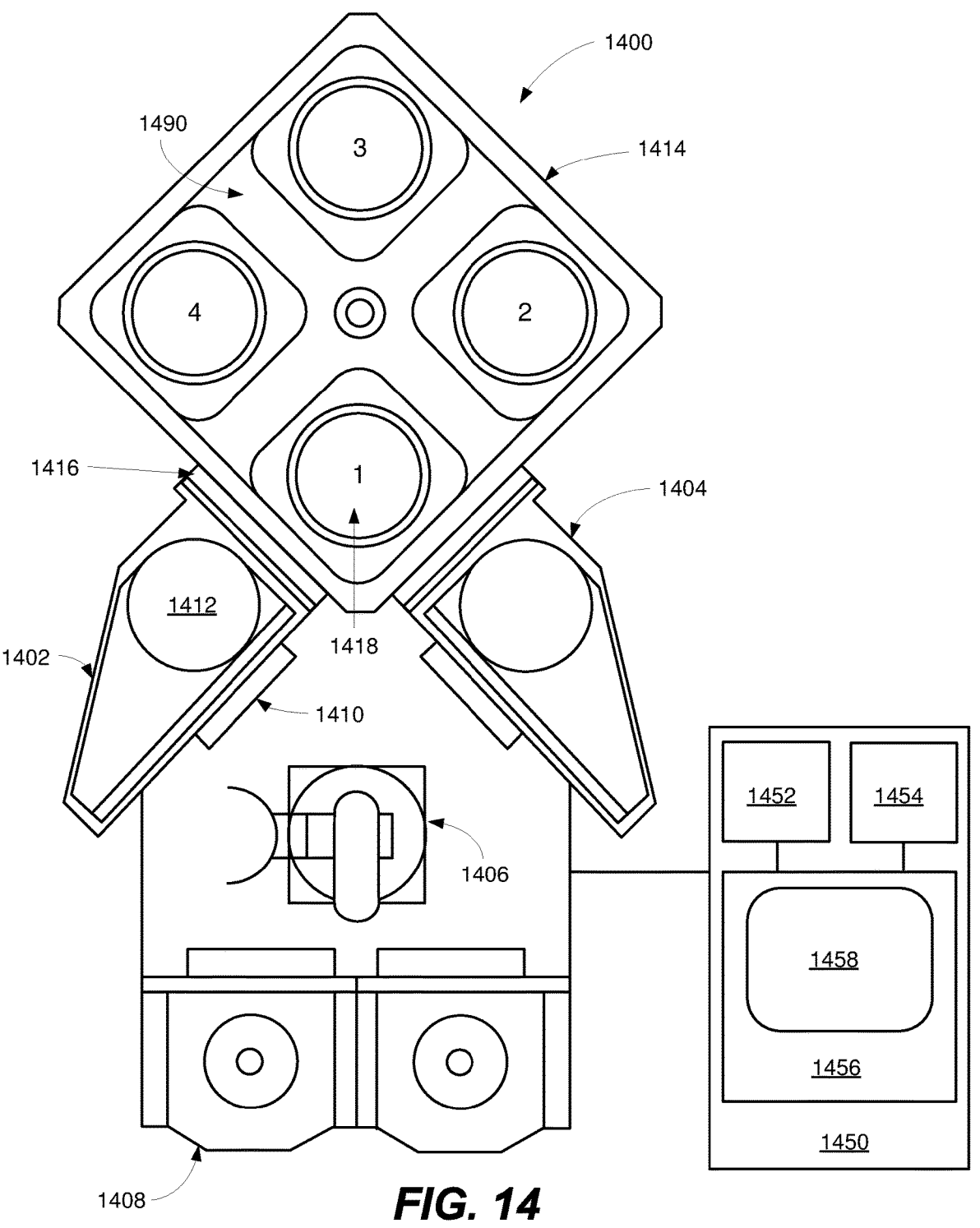
FIG. 14 depicts a schematic illustration of an example multi-station processing tool suitable for implementation of various development, dry clean, rework, descum, and smoothing operations described herein.

FIG. 13 depicts a schematic illustration of an embodiment of process station 1300 having a process chamber body 1302 for maintaining a low-pressure environment that is suitable for implementation of described dry clean embodiments. A plurality of process stations 1300 may be included in a common low pressure process tool environment. For example, FIG. 14 depicts an embodiment of a multi-station processing tool 1400, such as a VECTOR® processing tool available from Lam Research Corporation, Fremont, CA. In some embodiments, one or more hardware parameters of the process station 1300 including those discussed in detail below may be adjusted programmatically by one or more computer controllers 1350.

A process station may be configured as a module in a cluster tool. FIG. 16 depicts a semiconductor process cluster tool architecture with vacuum-integrated deposition and patterning modules suitable for implementation of the embodiments described herein. Such a cluster process tool architecture can include resist deposition, resist exposure (EUV scanner), resist dry development and etch modules, as described above and further below with reference to FIGS. 15 and 16.

In some embodiments, certain of the processing functions can be performed consecutively in the same module, for example dry development and etch. And embodiments of this disclosure are directed to methods and apparatus for receiving a wafer, including a photopatterned EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 13, process station 1300 fluidly communicates with reactant delivery system 1301a for delivering process gases to a distribution showerhead 1306. Reactant delivery system 1301a optionally includes a mixing vessel 1304 for blending and/or conditioning process gases, for delivery to showerhead 1306. One or more mixing vessel inlet valves 1320 may control introduction of process gases to mixing vessel 1304. Where plasma exposure is used, plasma may also be delivered to the showerhead 1306 or may be generated in the process station 1300. As noted above, in at least some embodiments, non-plasma thermal exposure is favored.

FIG. 13 includes an optional vaporization point 1303 for vaporizing liquid reactant to be supplied to the mixing vessel 1304. In some embodiments, a liquid flow controller (LFC) upstream of vaporization point 1303 may be provided for controlling a mass flow of liquid for vaporization and delivery to process station 1300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 1306 distributes process gases toward substrate 1312. In the embodiment shown in FIG. 13, the substrate 1312 is located beneath showerhead 1306 and is shown resting on a pedestal 1308. Showerhead 1306 may have any suitable shape, and may have any suitable number and arrangement of ports for distributing process gases to substrate 1312.

In some embodiments, pedestal 1308 may be raised or lowered to expose substrate 1312 to a volume between the substrate 1312 and the showerhead 1306. It will be appreciated that, in some embodiments, pedestal height may be adjusted programmatically by a suitable computer controller 1350.

In some embodiments, pedestal 1308 may be temperature controlled via heater 1310. In some embodiments, the pedestal 1308 may be heated to a temperature of greater than 0° C. and up to 300° C. or more, during exposure of a photopatterned resist to clean chemistry reactant gas (e.g., HCl, HBr, HI, and $BCl_3$), as described in disclosed embodiments.

Further, in some embodiments, pressure control for process station 1300 may be provided by a butterfly valve 1318. As shown in the embodiment of FIG. 13, butterfly valve 1318 throttles a vacuum provided by a downstream vacuum pump (not shown). However, in some embodiments, pressure control of process station 1300 may also be adjusted by varying a flow rate of one or more gases introduced to the process station 1300.

In some embodiments, a position of showerhead 1306 may be adjusted relative to pedestal 1308 to vary a volume between the substrate 1312 and the showerhead 1306. Further, it will be appreciated that a vertical position of pedestal 1308 and/or showerhead 1306 may be varied by any suitable mechanism within the scope of the present disclosure. In some embodiments, pedestal 1308 may include a rotational axis for rotating an orientation of substrate 1312. It will be appreciated that, in some embodiments, one or more of these example adjustments may be performed programmatically by one or more suitable computer controllers 1350.

Where plasma may be used, for example in gentle plasma-based dry development embodiments and/or etch operations conducted in the same chamber, showerhead 1306 and pedestal 1308 electrically communicate with a radio frequency (RF) power supply 1314 and matching network 1316 for powering a plasma. In some embodiments, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers are up to about 500 W.

In some embodiments, instructions for a controller 1350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of clean chemistry reactant gas (e.g., HCl, HBr, HI, and $BCl_3$) and time delay instructions for the recipe phase. In some embodiments, the controller 1350 may include any of the features described below with respect to system controller 1450 of FIG. 14.

As described above, one or more process stations may be included in a multi-station processing tool. FIG. 14 shows a schematic view of an embodiment of a multi-station processing tool 1400 with an inbound load lock 1402 and an outbound load lock 1404, either or both of which may include a remote plasma source. A robot 1406 at atmospheric pressure is configured to move wafers from a cassette loaded through a pod 1408 into inbound load lock 1402 via an atmospheric port 1410. A wafer is placed by the robot 1406 on a pedestal 1412 in the inbound load lock 1402, the atmospheric port 1410 is closed, and the load lock is pumped down. Where the inbound load lock 1402 includes a remote plasma source, the wafer may be exposed to a remote plasma treatment to treat the silicon nitride surface in the load lock prior to being introduced into a processing chamber 1414. Further, the wafer also may be heated in the inbound load lock 1402 as well, for example, to remove moisture and adsorbed gases. Next, a chamber transport port 1416 to processing chamber 1414 is opened, and another robot (not shown) places the wafer into the reactor on a pedestal of a first station shown in the reactor for processing. While the embodiment depicted in FIG. 14 includes load locks, it will be appreciated that, in some embodiments, direct entry of a wafer into a process station may be provided.

The depicted processing chamber 1414 includes four process stations, numbered from 1 to 4 in the embodiment shown in FIG. 14. Each station has a heated pedestal (shown at 1418 for station 1), and gas line inlets. It will be appreciated that in some embodiments, each process station may have different or multiple purposes. For example, in some embodiments, a process station may be switchable between dry development and etch process modes. Additionally or alternatively, in some embodiments, processing chamber 1414 may include one or more matched pairs of dry development and etch process stations. While the depicted processing chamber 1414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 14 depicts an embodiment of a wafer handling system 1490 for transferring wafers within processing chamber 1414. In some embodiments, wafer handling system 1490 may transfer wafers between various process stations and/or between a process station and a load lock. It will be appreciated that any suitable wafer handling system may be employed. Non-limiting examples include wafer carousels and wafer handling robots. FIG. 14 also depicts an embodiment of a system controller 1450 employed to control process conditions and hardware states of process tool 1400. System controller 1450 may include one or more memory devices 1456, one or more mass storage devices 1454, and one or more processors 1452. Processor 1452 may include a CPU or computer, analog, and/or digital input/output connections, stepper motor controller boards, etc.

In some embodiments, system controller 1450 controls all of the activities of process tool 1400. System controller 1450 executes system control software 1458 stored in mass storage device 1454, loaded into memory device 1456, and executed on processor 1452. Alternatively, the control logic may be hard coded in the controller 1450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1458 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1400. System control software 1458 may be configured in any suitable way. For example, various process tool component subroutines or control objects may be written to control operation of the process tool components used to carry out various process tool processes. System control software 1458 may be coded in any suitable computer readable programming language.

In some embodiments, system control software 1458 may include input/output control (IOC) sequencing instructions for controlling the various parameters described above. Other computer software and/or programs stored on mass storage device 1454 and/or memory device 1456 associated with system controller 1450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1418 and to control the spacing between the substrate and other parts of process tool 1400.

A process gas control program may include code for controlling gas composition (e.g., HBr, HCl or $BCl_3$ gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1450. The user interface may include a display screen, graphical software displays of the apparatus and/or process conditions, and user input devices such as pointing devices, keyboards, touch screens, microphones, etc.

In some embodiments, parameters adjusted by system controller 1450 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1450 from various process tool sensors. The signals for controlling the process may be output on the analog and digital output connections of process tool 1400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1450 may provide program instructions for implementing the above-described deposition processes. The program instructions may control a variety of process parameters, such as DC power level, RF bias power level, pressure, temperature, etc. The instructions may control the parameters to operate dry development and/or etch processes according to various embodiments described herein.

The system controller 1450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1450.

In some implementations, the system controller 1450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1450, in some implementations, may be a part of or coupled to a computer that is integrated with, coupled to the system, otherwise networked to the system, or a combination thereof. For example, the system controller 1450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1450 receives instructions in the form of data, which specify parameters for each of the processing steps to be performed during one or more operations. It should be understood that the parameters may be specific to the type of process to be performed and the type of tool that the system controller 1450 is configured to interface with or control. Thus as described above, the system controller 1450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the system controller 1450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 15:
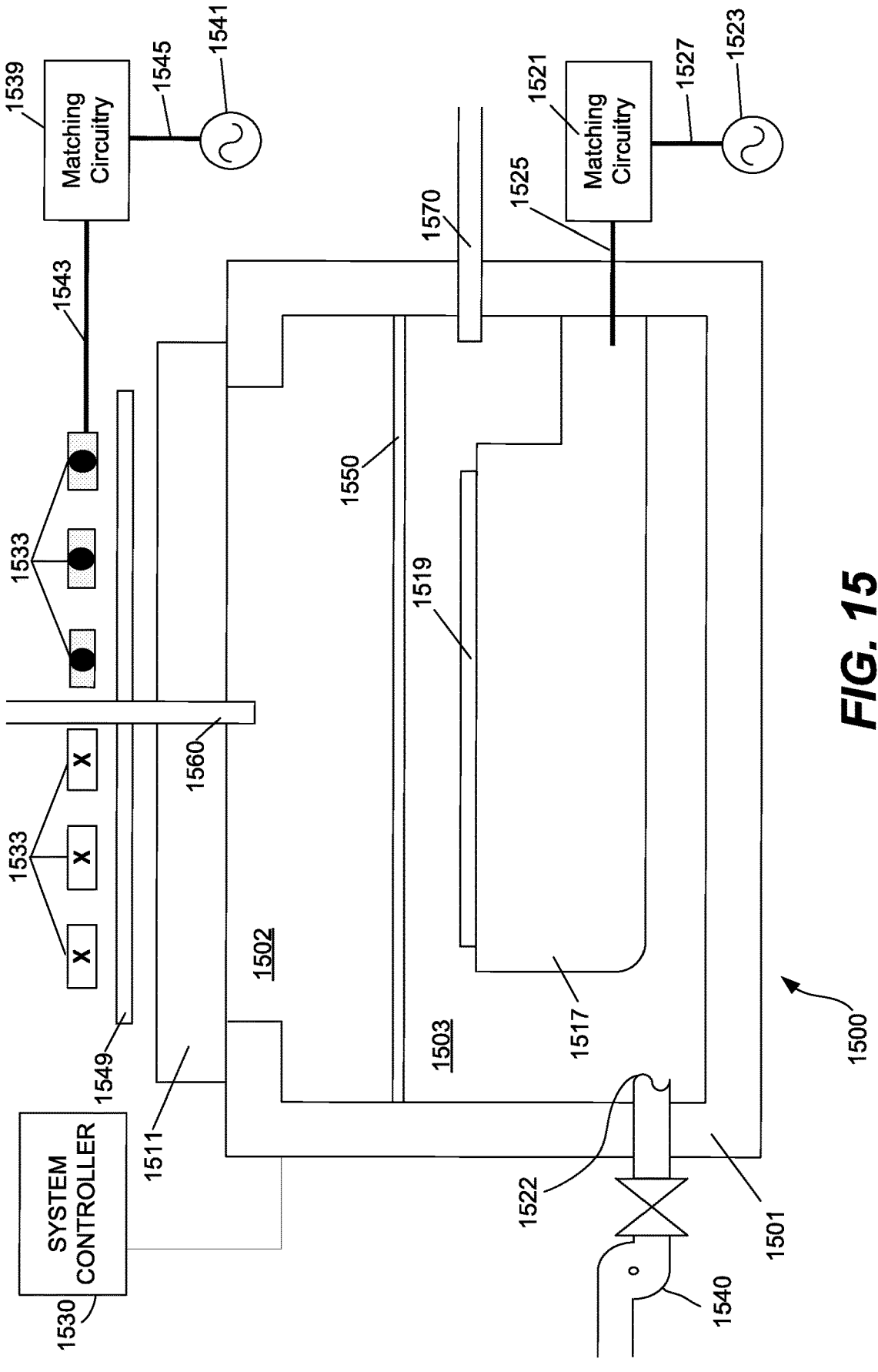
FIG. 15 shows a cross-sectional schematic view of an example inductively-coupled plasma apparatus for implementing certain embodiments and operations described herein.
Figure 16:
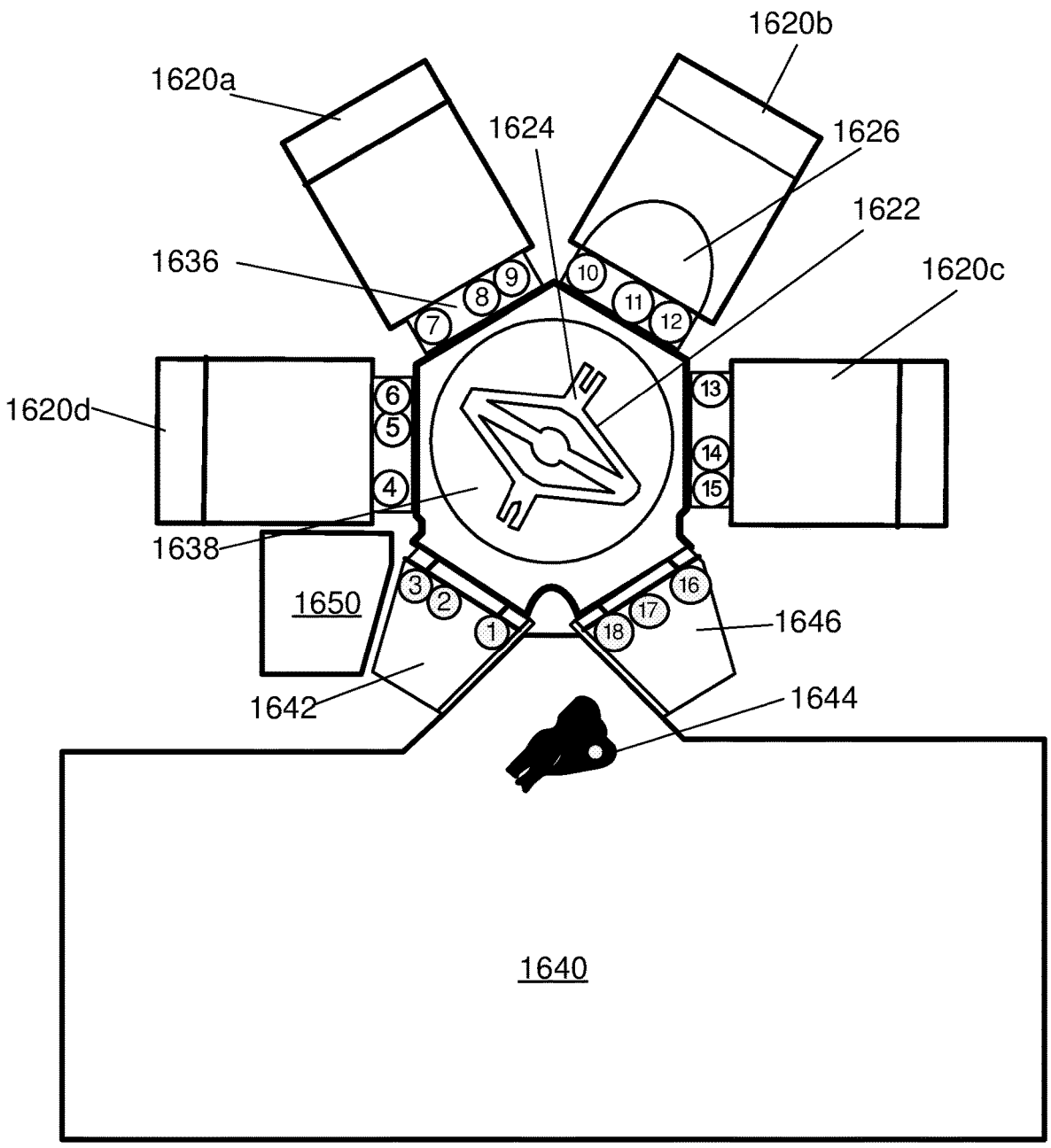
FIG. 16 depicts a semiconductor process cluster tool architecture with vacuum-integrated deposition and patterning modules that interface with a vacuum transfer module, suitable for implementations of processes described herein.

FIG. 15 schematically shows a cross-sectional view of an inductively coupled plasma apparatus 1500 appropriate for implementing certain embodiments or aspects of embodiments such as dry development and/or etch, an example of which is a Kiyo® reactor, produced by Lam Research Corp. of Fremont, CA.

The inductively coupled plasma apparatus 1500 includes an overall process chamber 1524 structurally defined by chamber walls 1501 and a window 1511. The chamber walls 1501 may be fabricated from stainless steel or aluminum. The window 1511 may be fabricated from quartz or other dielectric material. An optional internal plasma grid 1550 divides the overall process chamber into an upper sub-chamber 1502 and a lower sub chamber 1503. In most embodiments, plasma grid 1550 may be removed, thereby utilizing a chamber space made of sub chambers 1502 and 1503. A chuck 1517 is positioned within the lower sub-chamber 1503 near the bottom inner surface. The chuck 1517 is configured to receive and hold a semiconductor wafer 1519 upon which the etching and deposition processes are performed. The chuck 1517 can be an electrostatic chuck for supporting the wafer 1519 when present. In some embodiments, an edge ring (not shown) surrounds chuck 1517, and has an upper surface that is approximately planar with a top surface of the wafer 1519, when present over chuck 1517. The chuck 1517 also includes electrostatic electrodes for chucking and dechucking the wafer 1519. A filter and DC clamp power supply (not shown) may be provided for this purpose. Other control systems for lifting the wafer 1519 off the chuck 1517 can also be provided. The chuck 1517 can be electrically charged using an RF power supply 1523. The RF power supply 1523 is connected to matching circuitry 1521 through a connection 1527. The matching circuitry 1521 is connected to the chuck 1517 through a connection 1525. In this manner, the RF power supply 1523 is connected to the chuck 1517. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 1533 is positioned above window 1511. In some embodiments, a coil is not used in disclosed embodiments. The coil 1533 is fabricated from an electrically conductive material and includes at least one complete turn. The example of a coil 1533 shown in FIG. 15 includes three turns. The cross sections of coil 1533 are shown with symbols, and coils having an "X" extend rotationally into the page, while coils having a "•" extend rotationally out of the page. Elements for plasma generation also include an RF power supply 1541 configured to supply RF power to the coil 1533. In general, the RF power supply 1541 is connected to matching circuitry 1539 through a connection 1545. The matching circuitry 1539 is connected to the coil 1533 through a connection 1543. In this manner, the RF power supply 1541 is connected to the coil 1533. An optional Faraday shield 1549a is positioned between the coil 1533 and the window 1511. The Faraday shield 1549a may be maintained in a spaced apart relationship relative to the coil 1533. In some embodiments, the Faraday shield 1549a is disposed immediately above the window 1511. In some embodiments, the Faraday shield 1549b is between the window 1511 and the chuck 1517. In some embodiments, the Faraday shield 1549b is not maintained in a spaced apart relationship relative to the coil 1533. For example, the Faraday shield 1549b may be directly below the window 1511 without a gap. The coil 1533, the Faraday shield 1549a, and the window 1511 are each configured to be substantially parallel to one another. The Faraday shield 1549a may prevent metal or other species from depositing on the window 1511 of the process chamber 1524.

Process gases may be flowed into the process chamber through one or more main gas flow inlets 1560 positioned in the upper sub-chamber 1502 and/or through one or more side gas flow inlets 1570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 1540, may be used to draw process gases out of the process chamber 1524 and to maintain a pressure within the process chamber 1524. For example, the vacuum pump may be used to evacuate the lower sub-chamber 1503 during a purge operation of ALD. A valve-controlled conduit may be used to fluidically connect the vacuum pump to the process chamber 1524 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 1500, one or more process gases may be supplied through the gas flow inlets 1560 and/or 1570. In certain embodiments, process gas may be supplied only through the main gas flow inlet 1560, or only through the side gas flow inlet 1570. In some cases, the gas flow inlets shown in the figure may be replaced by more complex gas flow inlets, one or more showerheads, for example. The Faraday shield 1549a and/or optional grid 1550 may include internal channels and holes that allow delivery of process gases to the process chamber 1524. Either or both of Faraday shield 1549a and optional grid 1550 may serve as a showerhead for delivery of process gases. In some embodiments, a liquid vaporization and delivery system may be situated upstream of the process chamber 1524, such that once a liquid reactant or precursor is vaporized, the vaporized reactant or precursor is introduced into the process chamber 1524 via a gas flow inlet 1560 and/or 1570.

Radio frequency power is supplied from the RF power supply 1541 to the coil 1533 to cause an RF current to flow through the coil 1533. The RF current flowing through the coil 1533 generates an electromagnetic field about the coil 1533. The electromagnetic field generates an inductive current within the upper sub-chamber 1502. The physical and chemical interactions of various generated ions and radicals with the wafer 1519 etch features of and selectively deposit layers on the wafer 1519.

If the plasma grid 1550 is used such that there is both an upper sub-chamber 1502 and a lower sub-chamber 1503, the inductive current acts on the gas present in the upper sub-chamber 1502 to generate an electron-ion plasma in the upper sub-chamber 1502. The optional internal plasma grid 1550 limits the amount of hot electrons in the lower sub-chamber 1503. In some embodiments, the apparatus 1500 is designed and operated such that the plasma present in the lower sub-chamber 1503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 1503 through port 1522. The chuck 1517 disclosed herein may operate at elevated temperatures ranging between about 10° C. and about 250° C. The temperature will depend on the process operation and specific recipe.

Apparatus 1500 may be coupled to facilities (not shown) when installed in a clean room or a fabrication facility. Facilities include plumbing that provide processing gases, vacuum, temperature control, and environmental particle control. These facilities are coupled to apparatus 1500, when installed in the target fabrication facility. Additionally, apparatus 1500 may be coupled to a transfer chamber that allows robotics to transfer semiconductor wafers into and out of apparatus 1500 using typical automation.

In some embodiments, a system controller 1530 (which may include one or more physical or logical controllers) controls some or all of the operations of a process chamber 1524. The system controller 1530 may include one or more memory devices and one or more processors. In some embodiments, the apparatus 1500 includes a switching system for controlling flow rates and durations when disclosed embodiments are performed. In some embodiments, the apparatus 1500 may have a switching time of up to about 500 ms, or up to about 750 ms. Switching time may depend on the flow chemistry, recipe chosen, reactor architecture, and other factors.

In some implementations, the system controller 1530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 1530, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 1530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1530 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 1530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWIN-SCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 16 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some implementations.

FIG. 16 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 1638 interfaces with four processing modules 1620a-1620d, which may be individually optimized to perform various fabrication processes. By way of example, processing modules 1620a-1620d may be implemented to perform deposition, evaporation, ELD, dry development, etch, strip, and/or other semiconductor processes. For example, module 1620*a* may be an ALD reactor that may be operated to perform in a non-plasma, thermal atomic layer depositions as described herein, such as Vector tool, available from Lam Research Corporation, Fremont, CA. And module 1620*b* may be a PECVD tool, such as the Lam Vector®. It should be understood that the figure is not necessarily drawn to scale.

Airlocks 1642 and 1646, also known as a loadlocks or transfer modules, interface with the VTM 1638 and a patterning module 1640. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 16 but without the integrated patterning module.

Airlock 1642 may be an "outgoing" loadlock, referring to the transfer of a substrate out from the VTM 1638 serving a deposition module 1620*a* to the patterning module 1640, and airlock 1646 may be an "ingoing" loadlock, referring to the transfer of a substrate from the patterning module 1640 back in to the VTM 1638. The ingoing loadlock 1646 may also provide an interface to the exterior of the tool for access and egress of substrates. Each process module has a facet that interfaces the module to VTM 1638. For example, deposition process module 1620*a* has facet 1636. Inside each facet, sensors, for example, sensors 1-18 as shown, are used to detect the passing of wafer 1626 when moved between respective stations. Patterning module 1640 and airlocks 1642 and 1646 may be similarly equipped with additional facets and sensors, not shown.

Main VTM robot 1622 transfers wafer 1626 between modules, including airlocks 1642 and 1646. In one embodiment, robot 1622 has one arm, and in another embodiment, robot 1622 has two arms, where each arm has an end effector 1624 to pick wafers such as wafer 1626 for transport. Front-end robot 1644, in is used to transfer wafers 1626 from outgoing airlock 1642 into the patterning module 1640, from the patterning module 1640 into ingoing airlock 1646. Front-end robot 1644 may also transport wafers 1626 between the ingoing loadlock and the exterior of the tool for access and egress of substrates. Because ingoing airlock module 1646 has the ability to match the environment between atmospheric and vacuum, the wafer 1626 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 1642 may provide this function by holding the transferred wafers at a lower pressure, no higher than the pressure in the patterning module 1640, for a period of time and exhausting any off-gassing, so that the optics of the patterning tool 1640 are not contaminated by off-gassing from the substrate. A suitable pressure for the outgoing, off-gassing airlock is no more than 1E-8 Torr.

In some embodiments, a system controller 1650 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 1650 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, dry developing the photopatterned resist, and etching the underlying layer or layer stack using the patterned resist as a mask.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 13, 14 or 15 may be implemented with the tool in FIG. 16.

CONCLUSION

Process and apparatus for dry chamber clean of metal and/or metal oxide photoresists, for example to remove EUV resist material from internal surfaces of process chambers in the context of EUV patterning is disclosed.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

The invention claimed is:

1. A method of cleaning a deposition chamber, the method comprising:

introducing an etch gas into the deposition chamber, wherein the etch gas cleans the one or more internal surfaces of the deposition chamber in a thermal plasma-free process by removing a first thickness of an unexposed organo-metal oxide-containing EUV photoresist material formed on the one or more internal surfaces of the deposition chamber during deposition processes on one or more semiconductor substrates; and exposing the one or more internal surfaces of the deposition chamber to plasma to remove one or more of residual carbon, contaminants, byproducts of the etch gas from thermal plasma-free process, and a remaining thickness of the unexposed organo-metal oxide-containing EUV photoresist material.

2. The method of claim 1, wherein the etch gas comprises a halide-containing chemistry.

3. The method of claim 2, wherein the etch gas comprises a hydrogen halide, hydrogen gas and halogen gas, boron trichloride, or combinations thereof.

4. The method of claim 1, further comprising:

processing the one or more semiconductor substrates in the deposition chamber to form the first thickness of the organo-metal oxide-containing EUV photoresist material on the one or more internal surfaces of the deposition chamber by vapor deposition over time.

5. The method of claim 1, further comprising:

purging the deposition chamber after introducing the etch gas to remove residual etch gas from the deposition chamber.

6. The method of claim 1, further comprising:

conditioning the one or more internal surfaces of the deposition chamber by forming a second thickness of the unexposed organo-metal oxide-containing EUV photoresist material or of an organo-metal oxide-containing film on the one or more internal surfaces of the deposition chamber.

7. The method of claim 1, wherein the one or more semiconductor substrates comprises a plurality of semiconductor substrates, wherein the first thickness of the unexposed organo-metal oxide-containing EUV photoresist material is formed after multiple deposition processes of organo-metal oxide-containing EUV photoresist films on the plurality of semiconductor substrates.

8. A method of cleaning a development chamber, the method comprising:

providing, in the development chamber, a semiconductor substrate with an exposed EUV photoresist film with unexposed portions containing organo-metal oxide and exposed portions containing metal oxide on a substrate layer of the semiconductor substrate;

developing the exposed EUV photoresist film to form a pattern by introducing an etch gas into the development chamber to remove the unexposed portions of the exposed EUV photoresist film, wherein the removed unexposed portions and the etch gas form residues on one or more internal surfaces of the development chamber; and exposing the one or more internal surfaces of the development chamber to plasma to remove the residues.

9. The method of claim 8, wherein the etch gas comprises a halide-containing chemistry.

10. The method of claim 9, wherein the etch gas comprises a hydrogen halide, hydrogen gas and halogen gas, boron trichloride, or combinations thereof.

11. The method of claim 8, wherein the plasma removes contaminants and residual carbon from the one or more internal surfaces in addition to the residues.

12. The method of claim 8, further comprising:

purging the development chamber after introducing the etch gas to remove residual etch gas from the development chamber.

13. The method of claim 8, further comprising:

conditioning the one or more internal surfaces of the development chamber by forming an organo-metal oxide-containing film on the one or more internal surfaces of the development chamber.

* * * * *